United States Patent
Tsai et al.

(10) Patent No.: US 11,133,289 B2
(45) Date of Patent: Sep. 28, 2021

(54) SEMICONDUCTOR PACKAGE AND MANUFACTURING METHOD OF SEMICONDUCTOR PACKAGE HAVING PLURALITY OF ENCAPSULATING MATERIALS

(71) Applicant: Taiwan Semiconductor Manufacturing Co., Ltd., Hsinchu (TW)

(72) Inventors: Tsung-Fu Tsai, Changhua County (TW); Shih-Ting Lin, Taipei (TW); Szu-Wei Lu, Hsinchu (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/414,723

(22) Filed: May 16, 2019

(65) Prior Publication Data

US 2020/0365557 A1    Nov. 19, 2020

(51) Int. Cl.
*H01L 25/04* (2014.01)
*H01L 25/065* (2006.01)
(Continued)

(52) U.S. Cl.
CPC ...... *H01L 25/0657* (2013.01); *H01L 21/6835* (2013.01); *H01L 21/78* (2013.01); *H01L 25/18* (2013.01); *H01L 25/50* (2013.01); *H01L 2221/68372* (2013.01); *H01L 2225/06513* (2013.01); *H01L 2225/06544* (2013.01);
(Continued)

(58) Field of Classification Search
CPC ............ H01L 25/0657; H01L 25/0756; H01L 25/117; H01L 2225/06503; H01L 2225/06555; H01L 2225/06544; H01L 25/043

See application file for complete search history.

(56) References Cited

U.S. PATENT DOCUMENTS 8,252,629 B2 *   8/2012   Yee .................... H01L 21/568
                                                      438/106
9,000,584 B2     4/2015   Lin et al.
(Continued)

*Primary Examiner* — Hoai V Pham
(74) *Attorney, Agent, or Firm* — JCIPRNET

(57) ABSTRACT

A semiconductor package includes a first integrated circuit structure, a second integrated circuit structure, a plurality of conductive bumps, an encapsulating material, and a redistribution structure. The first integrated circuit structure includes an active surface having a plurality of contact pads, a back surface opposite to the active surface, and a plurality of through vias extending through the first integrated circuit structure and connecting the active surface and the back surface. The second integrated circuit structure is disposed on the back surface of the first integrated circuit structure. The conductive bumps are disposed between the first integrated circuit structure and the second integrated circuit structure, and electrically connecting the plurality of through vias and the second integrated circuit structure. The encapsulating material at least encapsulates the second integrated circuit structure. The redistribution structure is disposed over and electrically connected to the active surface of the first integrated circuit structure.

20 Claims, 53 Drawing Sheets

(51) Int. Cl.
  *H01L 25/18* (2006.01)
  *H01L 25/00* (2006.01)
  *H01L 21/683* (2006.01)
  *H01L 21/78* (2006.01)

(52) U.S. Cl.
  CPC .............. *H01L 2225/06555* (2013.01); *H01L 2225/06586* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2013/0026643 A1* | 1/2013 | England .................. H01L 22/10 257/774 |
| 2018/0294249 A1* | 10/2018 | Watanabe ............... H01L 24/96 |

* cited by examiner

SEMICONDUCTOR PACKAGE AND MANUFACTURING METHOD OF SEMICONDUCTOR PACKAGE HAVING PLURALITY OF ENCAPSULATING MATERIALS

BACKGROUND 3D package applications such as package on package (PoP) are becoming increasingly popular and widely used in mobile devices. This is because they can enhance electrical performance by integrating logic chips (e.g., application processors (APs)), high capacity/bandwidth memory chips (e.g., wide input/out 2 (WIO2) chips, low power double data rate X (LPDDRx) chips, and the like), and/or other heterogeneous chips (e.g., sensors, micro-electro-mechanicals (MEMs), networking devices, and the like), for instance.

However, existing package on package devices and packaging structures are challenged to meet fine channels and high density routing requirements of next-generation applications. For example, the wire bonding of a typical LPDDRx, TSVs in AP/WIO chips, and the like impose various disadvantages on the package, such as increased manufacturing cost, large package thickness, and silicon access penalties. Improved devices and methods of manufacturing the same are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
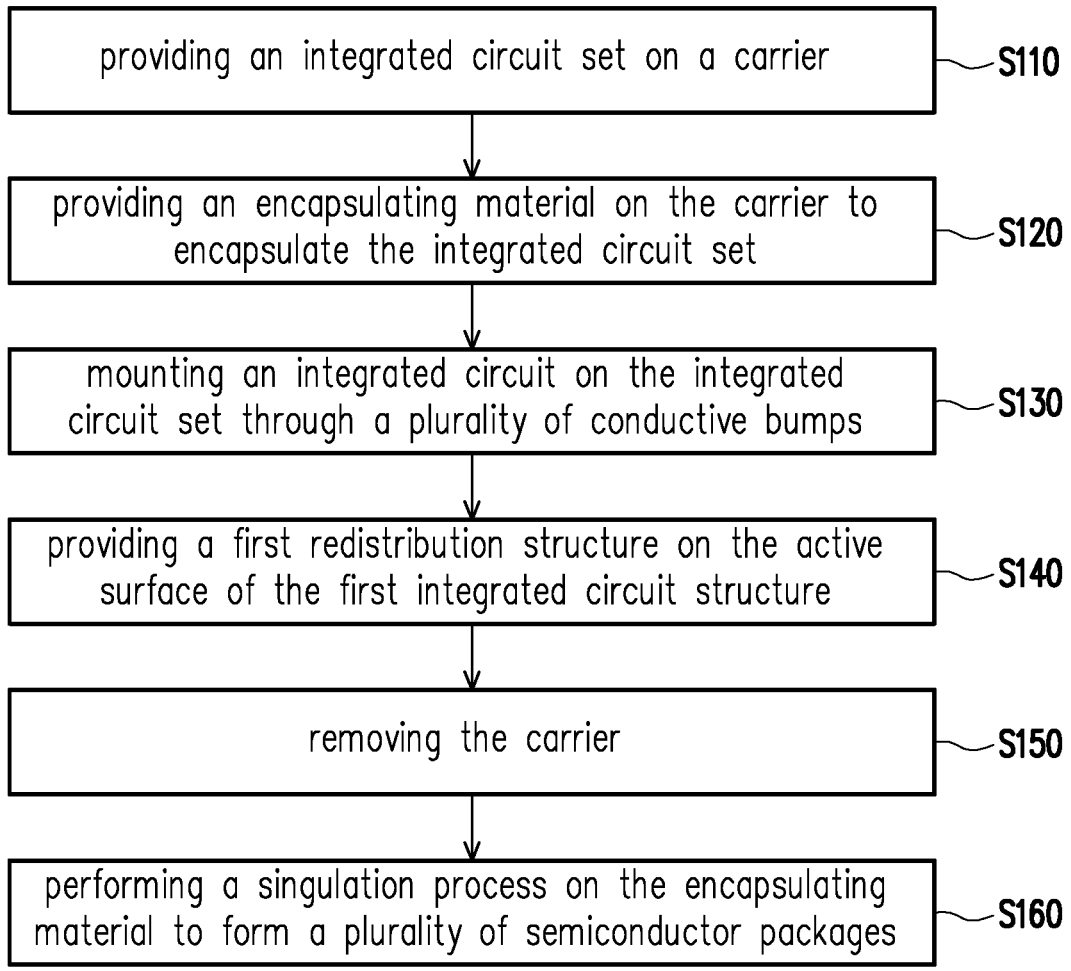
FIG. 1 illustrates a block diagram of a manufacturing method of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some aspects, various example embodiments may enable a thin package profile integrating memory (e.g., LPDDRx, WIO2, etc.) and logic chips, for example. Improved memory capacity and bandwidth may be achieved in thin-profiled stacked fan-out packages. Embodiments may use through silicon vias (TSVs) as an option for electrical connection, thus reducing manufacturing cost. Embodiments may include a logic-first and/or logic-last configuration with integrated fan-out package structures. Each fan-out tier of the device package may include one or more of low power-double data rate X (LPDDRx), wide input/output (WIO) memory, WIO2 memory, NAND flash, SRAM catch, and the like memory chips. Other types of chips, such as, logic, analog, sensor, networking, micro-electro-mechanical (MEMS), and the like, may also be included. The number of chips in each fan-out tier may be greater than or equal to one. The integrated fan-out package may be used for various applications, such as, mobile computing, mobile health (e.g., heath monitoring), wearable electronics, internet of things (IoT), big data, and the like.

Figure 2A:
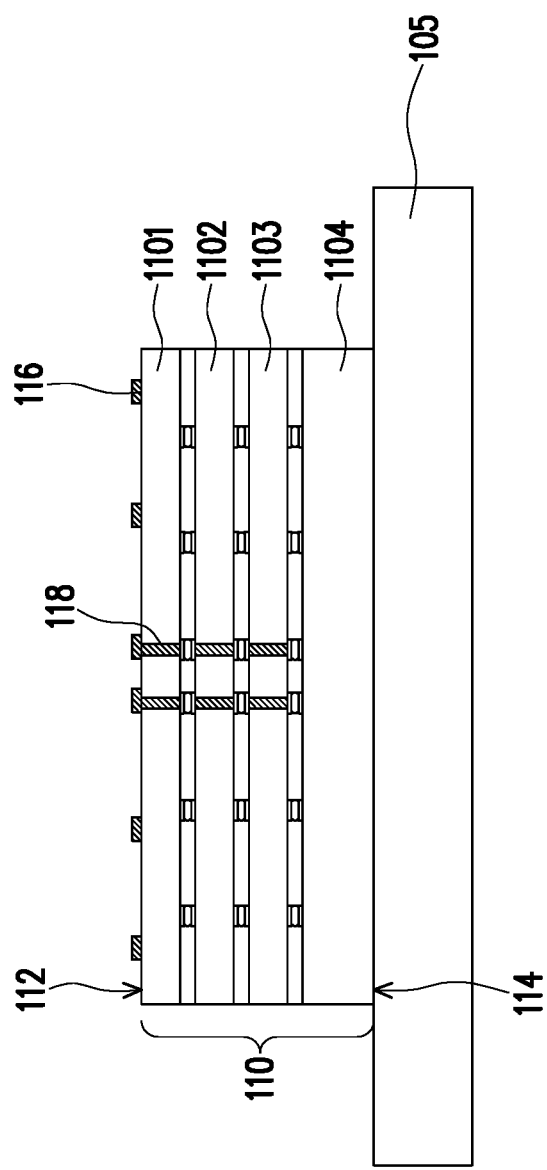
FIG. 2A to FIG. 2H illustrate cross sectional views of intermediate stages in a manufacturing of a semiconductor package according to some exemplary embodiments of the present disclosure.

FIG. 1 illustrates a block diagram of a manufacturing method of a semiconductor package according to some exemplary embodiments of the present disclosure. FIG. 2A to FIG. 2H illustrate cross sectional views of intermediate stages in a manufacturing of a semiconductor package according to some exemplary embodiments of the present disclosure. A manufacturing method of a semiconductor package includes the following steps. With reference to FIG. 1 and FIG. 2A, performing step S110, in some embodiments, an integrated circuit set (second integrated circuit structure) 110 is provided on a carrier 105. In some embodiments, the carrier 105 may include an adhesive layer, which may be a light to heat conversion release coating (LTHC), or the like. In some embodiments, a die attach film (DAF) may also be disposed on the carrier 105, or on the adhesive layer (if any) for attaching the integrated circuit set 110 on the carrier 105. In some embodiments, the carrier 105 may be a glass carrier, a ceramic carrier, or the like, and may provide temporary structural support during the formation of various components of a semiconductor package (e.g., the semiconductor package shown in FIG. 2F).

In accordance with some embodiments of the disclosure, the integrated circuit set 110 may be memory dies such as LPDDRx, WIO, WIO2, NAND flash, and the like. In other embodiments, the integrated circuit set 110 may be any type of integrated circuit sets, such as analog circuits, digital circuits, sensor dies, micro-electro-mechanical (MEMS) dies, networking dies, and the like. In some embodiments, the integrated circuit set 110 is shown as a vertical stack of four integrated circuits 1101~1104. Note that although four integrated circuits are described, the integrated circuit set 110 may be configured with fewer or more chips depending on the amount of memory desired for a system. Each of the integrated circuits 1101~1104 may include a plurality of storage locations, with each storage location on each of the integrated circuits 1101~1104 having a unique memory address. In some embodiments, integrated circuit set 110 may be a dynamic random access memory (DRAM) device, although other memory types including, but not limited to, static random access memory (SRAM) and read only memory may be used.

In some embodiments, the integrated circuit set 110 includes a plurality of integrated circuits 1101~1104 (four integrated circuits are illustrated, but not limited thereto) stacked on top of one another, an active surface 112 having a plurality of I/O ports (contact pads) 116 facing away from the carrier 105 and a back surface 114 opposite to the active surface 112. In some embodiments, the integrated circuits 1101~1104 are connected to one another using through silicon via (TSV) technology. That is to say, at least one of the integrated circuits (the integrated circuits 1101~1103 are illustrated, but not limited thereto) includes a plurality of sub through vias (through silicon vias) 118 extending through the at least one of the integrated circuits (e.g., the integrated circuits 1101~1103) for electrically connected to adjacent one of the integrated circuits. For example, each of the integrated circuits 1101~1104 may be connected to one another using holes filled with a conductive material as shown in FIG. 2A, and the holes may be formed by laser drilling process or dry etching process, for example. In some embodiments, the I/O ports 116 are electrically connected to the sub through vias 118.

Figure 2B:
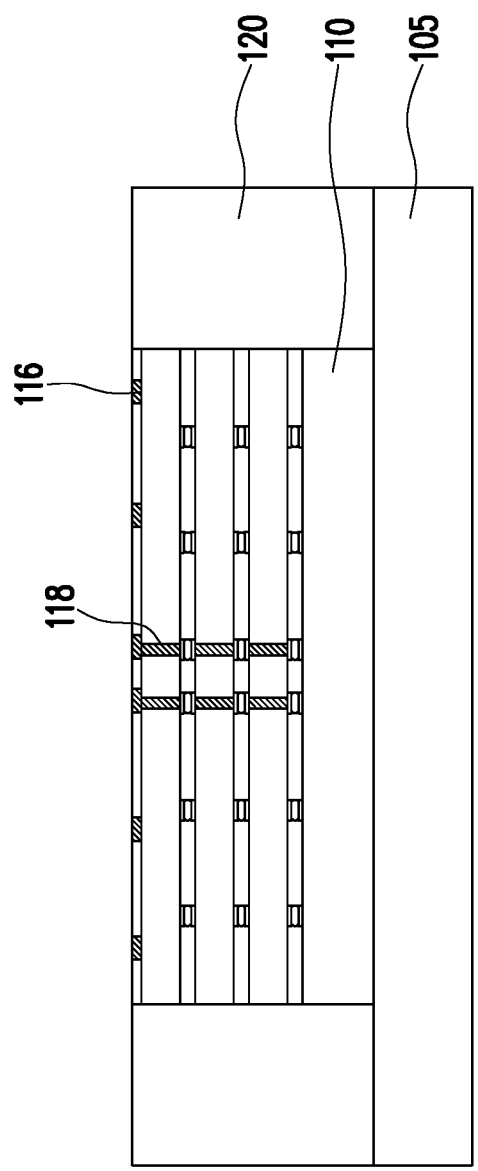

With now reference to FIG. 1 and FIG. 2B, performing step S120, providing an encapsulating material 120 on the carrier 105 to encapsulate the integrated circuit set 110. In some embodiments, the encapsulating material 120 may include a molding compound, an epoxy, a resin, or the like. In one of the implementations, the molding compound includes various materials, for example, one or more of epoxy resins, phenolic hardeners, silicas, catalysts, pigments, mold release agents, etc. In some embodiments, a top surface of the encapsulating material 120 may be higher than the top surfaces of the I/O ports 116. Namely, the encapsulating material 120 covers the top surfaces of the I/O ports 116. Then, a thinning process, which may be a grinding process, is performed to thin the encapsulating material 120 until the top surfaces of the I/O ports 116 are revealed. The resulting structure is shown in FIG. 2B. Due to the thinning process, the top surfaces of the I/O ports 116 are substantially level with the top surface of the encapsulating material 120. The resultant structure including the integrated circuit set 110 and the encapsulating material 120 as shown in FIG. 2B may have a wafer form in the process.

Figure 2C:
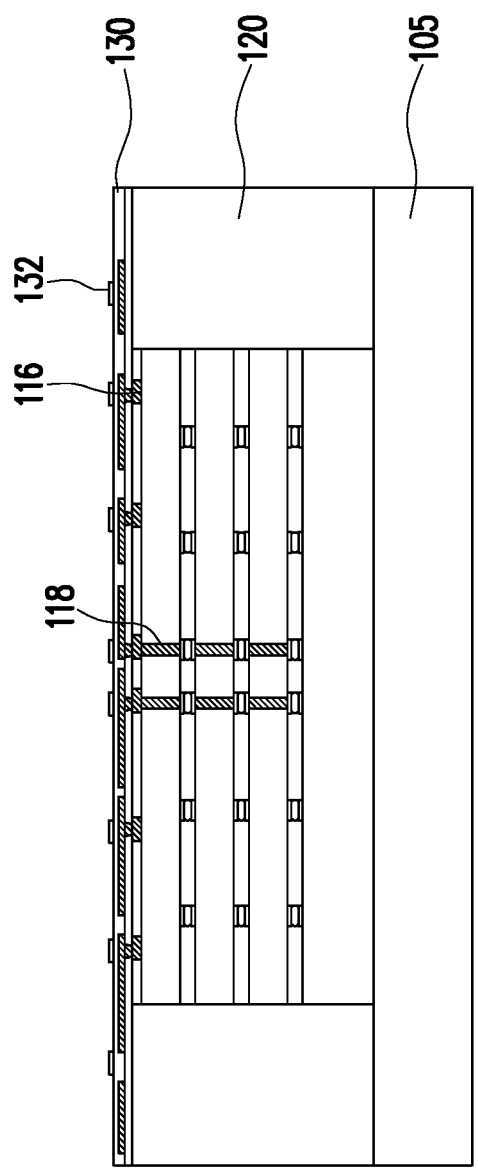

With now reference to FIG. 1 and FIG. 2C, in some embodiments, optionally, a (second) redistribution structure 130 is formed over the integrated circuit set 110 and the encapsulating material 120. The redistribution structure 130 is electrically connected to the I/O ports 116 of the integrated circuit set 110. In some embodiments, the redistribution structure 130 may be formed by, for example, depositing conductive layers, patterning the conductive layers to form redistribution circuits, partially covering the redistribution circuits and filling the gaps between the redistribution circuits with dielectric layers, etc. The material of the redistribution circuits may include a metal or a metal alloy including aluminum, copper, tungsten, and/or alloys thereof. The dielectric layers may be formed of dielectric materials such as polybenzoxazole (PBO), polyimide (PI), oxides, nitrides, carbides, carbon nitrides, combinations thereof, and/or multi-layers thereof. The redistribution circuits are formed in the dielectric layers and electrically connected to the integrated circuit set 110. In addition, an under bump metallurgy (UBM) layer 132 may be formed on the redistribution structure 130 by sputtering, evaporation, or electroless plating, etc.

Figure 2D:
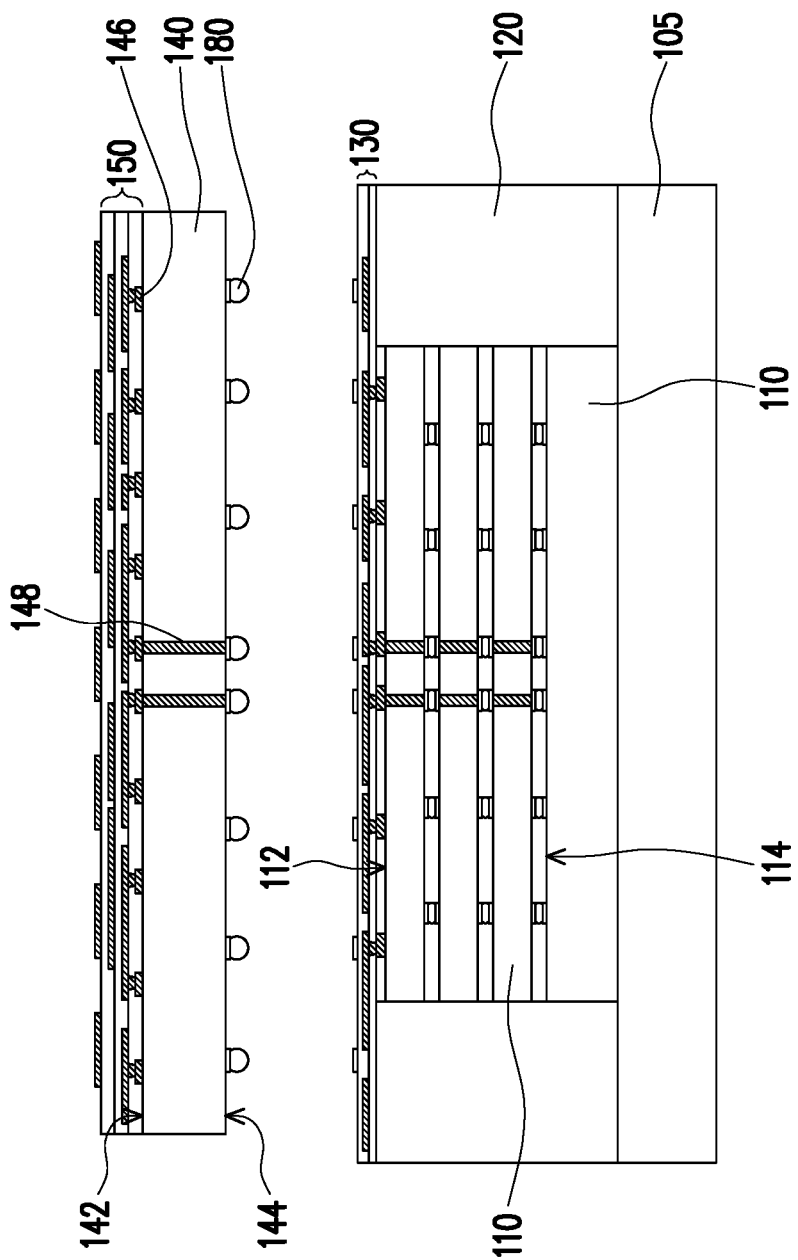

With now reference to FIG. 1 and FIG. 2D, performing step S130, mounting an integrated circuit (first integrated circuit structure) 140 on the integrated circuit set 110 through a plurality of conductive bumps 180. In some embodiments, the integrated circuit 140 may be a logic die, which provides logic functions and may be a system on chip (SoC), an application processor (AP), or the like. In some embodiments, the integrated circuit 140 may be formed in a wafer (not shown) having multiple integrated circuits 140 and singulated along scribe lines. The integrated circuit 140 may include an active surface 142 having a plurality of contact pads 146, a back surface 144 opposite to the active surface 142 and facing the integrated circuit set 110, and a plurality of through vias (TSVs) 148 extending through the integrated circuit 140 and connecting the active surface 142 and the back surface 144.

In accordance with some embodiments of the disclosure, the conductive bumps 180 may be disposed on the back surface 144 of the integrated circuit 140 for mounting the integrated circuit 140 onto the integrated circuit set 110. Namely, the integrated circuit 140 is mounted on the active surface 112 of the integrated circuit set 110 with its back surface 144 (i.e. back to face configuration). In detail, the conductive bumps 180 are disposed between the integrated circuit 140 and the integrated circuit set 110 and electrically connecting the through vias 148 and the integrated circuit set 110 (or the redistribution structure 130, if any). In some embodiments, the integrated circuit 140 may further include a redistribution layer (not shown) on the back surface 144 of the integrated circuit 140, and the conductive bumps 180 are disposed on and electrically connected to the redistribution layer. With such arrangement, the redistribution structure 130 is located between the integrated circuit set 110 and the conductive bumps 180 and is extended over the active surface 112 of the integrated circuit set 110 and the encapsulating material 120.

In accordance with some embodiments of the disclosure, the conductive bumps 180 may be micro bumps, which may include copper posts and may be called copper post (or pillar) bumps, but the disclosure is not limited thereto. The pitch of conductive bumps (micro bumps) 180 may be in a range from about 10 μm to about 60 μm, in accordance with some embodiments, but the disclosure is not limited thereto. In some embodiments, each of the conductive bumps 180 may include an UBM layer, which may include a diffusion barrier layer and a thin seed layer, in accordance with some embodiments. The diffusion barrier layer may be a titanium layer, a titanium nitride layer, a tantalum layer, or a tantalum nitride layer. The materials of seed layer may include copper or copper alloys, and hence is referred to as copper seed layer hereinafter. However, other metals, such as silver, gold, aluminum, and combinations thereof, may also be included.

In some embodiments, the micro bumps 180 may also include a copper layer, a metal layer, and a solder cap, which are formed by plating with a photo mask defining the openings, in accordance with some embodiments. In some embodiments, the metal layer is a nickel-containing layer comprising, for example, a nickel layer or a nickel alloy layer by plating. The metal layer prevents or at least retards the formation of an inter-metallic compound (IMC) between copper and solder. The solder cap may be a lead-free pre-solder layer formed of, for example, SnAg, or a solder material, including alloys of tin, lead, silver, copper, nickel, bismuth, or combinations thereof. In some embodiments, the conductive bumps 180 does not include solder cap. In some embodiments, the conductive bumps 180 does not include solder cap and metal layer. The disclosure does not limit the structure and the formation of the conductive bumps 180.

Figure 2E:
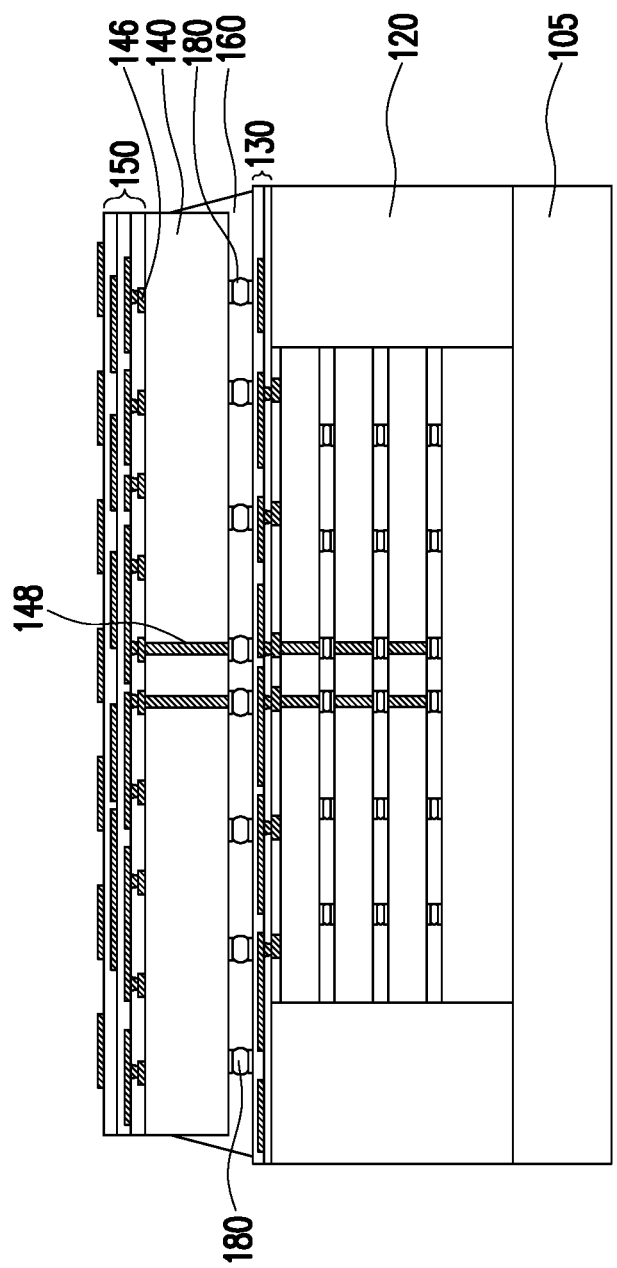

With now reference to FIG. 1 and FIG. 2E, performing step S140, a (first) redistribution structure 150 is provided on and electrically connected to the active surface 142 of the integrated circuit 140. In some embodiments, the redistribution structure 150 is formed on the integrated circuit 140 and electrically connected to the contact pads 146 of the integrated circuit 140. In some embodiments, the redistribution structure 150 may be formed by, for example, depositing conductive layers, patterning the conductive layers to form redistribution circuits, partially covering the redistribution circuits and filling the gaps between the redistribution circuits with dielectric layers, etc. The material of the redistribution circuits may include a metal or a metal alloy including aluminum, copper, tungsten, and/or alloys thereof. The dielectric layers may be formed of dielectric materials such as polybenzoxazole (PBO), polyimide (PI), oxides, nitrides, carbides, carbon nitrides, combinations thereof, and/or multi-layers thereof. The redistribution circuits are formed in the dielectric layers and electrically connected to the integrated circuit 140. In addition, an UBM layer may be formed on the redistribution structure 150 by sputtering, evaporation, or electroless plating, etc. In other embodiments, the redistribution structure 150 may be firstly provided on the integrated circuit 140, and the integrated circuit 140 along with the redistribution structure 150 are then mounted onto the integrated circuit set 110 (or redistribution structure 130, if any). The disclosure does not limit the order of the processing steps.

In accordance with some embodiments of the disclosure, a filling material 160 may be applied to fill the gap between the integrated circuit 140 and the integrated circuit set 110 (or redistribution structure 130, if any). In some embodiments, the filling material 160 may be an underfill, a non-conductive film (NCF), or the like. The filling material 160 is configured to absorb some of the residual stresses, to reduce the stress within the conductive bumps 180, and in the interfaces between the conductive bumps 180 and integrated circuit 140.

Figure 2F:
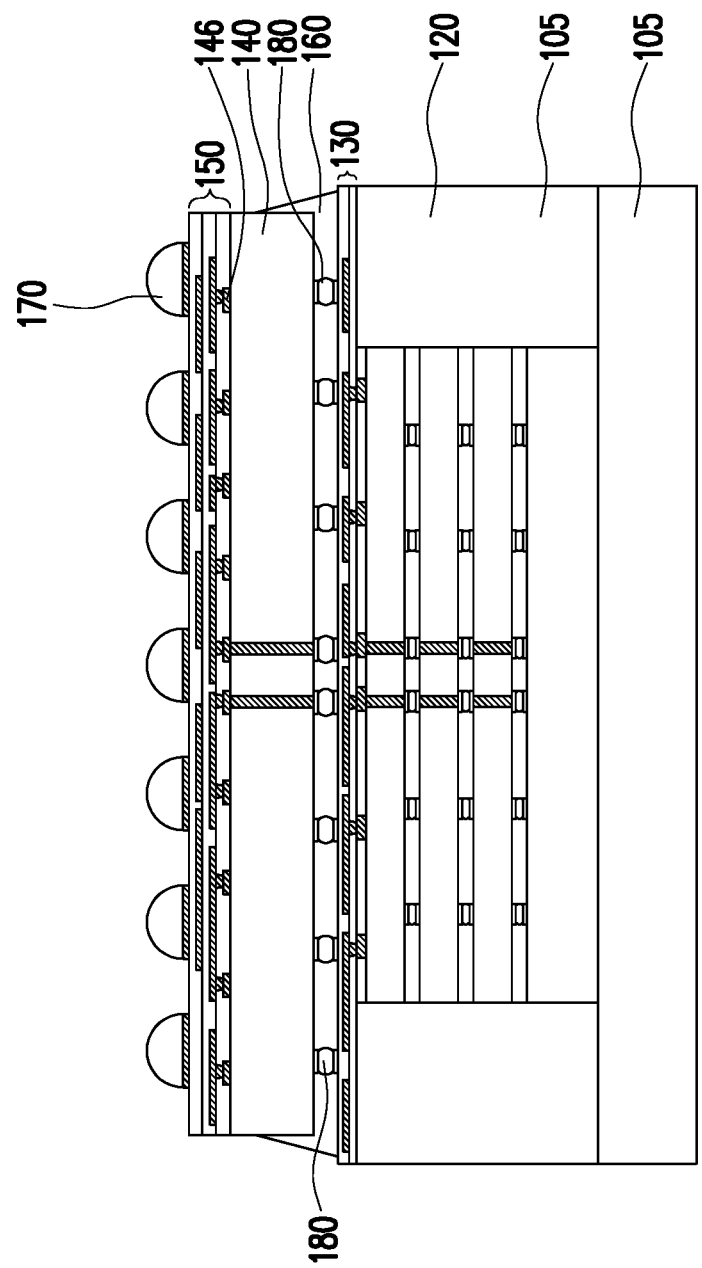

With now reference to FIG. 2F, in some embodiments, a plurality of electrical terminals 170 are disposed on the redistribution structure 150 in accordance with some exemplary embodiments. In some embodiments, at least one Integrated Passive Device (IPD) (not shown) may also be disposed on the redistribution structure 150. The formation of the electrical terminals 170 may include placing solder balls on the redistribution structure 150, and then reflowing the solder balls. In alternative embodiments, the formation of the electrical terminals 170 may include performing a plating process to form solder regions on the redistribution structure 150, and then reflowing the solder regions. The electrical terminals 170 may also include conductive pillars, or conductive pillars with solder caps, which may also be formed through plating. The IPD may be fabricated using standard wafer fabrication technologies such as thin film and photolithography processing, and may be mounted on the redistribution structure 150 through, for example, flip-chip bonding or wire bonding, etc. In some embodiments, the electrical terminals 170 are arranged in area array and function as ball grid array (BGA) balls. For example, no Controlled Collapse Chip Connection bumps (C4 bumps) are formed on the redistribution structure 150. Furthermore, since the BGA balls 170 are formed over the integrated circuit 140, the integrated circuit 140 including the BGA balls 170 may perform similar function as a BGA printed circuit board and the BGA printed circuit board may be omitted.

Figure 2G:
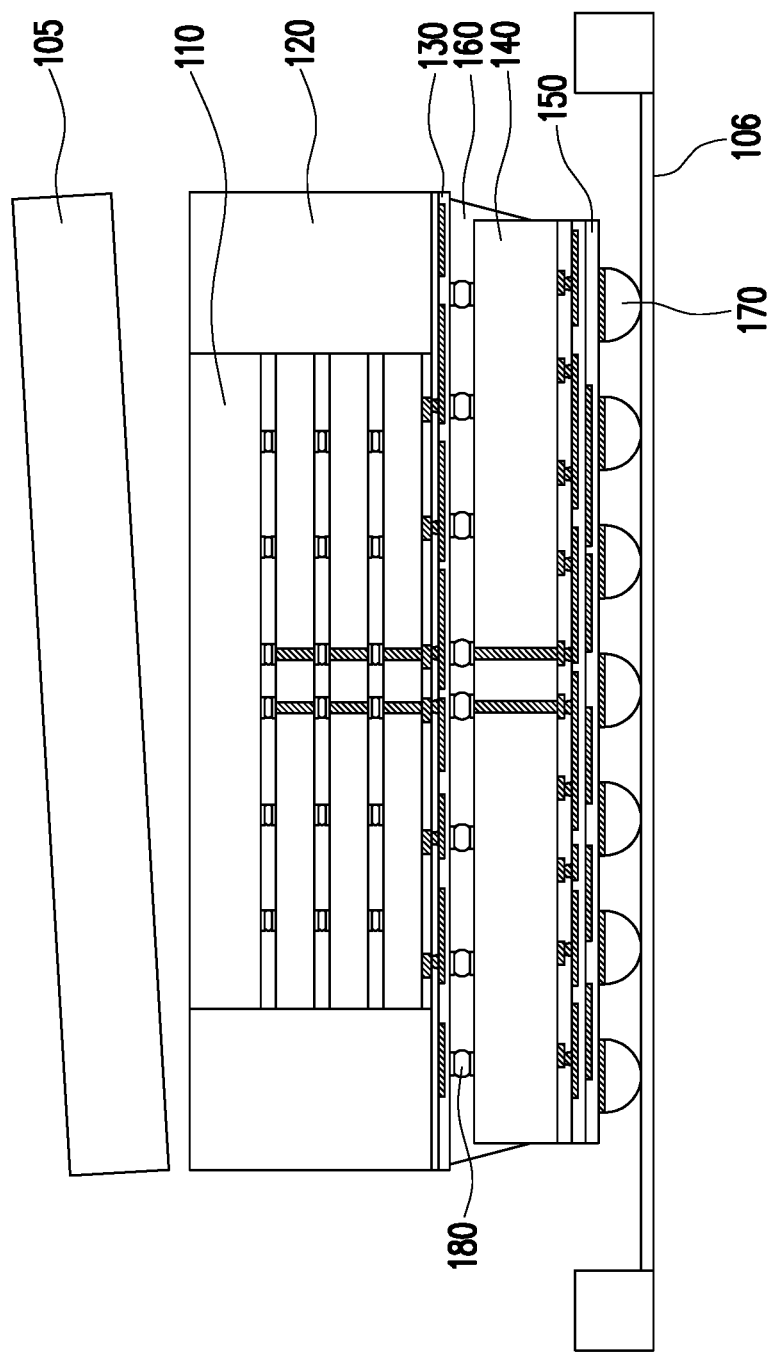

With now reference to FIG. 1 and FIG. 2G, performing step S150, in some embodiments, the resultant structure shown in FIG. 2F may be flipped over and mounted on a tape carrier 106, and the carrier 105 may be removed. In some embodiments, the tape carrier 106 may be a dicing tape, which is typically used to secure the package structure and keep it stationary during a subsequent singulation of a semiconductor package 100 from adjacent semiconductor packages 100. In some embodiments, the carrier 105 is detached from the back surface of the integrated circuit set 110 and the encapsulating material 120 by causing the adhesive layer (e.g., a LTHC) thereon to lose or reduce adhesion. The adhesive layer is then removed along with the carrier 105. For example, the adhesive layer may be exposed to UV light, so that the adhesive layer loses or reduces adhesion, and hence the carrier 105 and the adhesive layer can be removed.

Figure 2H:
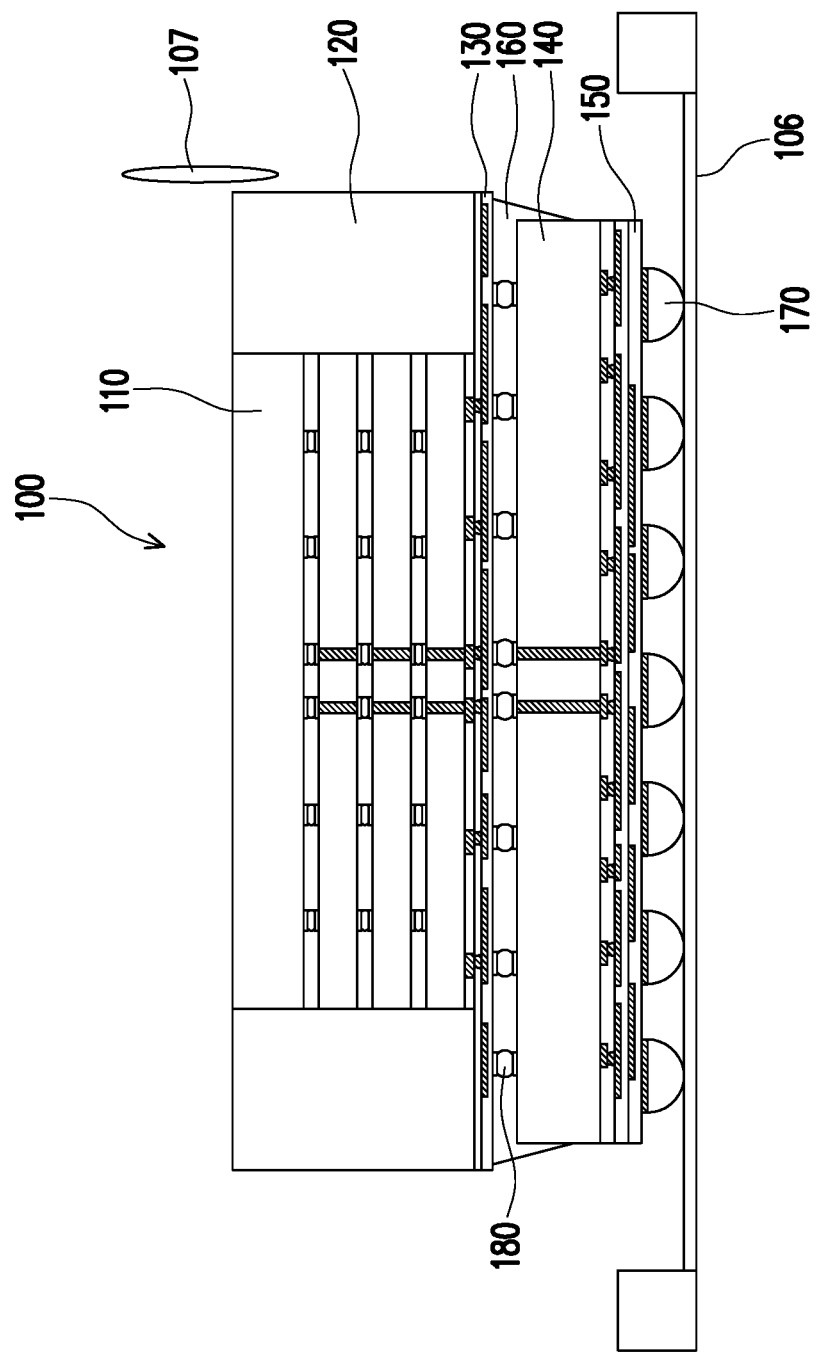

With now reference to FIG. 1 and FIG. 2H, performing step S160, in some embodiments, a singulation process is performed on the encapsulating material 120 to form a plurality of semiconductor packages 100. During the singulation (dicing) process, a wet sawing operation may be performed by a saw 107 to cut the semiconductor packages 100 in a wafer form along the scribe lines. The singulation process may be performed through a cutting by a mechanical or laser saw 107 may be used to separate multiple semiconductor packages 100 from one another. The separated semiconductor packages 100 may be removed or de-bonded from the tape carrier 106 following singulation. At the time, the manufacturing process of the semiconductor package 100 may be substantially done.

With such configuration, by utilizing the integrated fan-out process, a substrate-less semiconductor package 100 can be achieved. Namely, the integrated circuit 140 can be mounted on the integrated circuit set 110 without a substrate, so as to reduce overall thickness and production cost of the semiconductor package 100. In addition, by mounting the integrated circuit 140 onto the integrated circuit set 110 through the conductive (micro) bumps 180, the numbers of I/O can be significantly increased to meet the requirement of higher bandwidth memory device package with lower power consumption. Moreover, the micro-bump bonding process can be performed by mass reflow process, so as to improve the manufacturing efficiency of the semiconductor process.

Figure 3A:
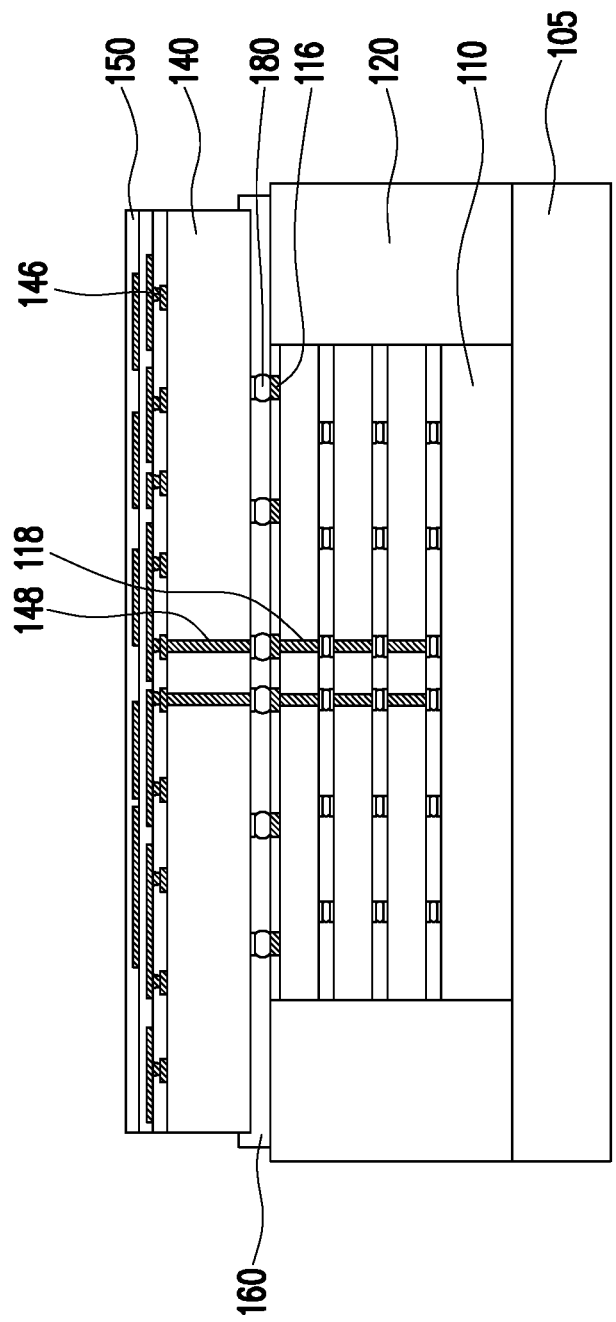
FIG. 3A to FIG. 3B illustrate cross sectional views of intermediate stages in a manufacturing of a semiconductor package according to some exemplary embodiments of the present disclosure.
Figure 3B:
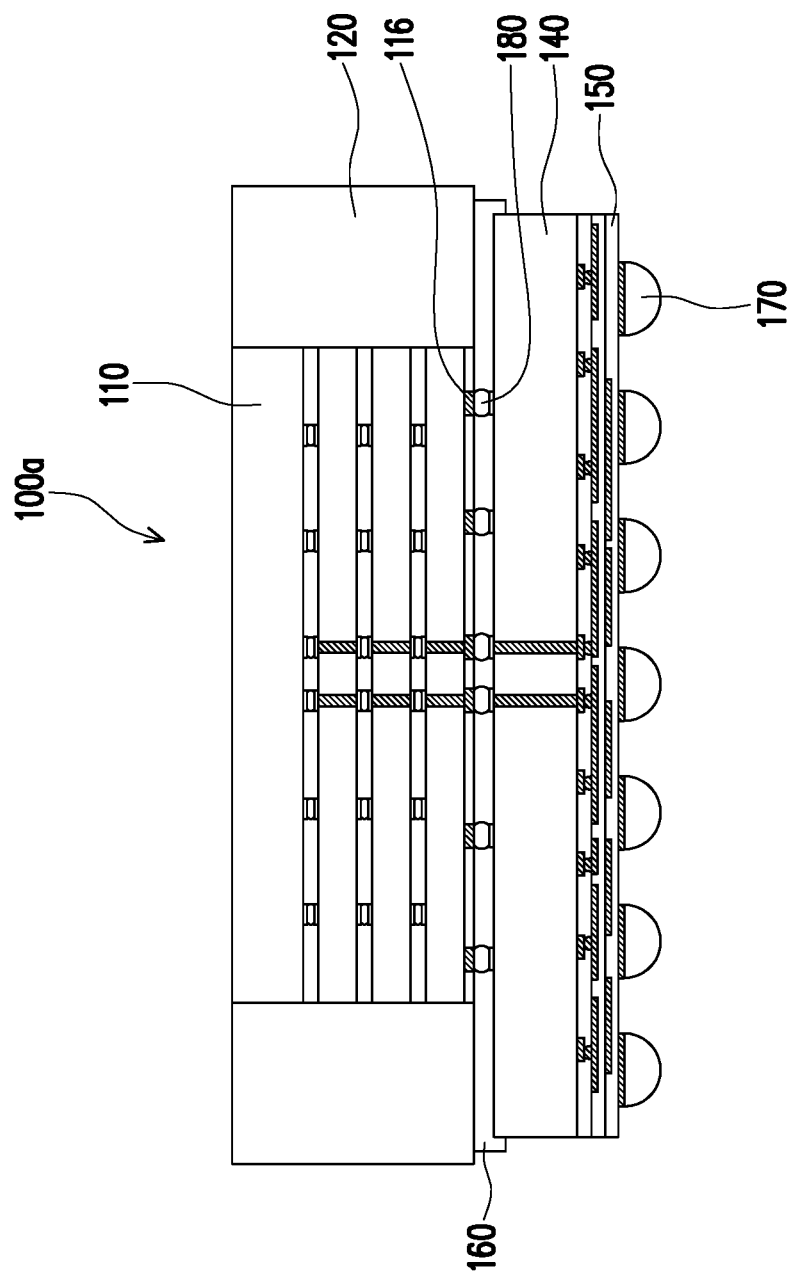

FIG. 3A to FIG. 3B illustrate cross sectional views of intermediate stages in a manufacturing of a semiconductor package according to some exemplary embodiments of the present disclosure. It is noted that the manufacturing of the semiconductor package 100a shown in FIG. 3 contains many features same as or similar to the manufacturing of the semiconductor package 100 disclosed earlier with FIG. 2. For purpose of clarity and simplicity, detail description of same or similar features may be omitted, and the same or similar reference numbers denote the same or like components. The main differences between the semiconductor package 100a shown in FIG. 3 and the manufacturing of the semiconductor package 100 shown in FIG. 2 are described as follows.

With now reference to FIG. 3A, in some embodiments, the step of forming the redistribution structure 130 over the integrated circuit set 110 and the encapsulating material 120 is omitted. In the present embodiment, the integrated circuit 140 may be directly mounted on the integrated circuit set 110 through the conductive bumps 180. In some embodiments, the filling material 160 may be a non-conductive film (NCF), which may be a nonconductive material, such as a polymer, a resin, insulator, or the like. The NCF 160 may be a non-liquid material such as a film, sheet or other structure that may be applied to cover and protect at least a portion of the conductive bumps 180 and to provide lateral support to the conductive bumps 180 during reflow. In an embodiment, the NCF 160 is a thermal set polymer or dry film having an adhesive on a side and adheres to the top surface of the integrated circuit set 110 when applied. For example, the NCF 160 may be an epoxy that is cured using thermal energy, or a material that cures when exposed to light, UV, air or a catalyst. The disclosure does not limited the material and the type of the filling material 160. In other embodiments, the filling material 160 may be an underfill, or the like.

In accordance with some embodiments of the disclosure, after the integrated circuit 140 is mounted on the integrated circuit set 110, a redistribution structure 150 may be provided over the integrated circuit 140 and electrically connected to the contact pads 146 of the integrated circuit 140. In other embodiments, the redistribution structure 150 may be provided on the integrated circuit 140 before the integrated circuit 140 is mounted on the integrated circuit set 110. Then, same or similar processes illustrated and described with regard to FIG. 2F to FIG. 2H may be sequentially applied to the resultant structure shown in FIG. 3A to obtain the semiconductor package 100a in FIG. 3B.

Figure 4A:
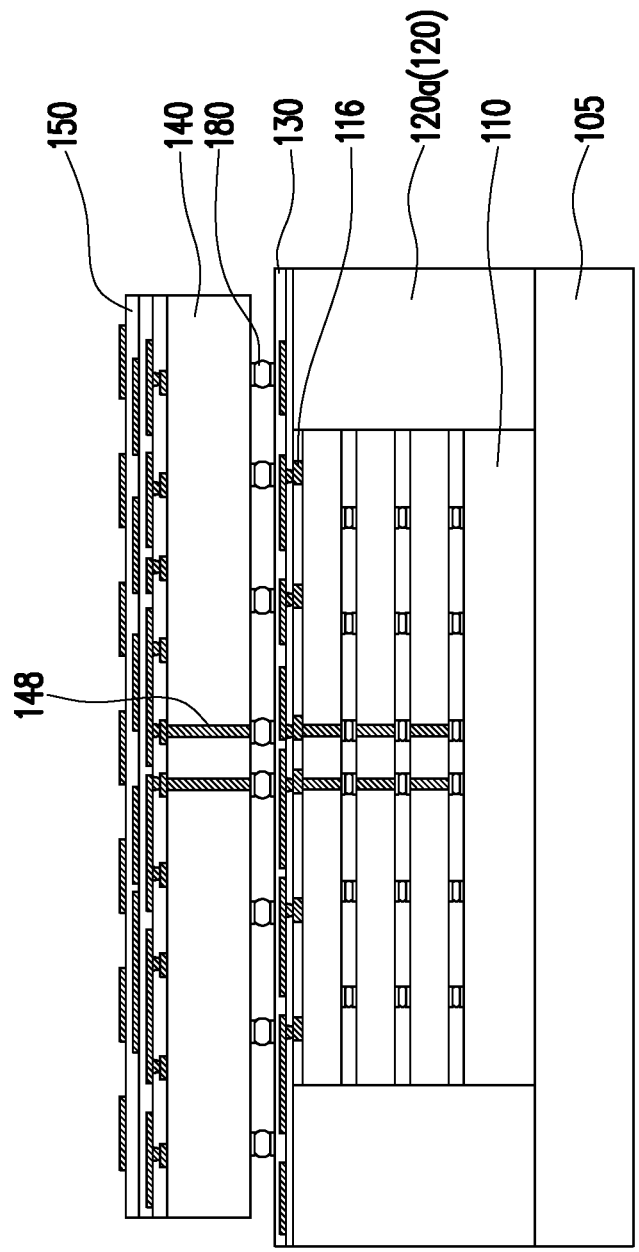
FIG. 4A to FIG. 4C illustrate cross sectional views of intermediate stages in a manufacturing of a semiconductor package according to some exemplary embodiments of the present disclosure.
Figure 4B:
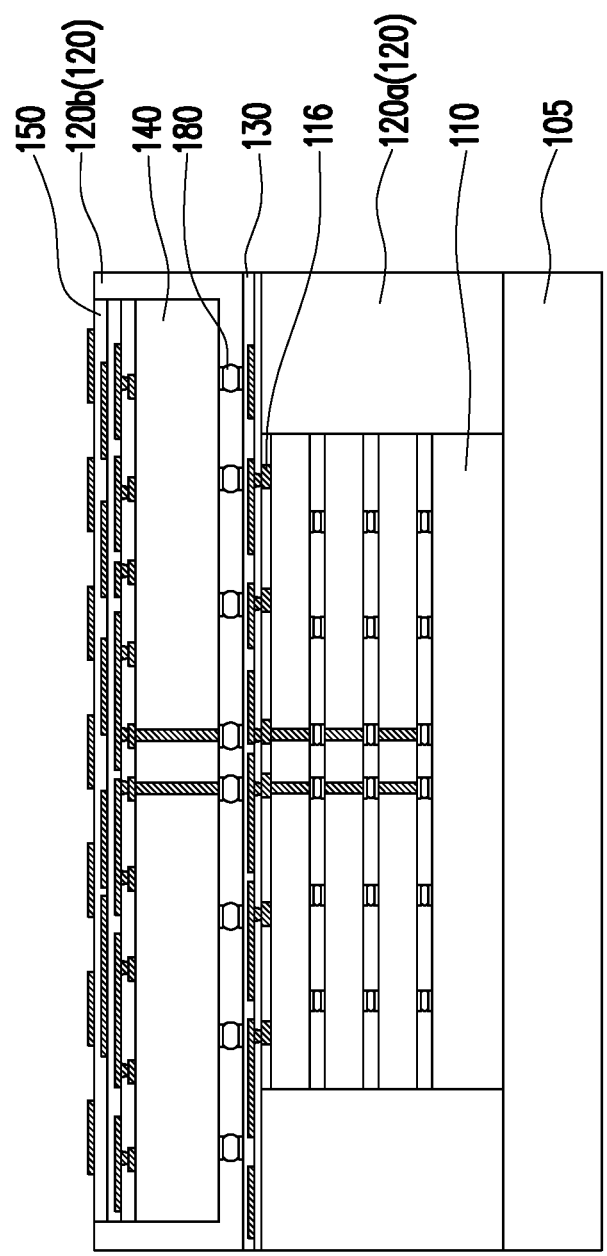
Figure 4C:
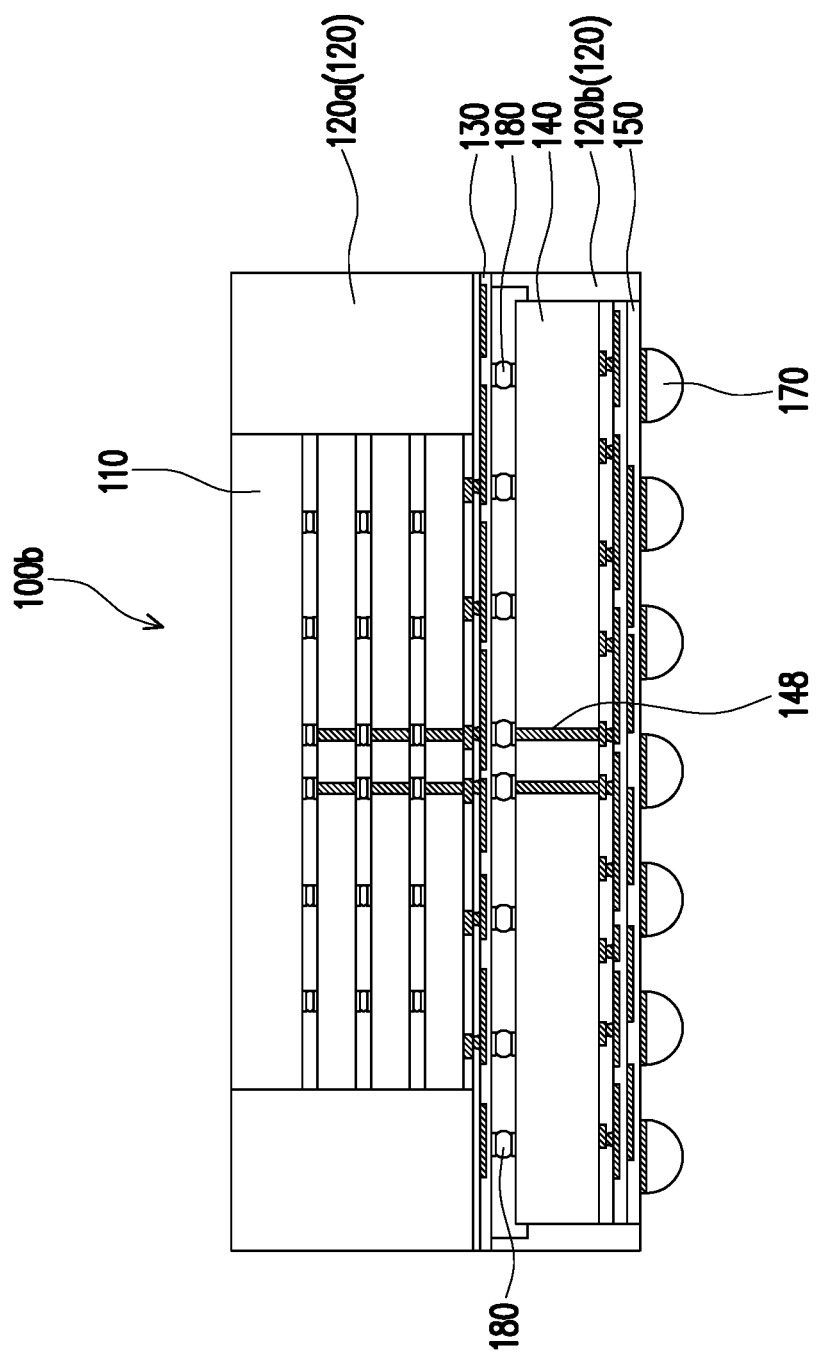

FIG. 4A to FIG. 4C illustrate cross sectional views of intermediate stages in a manufacturing of a semiconductor package according to some exemplary embodiments of the present disclosure. It is noted that the manufacturing of the semiconductor package 100b shown in FIG. 4 contains many features same as or similar to the manufacturing of the semiconductor package 100 disclosed earlier with FIG. 2. For purpose of clarity and simplicity, detail description of same or similar features may be omitted, and the same or similar reference numbers denote the same or like components. The main differences between the manufacturing of the semiconductor package 100b shown in FIG. 4 and the manufacturing of the semiconductor package 100 shown in FIG. 2 are described as follows.

With now reference to FIG. 4A, in accordance with some embodiments of the disclosure, the integrated circuit 140 is mounted on the integrated circuit set 110 through a plurality of conductive bumps 180. In some embodiments, the conductive bumps 180 may be disposed on the back surface of the integrated circuit 140 for mounting the integrated circuit 140 onto the integrated circuit set 110. Namely, the integrated circuit 140 is mounted on the active surface of the integrated circuit set 110 with its back surface (i.e. back to face configuration). In detail, the conductive bumps 180 are disposed between the integrated circuit 140 and the integrated circuit set 110 and electrically connecting the through vias 148 and the redistribution structure 130. With such arrangement, the redistribution structure 130 is located between the integrated circuit set 110 and the conductive bumps 180.

With now reference to FIG. 4B and FIG. 4C, after the integrated circuit 140 is mounted on the integrated circuit set 110, an (first) encapsulating material 120b is provided on the carrier 105 to encapsulate the integrated circuit 140. That is, the step of providing the encapsulating material 120 on the carrier 105 may include two sub-steps, which are: providing the (second) encapsulating material 120a on the carrier 105 to encapsulate the integrated circuit set 110, and providing the (first) encapsulating material 120b on the carrier 105 to encapsulate the integrated circuit 140. In some embodiments, the material of the encapsulating material 120a may be the same as the material of the encapsulating material 120*b*. Certainly, in other embodiments, the material of the encapsulating material 120*a* may be different from the material of the encapsulating material 120*b*.

In accordance with some embodiments of the disclosure, the redistribution structure 130 is extended over the integrated circuit set 110 and the encapsulating material 120*a*. Accordingly, the encapsulating material 120*b* is provided on the redistribution structure 130 and encapsulates the conductive bumps 180. In an embodiment, the encapsulating material 120*b* encapsulates a side surface of the integrated circuit 140 and a side surface of the redistribution structure 150. In some embodiments, a top surface of the encapsulating material 120*b* is substantially coplanar with a top surface of the redistribution structure 150. Then, same or similar processes illustrated and described with regard to FIG. 2F to FIG. 2H may be sequentially applied to the resultant structure shown in FIG. 4B to obtain the semiconductor package 100*b* shown in FIG. 4C.

Figure 5:
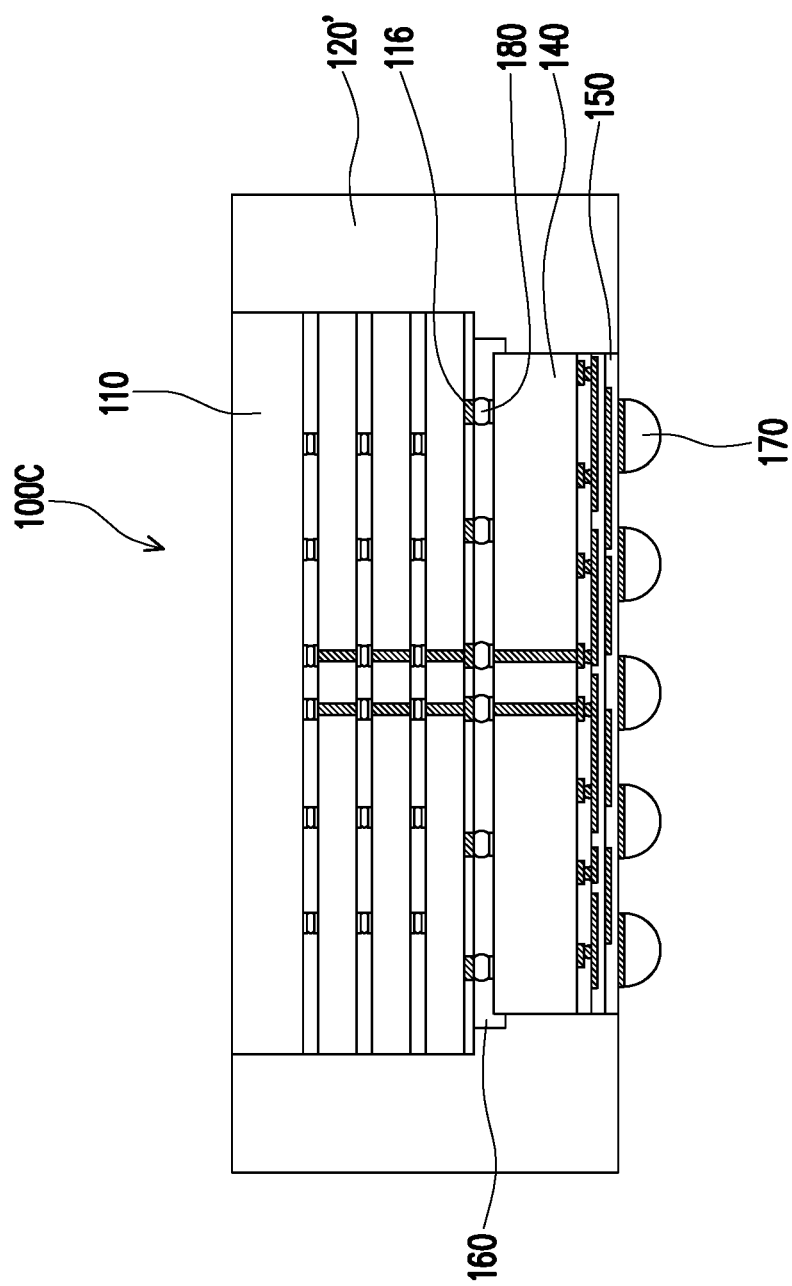
FIG. 5 illustrates a cross sectional view of a semiconductor package according to some exemplary embodiments of the present disclosure.

FIG. 5 illustrate a cross sectional view of a semiconductor package according to some exemplary embodiments of the present disclosure. It is noted that the semiconductor package 100*c* shown in FIG. 5 contains many features same as or similar to the semiconductor package 100 disclosed earlier with FIG. 2H. For purpose of clarity and simplicity, detail description of same or similar features may be omitted, and the same or similar reference numbers denote the same or like components. The main differences between the semiconductor package 100*c* shown in FIG. 5 and the semiconductor package 100 shown in FIG. 2H are described as follows.

With reference to FIG. 5, in accordance with some embodiments of the disclosure, the encapsulating material 120' may encapsulate both the integrated circuit set 110 and the integrated circuit 140. In such embodiments, the encapsulating material 120' is provided on the carrier 105 after the integrated circuit 140 is mounted on the integrated circuit set 110, such that the encapsulating material 120' may encapsulate the integrated circuit set 110 and the integrated circuit 140 all at once. In some embodiments, the encapsulating material 120' may include a molding compound, an epoxy, or a resin, etc.

Figure 6A:
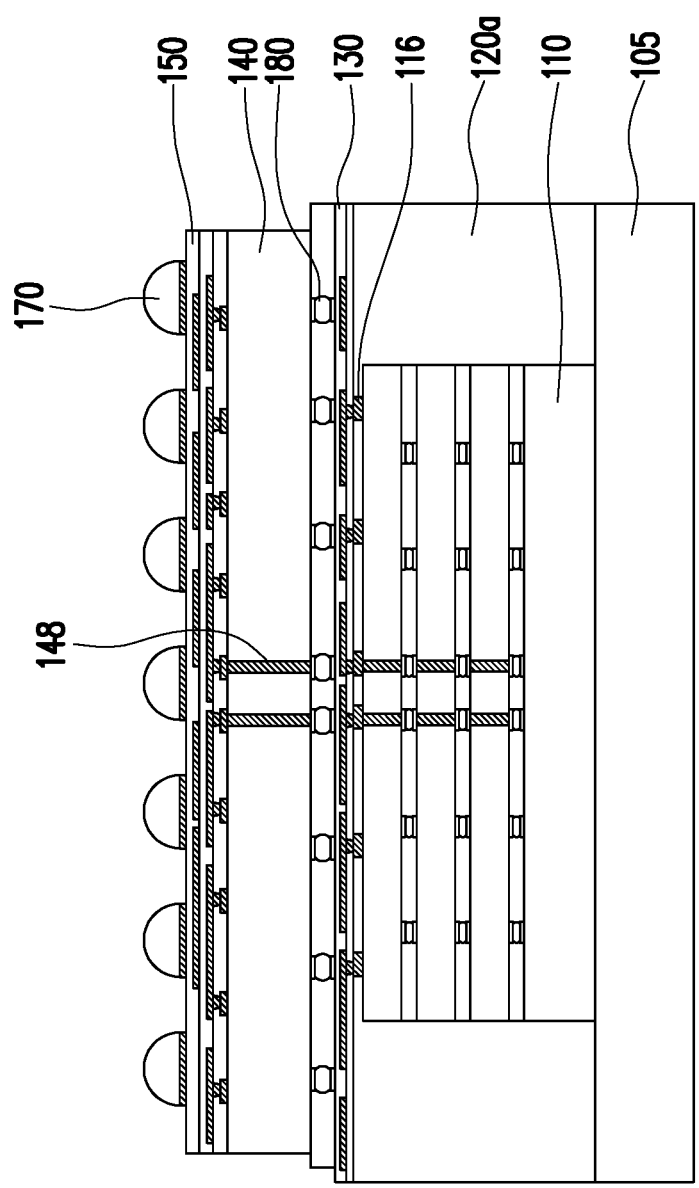
FIG. 6A to FIG. 6C illustrate cross sectional views of intermediate stages in a manufacturing of a semiconductor package according to some exemplary embodiments of the present disclosure.
Figure 6B:
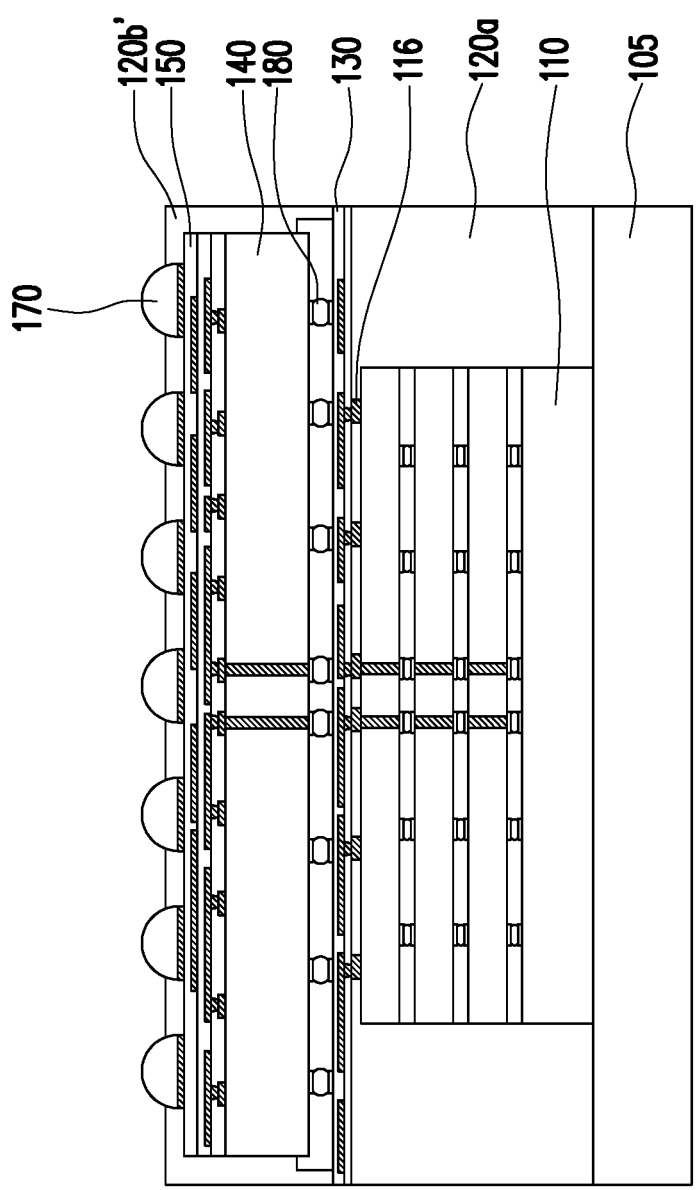
Figure 6C:
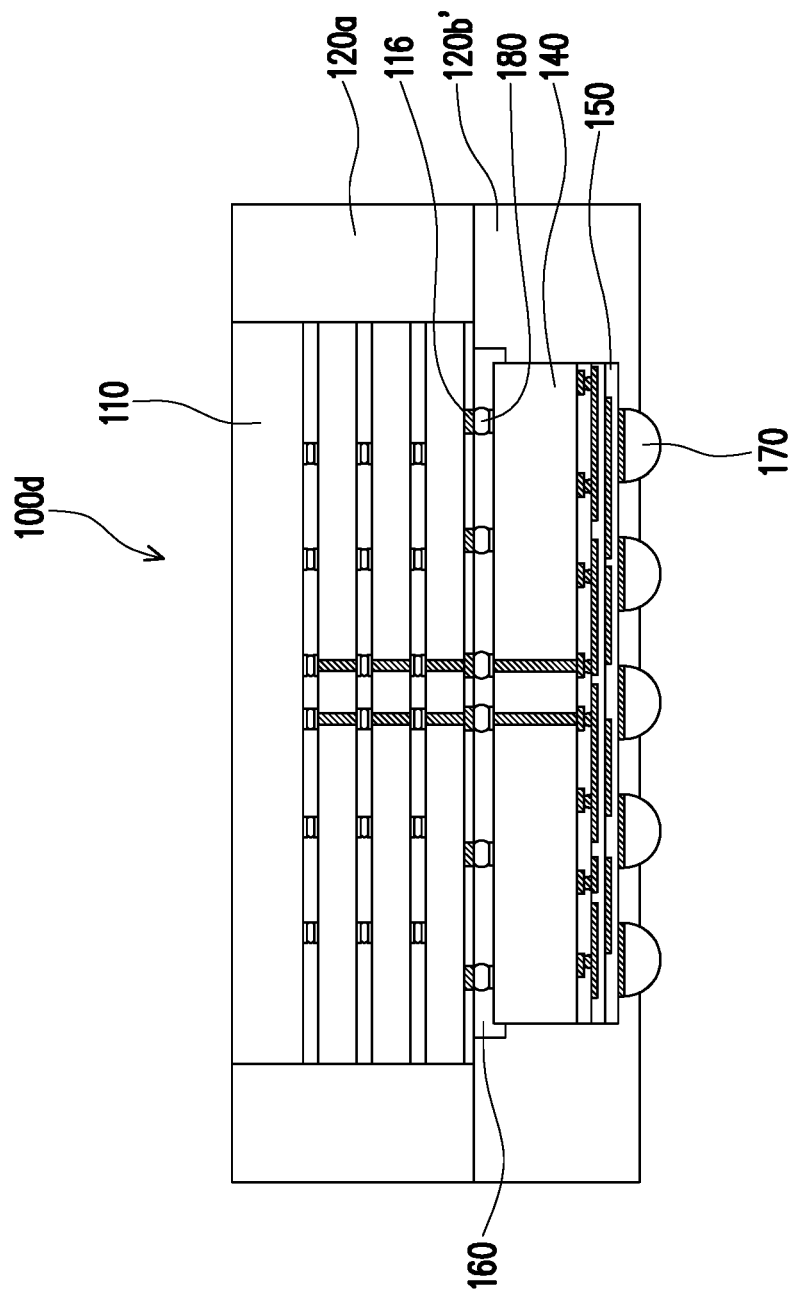

FIG. 6A to FIG. 6C illustrate cross sectional views of intermediate stages in a manufacturing of a semiconductor package according to some exemplary embodiments of the present disclosure. It is noted that the manufacturing of the semiconductor package 100*d* shown in FIG. 6 contains many features same as or similar to the manufacturing of the semiconductor package 100 disclosed earlier with FIG. 2. For purpose of clarity and simplicity, detail description of same or similar features may be omitted, and the same or similar reference numbers denote the same or like components. The main differences between the manufacturing of the semiconductor package 100*d* shown in FIG. 6 and the manufacturing of the semiconductor package 100 shown in FIG. 2 are described as follows.

With reference to FIG. 6A, in some embodiments, the integrated circuit 140 is mounted on the integrated circuit set 110 through the conductive bumps 180 as it is described in FIG. 2D and shown in FIG. 6A. After the integrated circuit 140 is mounted on the integrated circuit set 110 and the filling material 160 is filled between the integrated circuit set 110 and the integrated circuit 140, the electrical terminals 170 are disposed on the redistribution structure 150 in accordance with some exemplary embodiments. In some embodiments, at least one IPD (not shown) may also be disposed on the redistribution structure 150. In some embodiments, the electrical terminals 170 may include solder balls, solder regions, conductive pillars, or conductive pillars with solder caps, which may also be formed through plating. The IPD may be mounted on the redistribution structure 150 through, for example, flip-chip bonding or wire bonding, etc.

With now reference to FIG. 6B, in some embodiments, an encapsulating material 120*b*' is provided over the integrated circuit set 110 and the encapsulating material 120*a* to encapsulate the integrated circuit 140. In accordance with some embodiments of the disclosure, the encapsulating material 120*b*' is provided on the redistribution structure 130 formed over the integrated circuit set 110 and the encapsulating material 120*a*, and the encapsulating material 120*b*' further encapsulates a side surface of the redistribution structure 150 and a part of the electrical terminals 170. In some embodiments, the encapsulating material 120*b*' encapsulates at least a bottom part of the electrical terminals 170 connecting the redistribution structure 150 for stress relief of the semiconductor package 100*d*. In accordance with some embodiments of the disclosure, a top surface of the encapsulating material 120*b*' is substantially higher than a top surface of the redistribution structure 150. That is to say, the encapsulating material 120*b*' encapsulates at least a side surface of the integrated circuit 140, a side surface and a top surface of the redistribution structure 150 and the bottom part of the electrical terminals 170 connecting the redistribution structure 150.

In some embodiments, the material of the encapsulating material 120*b*' may be the same as the material of the encapsulating material 120*a*, which may include a molding compound, an epoxy, a resin, or the like. Certainly, in other embodiments, the material of the encapsulating material 120*b*' may be different from the material of the encapsulating material 120*a*. Then, same or similar processes illustrated and described with regard to FIG. 2G to FIG. 2H may be sequentially applied to the resultant structure shown in FIG. 6B to obtain the semiconductor package 100*d* shown in FIG. 6C.

FIG. 7A to FIG. 7E illustrate cross sectional views of intermediate stages in a manufacturing of a semiconductor package according to some exemplary embodiments of the present disclosure. It is noted that the manufacturing of the semiconductor package 100*e* shown in FIG. 7 contains many features same as or similar to the manufacturing of the semiconductor package 100 disclosed earlier with FIG. 2. For purpose of clarity and simplicity, detail description of same or similar features may be omitted, and the same or similar reference numbers denote the same or like components. The main differences between the manufacturing of the semiconductor package 100*e* shown in FIG. 7 and the manufacturing of the semiconductor package 100 shown in FIG. 2 are described as follows.

Figure 7A:
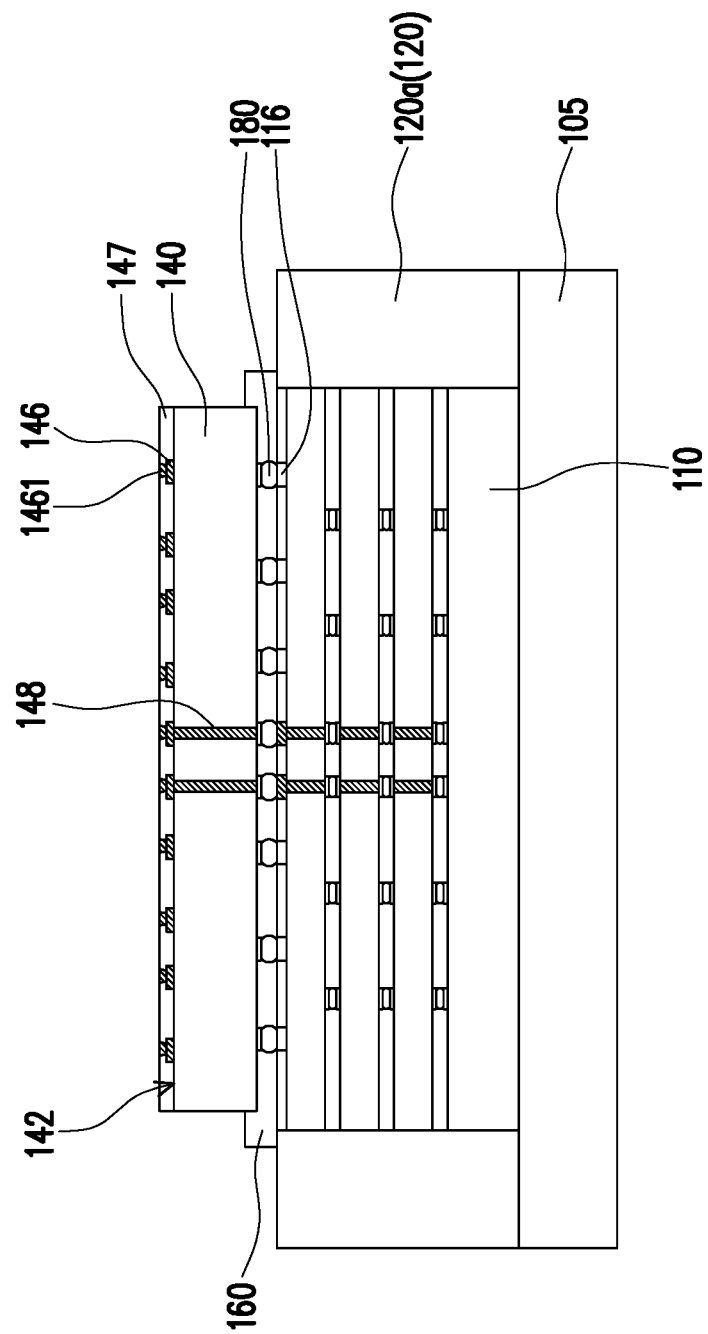
FIG. 7A to FIG. 7E illustrate cross sectional views of intermediate stages in a manufacturing of a semiconductor package according to some exemplary embodiments of the present disclosure.

With reference to FIG. 7A, in some embodiments, the integrated circuit 140 is mounted on the integrated circuit set 110 through the conductive bumps 180. In accordance with some embodiments of the disclosure, the integrated circuit 140 may further include a plurality of conductive vias 1461 and a dielectric layer (passivation layer) 147. In some embodiments, the conductive vias 1461 may be formed on the active surface 142 of the integrated circuit 140 and electrically coupled to the contact pads 146 on the substrate of the integrated circuit 140. In some embodiments, the dielectric layer 147 may be formed on the active surface 142 of the integrated circuit 140, and may cover the top surfaces of the conductive vias 1461. In other embodiments, the top surface of the dielectric layer 147 may be substantially level with the top surfaces of the conductive vias 1461. Alternatively, the dielectric layer 147 may be omitted, and the conductive vias 1461 protrude from the active surface 142 of the integrated circuit 140.

Figure 7B:
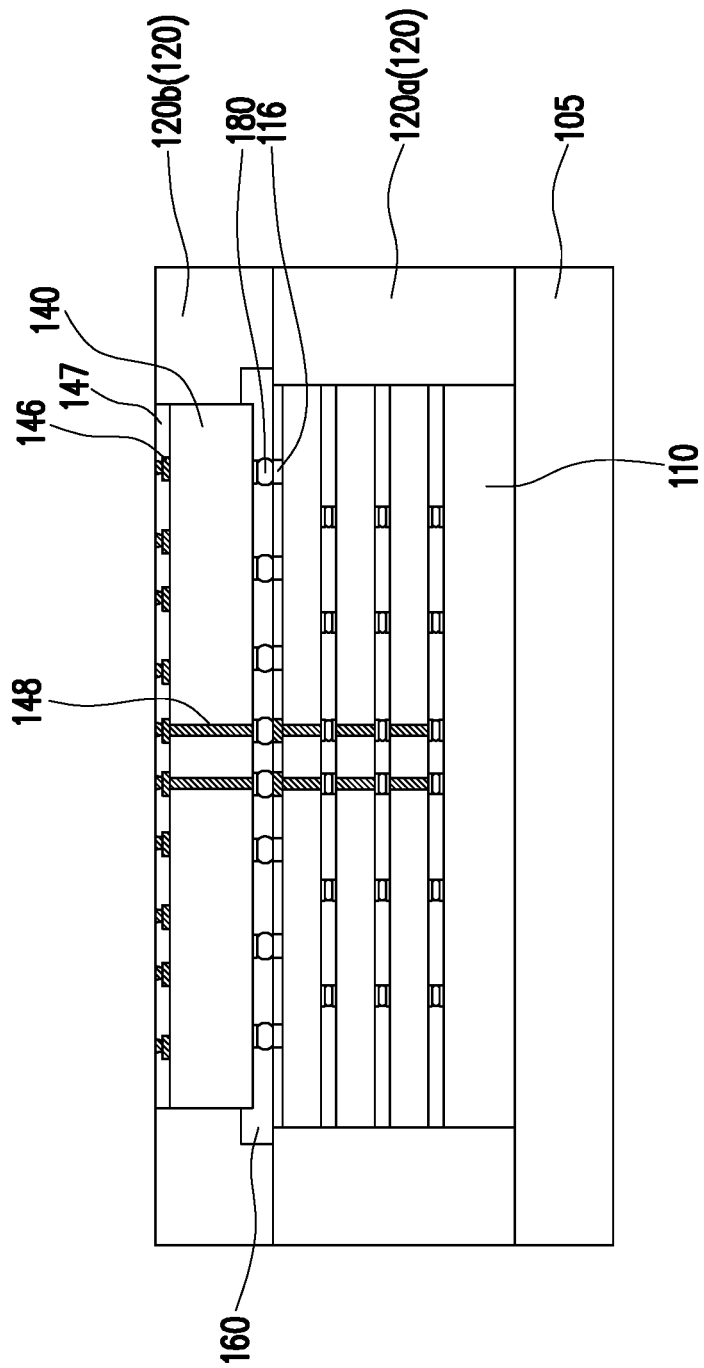

With now reference to FIG. 7B, in some embodiments, the encapsulating material 120b may be provided over the carrier 105 to encapsulate the integrated circuit 140. Specifically, the encapsulating material 120b may be provided on the encapsulating material 120a to encapsulate the integrated circuit 140. In some embodiments, a top surface of the encapsulating material 120b may be higher than the top surface of the dielectric layer 147. Namely, the encapsulating material 120b covers the top surface of the dielectric layer 147.

Then, a thinning process, which may be a grinding process, is performed to thin the encapsulating material 120b (and the dielectric layer 147) until the top surfaces of the conductive vias 1461 are revealed. The resulting structure is shown in FIG. 7B. Due to the thinning process, the top surfaces of the conductive vias 1461 are substantially level with the top surface of the encapsulating material 120b and the top surface of the dielectric layer 147 as shown in FIG. 7B. The resultant structure shown in FIG. 7B may have a wafer form in the process.

Figure 7C:
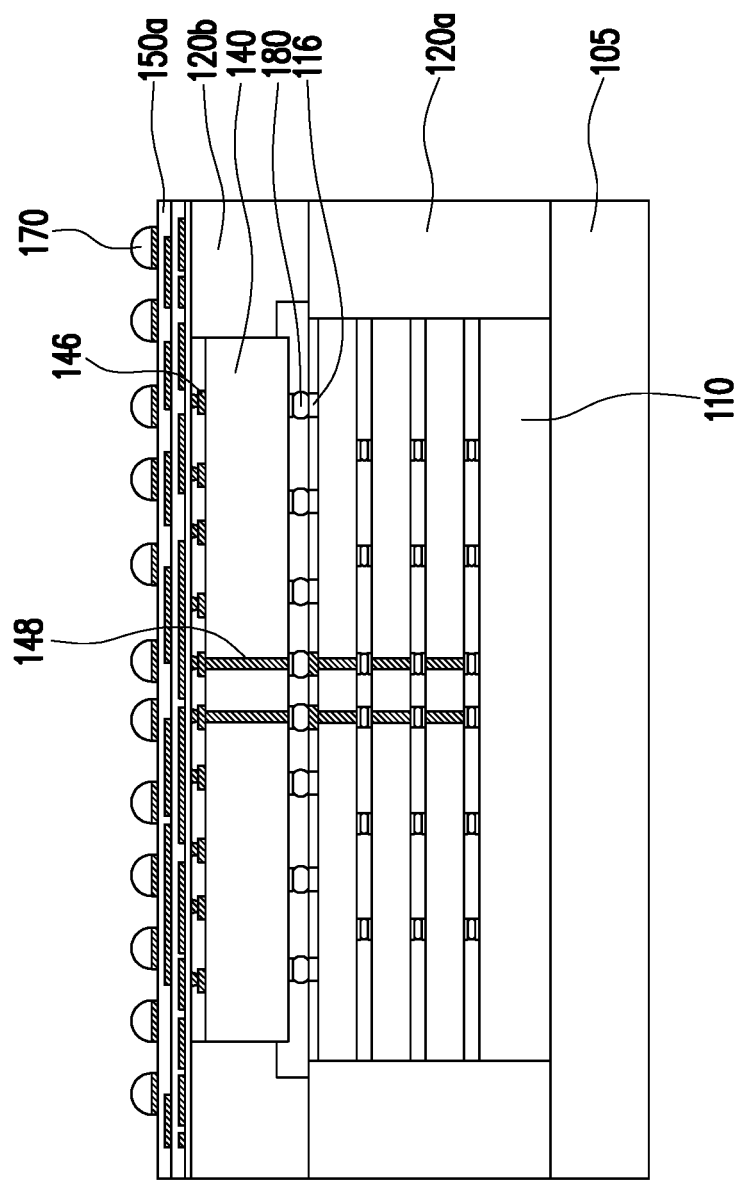

With now reference to FIG. 7C, in some embodiments, after the encapsulating material 120b encapsulates the integrated circuit 140 as it is described above, a redistribution structure 150a is provided on the integrated circuit 140 and extended over the active surface of the integrated circuit 140 and the encapsulating material 120b. The redistribution structure 150a is electrically connected to the integrated circuit 140. In some embodiments, the redistribution structure 150a are formed over the integrated circuit 140 and the encapsulating material 120b to interconnect the contact pads 146 of the integrated circuit 140. The redistribution structure 150a may be formed by the same or similar process as the redistribution structure 130 described above, for example. In addition, a UBM layer may be formed on the redistribution structure 150a by sputtering, evaporation, or electroless plating, etc.

Then, in accordance with some embodiments of the disclosure, the electrical terminals 170 may be disposed on the redistribution structure 150a in accordance with some exemplary embodiments. In some embodiments, at least one IPD (not shown) may also be disposed on the redistribution structure 150a. The types and the formation of the electrical terminals 170 may be the same as or at least similar to the electrical terminals 170 described above. The IPD may be fabricated using standard wafer fabrication technologies such as thin film and photolithography processing, and may be mounted on the redistribution structure 150a through, for example, flip-chip bonding or wire bonding, etc.

Figure 7D:
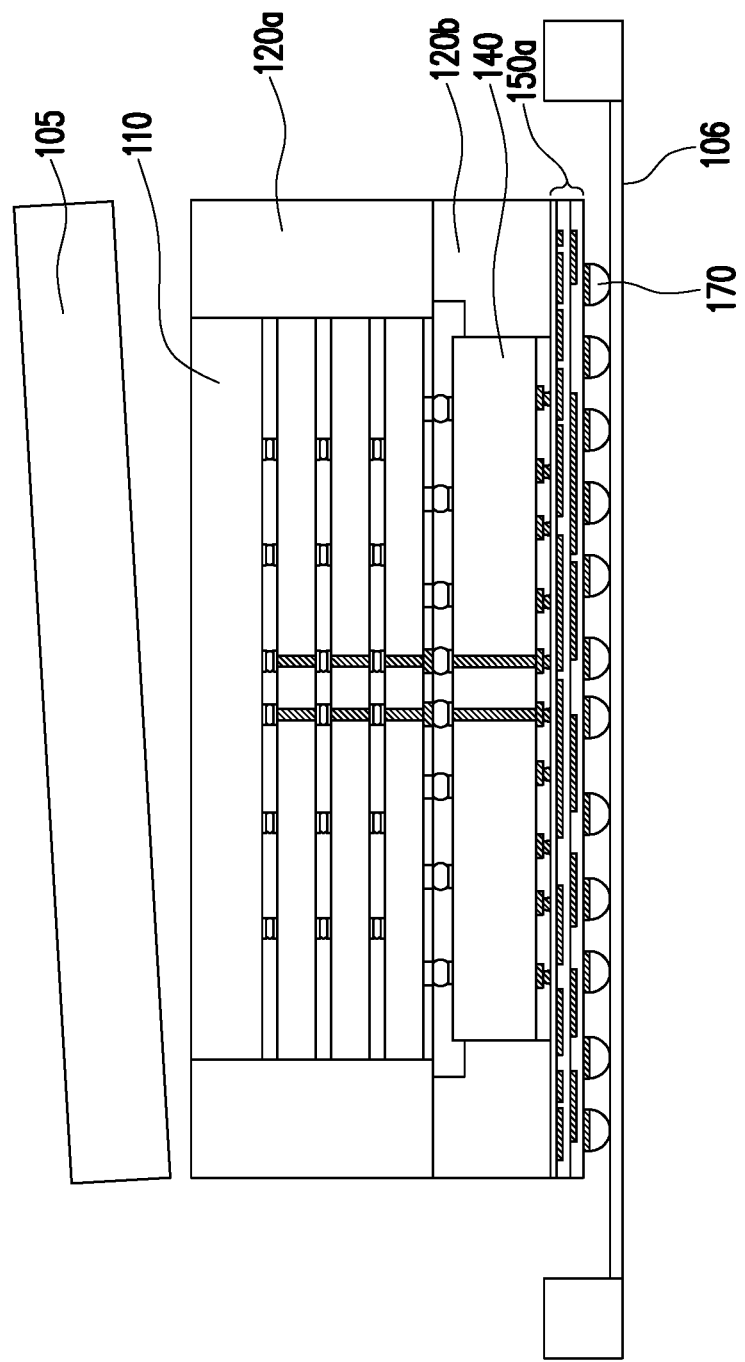

With now reference to FIG. 7D, in some embodiments, the resultant structure shown in FIG. 7C may be flipped over and mounted on a tape carrier 106, and the carrier 105 may be removed. In some embodiments, the tape carrier 106 may be a dicing tape, which is typically used to secure the package structure and keep it stationary during a subsequent singulation process. In some embodiments, the carrier 105 is detached from the back surface of the integrated circuit set 110 and the encapsulating material 120a by causing the adhesive layer (e.g., a LTHC) thereon to lose or reduce adhesion. The adhesive layer is then removed along with the carrier 105.

Figure 7E:
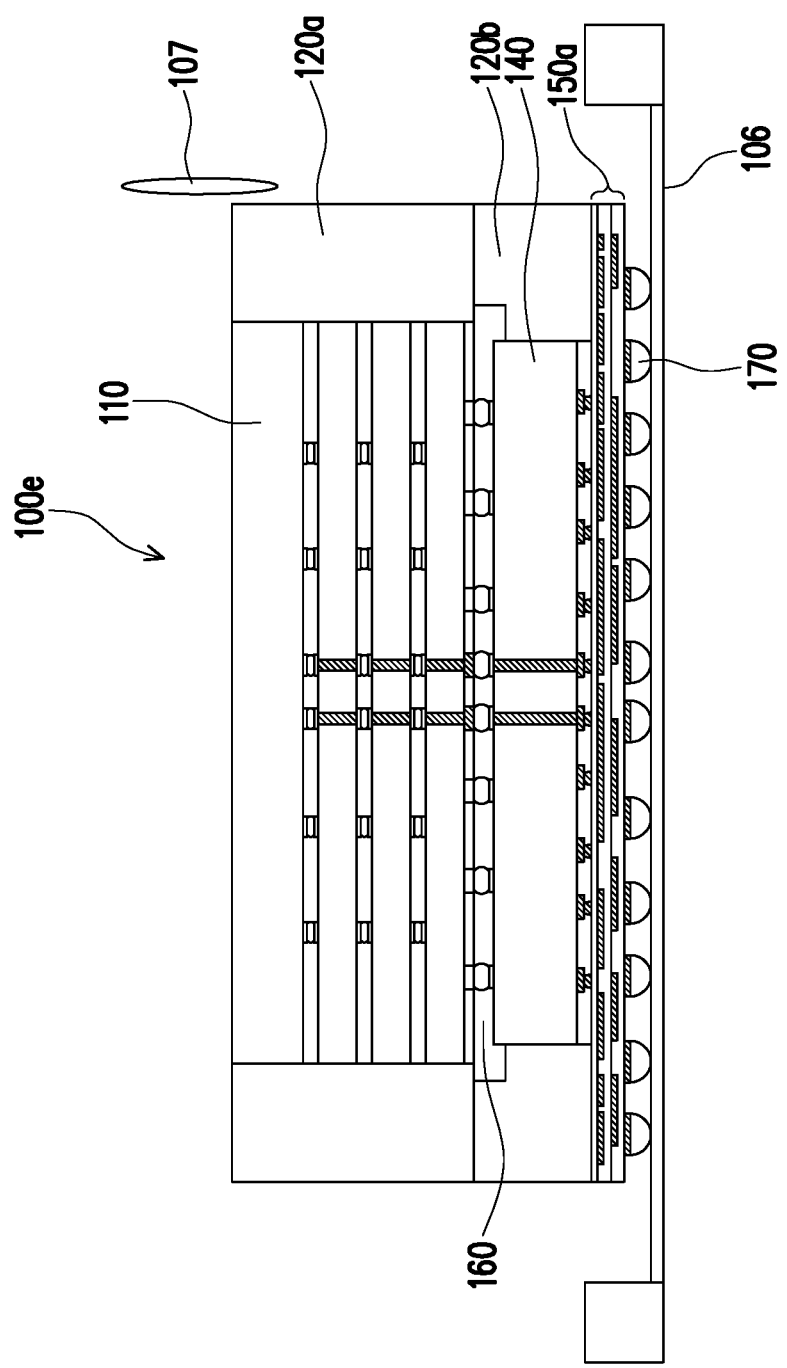

With now reference to FIG. 7E, in some embodiments, a singulation process is performed on the encapsulating material 120a and the encapsulating material 120b to form a plurality of semiconductor packages 100e. During the singulation (dicing) process, a wet sawing operation may be performed by a saw 107 to cut the semiconductor packages 100e in a wafer form along the scribe lines. Then, the separated semiconductor packages 100e may be removed or de-bonded from the tape carrier 106 following the singulation process. At the time, the manufacturing process of the semiconductor package 100e may be substantially done.

Figure 8:
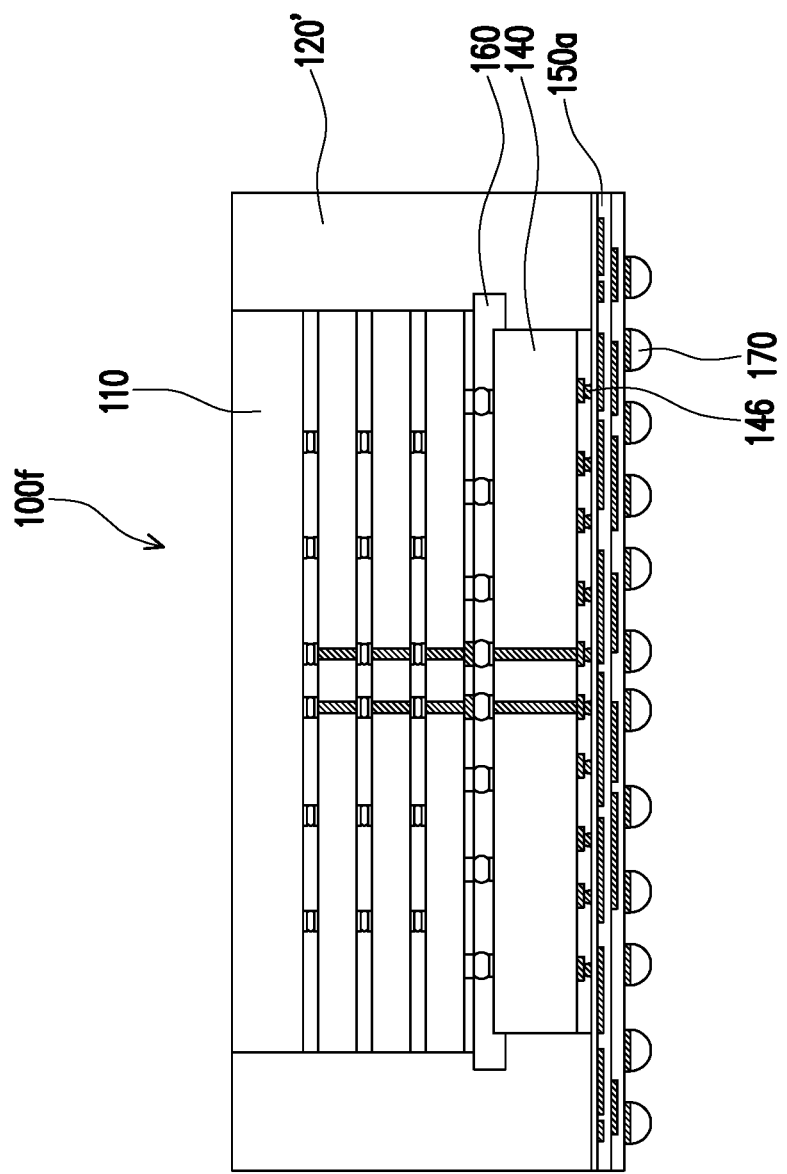
FIG. 8 illustrates a cross sectional view of a semiconductor package according to some exemplary embodiments of the present disclosure.

FIG. 8 illustrates a cross sectional view of a semiconductor package according to some exemplary embodiments of the present disclosure. It is noted that the semiconductor package 100f shown in FIG. 8 contains many features same as or similar to the semiconductor package 100e disclosed earlier with FIG. 7. For purpose of clarity and simplicity, detail description of same or similar features may be omitted, and the same or similar reference numbers denote the same or like components. The main differences between the semiconductor package 100f shown in FIG. 8 and the semiconductor package 100e shown in FIG. 7 are described as follows.

With reference to FIG. 8, in accordance with some embodiments of the disclosure, the encapsulating material 120' may encapsulate both the integrated circuit set 110 and the integrated circuit 140. In such embodiments, the encapsulating material 120' is provided on the carrier 105 after the integrated circuit 140 is mounted on the integrated circuit set 110, such that the encapsulating material 120' may encapsulate the integrated circuit set 110 and the integrated circuit 140 all at once. Then, same or similar processes illustrated and described with regard to FIG. 7C to FIG. 7E such as providing the redistribution structure 150a over the integrated circuit 140 and the encapsulating material 120', and mounting the electrical terminals 170 on the redistribution structure 150a may be sequentially performed to obtain the semiconductor package 100f shown in FIG. 8. In some embodiments, the encapsulating material 120' may include a molding compound, an epoxy, or a resin, etc.

Figure 9:
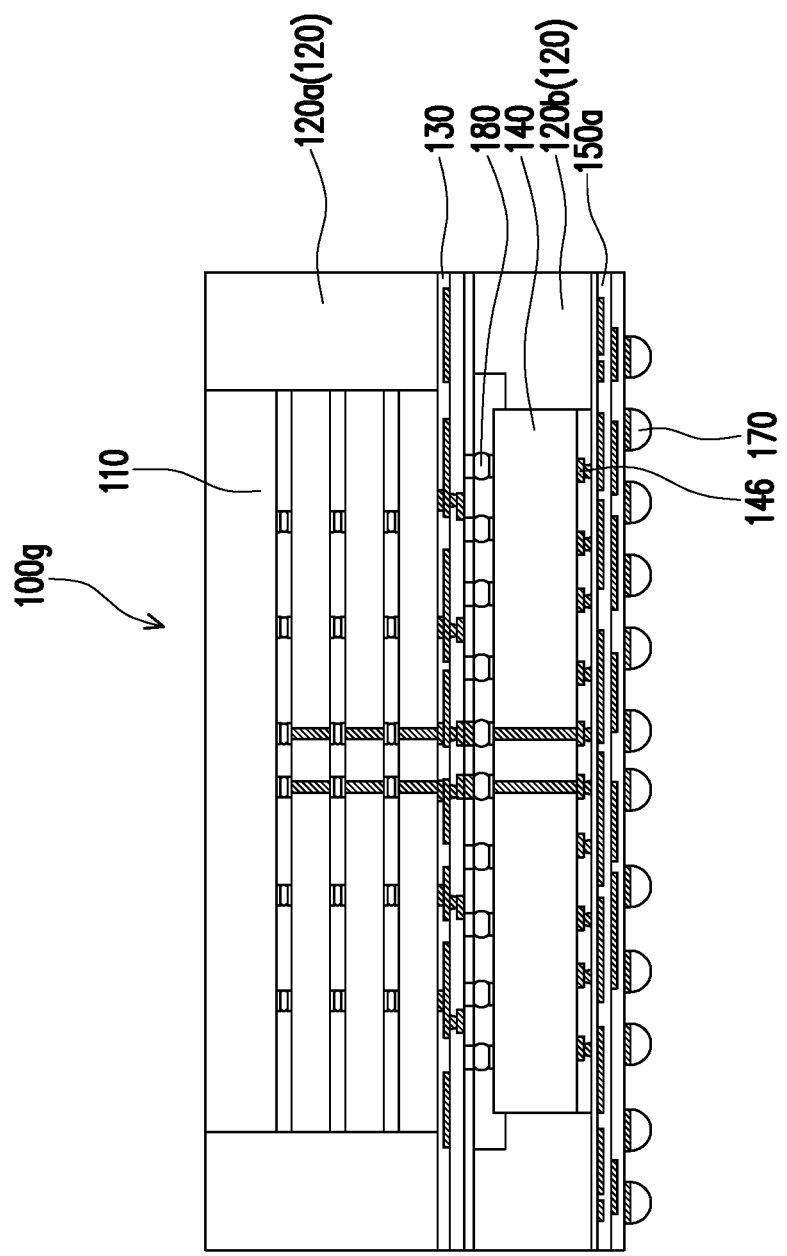
FIG. 9 illustrates a cross sectional view of a semiconductor package according to some exemplary embodiments of the present disclosure.

FIG. 9 illustrates a cross sectional view of a semiconductor package according to some exemplary embodiments of the present disclosure. It is noted that the semiconductor package 100g shown in FIG. 9 contains many features same as or similar to the semiconductor package 100e disclosed earlier with FIG. 7. For purpose of clarity and simplicity, detail description of same or similar features may be omitted, and the same or similar reference numbers denote the same or like components. The main differences between the semiconductor package 100g shown in FIG. 9 and the semiconductor package 100e shown in FIG. 7 are described as follows.

With now reference to FIG. 9, in some embodiments, the semiconductor package 100g may further include a redistribution structure 130 disposed between the integrated circuit set 110 and the conductive bumps 180. In accordance with some embodiments of the disclosure, the redistribution structure 130 may be formed over the integrated circuit set 110 and the encapsulating material 120a before the integrated circuit 140 is mounted on the integrated circuit set 110. The redistribution structure 130 is electrically connected to the integrated circuit set 110. In addition, a UBM layer may be formed on the redistribution structure 130 by sputtering, evaporation, or electroless plating, etc., for the conductive bumps to be mounted thereon. In some embodiments, the integrated circuit 140 is then mounted on the redistribution structure 130 through the conductive bumps 180. Then, same or similar processes illustrated and described with regard to FIG. 7B to FIG. 7E may be sequentially performed to obtain the semiconductor package 100g shown in FIG. 9.

FIG. 10A to FIG. 10I illustrate cross sectional views of intermediate stages in a manufacturing of a semiconductor package according to some exemplary embodiments of the present disclosure. It is noted that the manufacturing of the semiconductor package 100h shown in FIG. 10 contains many features same as or similar to the manufacturing of the semiconductor package 100 disclosed earlier with FIG. 2. For purpose of clarity and simplicity, detail description of same or similar features may be omitted, and the same or similar reference numbers denote the same or like components. The main differences between the manufacturing of the semiconductor package 100h shown in FIG. 10 and the manufacturing of the semiconductor package 100 shown in FIG. 2 are described as follows.

In accordance with some embodiments of the disclosure, a series of process may be applied to the integrated circuit 140 to form an integrated circuit package 101 before it is mounted on the integrated circuit set 110. That is to say, in the present embodiments, in the step (Step 130 shown in FIG. 1) of mounting the integrated circuit 140 on the integrated circuit set 110 through the conductive bumps 180, it is the integrated circuit package 101 including the integrated circuit 140 that is actually mounted on the integrated circuit set 110. In some embodiments, the manufacturing process of the integrated circuit package 101 may include the following steps.

Figure 10A:
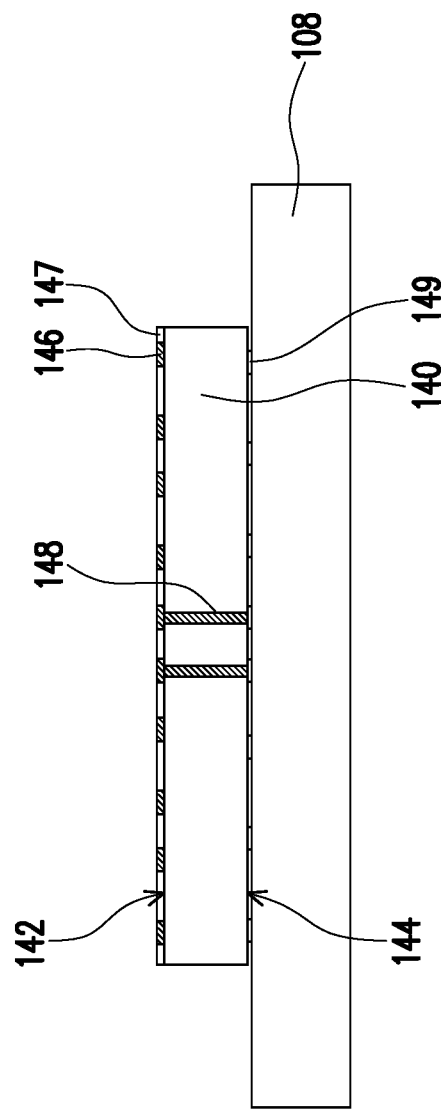
FIG. 10A to FIG. 10I illustrate cross sectional views of intermediate stages in a manufacturing of a semiconductor package according to some exemplary embodiments of the present disclosure.

With now reference to FIG. 10A, in some embodiments, an integrated circuit 140 may be provided on a carrier 108. In some embodiments, the carrier 108 may include an adhesive layer, which may be a light to heat conversion release coating (LTHC), or the like. In some embodiments, a die attach film (DAF) may also be disposed on the carrier 108, or on the adhesive layer (if any) for attaching the integrated circuit 140 on the carrier 108. In some embodiments, the carrier 108 may be a glass carrier, a ceramic carrier, or the like, and may provide temporary structural support during the formation of various components of a semiconductor package (e.g., the semiconductor package shown in FIG. 10C).

In some embodiments, the integrated circuit 140 may be formed in a wafer (not shown) having multiple integrated circuits 140 and singulated along scribe lines. The integrated circuit 140 may include an active surface 142 having a plurality of contact pads 146, a back surface 144 opposite to the active surface 142 and facing the carrier 108, a dielectric layer 147 and through vias (TSVs) 148 extending through the integrated circuit 140 and connecting the active surface 142 and the back surface 144. In some embodiments, the dielectric layer 147 is formed on the active surface 142 and covers the top surfaces of the contact pads 146. In other embodiments, the top surface of the dielectric layer 147 may be substantially level with the top surfaces of the contact pads 146 or conductive vias disposed on the contact pads 146 (if any). Alternatively, the dielectric layer 147 may be omitted, and the contact pads 146 protrude from the active surface 142 of the integrated circuit 140. In some embodiments, the integrated circuit 140 may further include a redistribution layer 149 having a plurality of solder pads disposed on the back surface 144 of the integrated circuit 140 and electrically connected to the through vias 148.

Figure 10B:
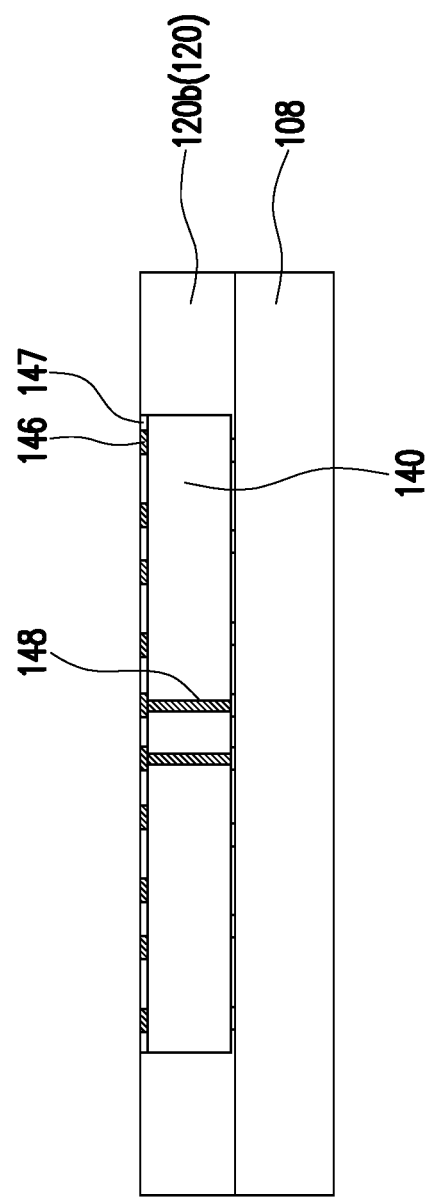

With now reference to FIG. 10B, in some embodiments, an encapsulating material 120b may be provided over the carrier 108 to encapsulate the integrated circuit 140. Specifically, the encapsulating material 120b may be provided on the carrier 108 to encapsulate the integrated circuit 140. In some embodiments, a top surface of the encapsulating material 120b may be higher than the top surface of the dielectric layer 147 and the contact pads 146. Namely, the encapsulating material 120b covers the top surface of the dielectric layer 147 and the contact pads 146. Then, a thinning process, which may be a grinding process, may be performed to thin the encapsulating material 120b (and the dielectric layer 147) until the top surfaces of the contact pads 146 or the conductive vias (if any) are revealed. The resulting structure is shown in FIG. 10B. Due to the thinning process, the top surfaces of the contact pads 146 or the conductive vias (if any) are substantially level with the top surface of the encapsulating material 120b and the top surface of the dielectric layer 147 as shown in FIG. 10B. The resultant structure shown in FIG. 10B may have a wafer form in the process.

Figure 10C:
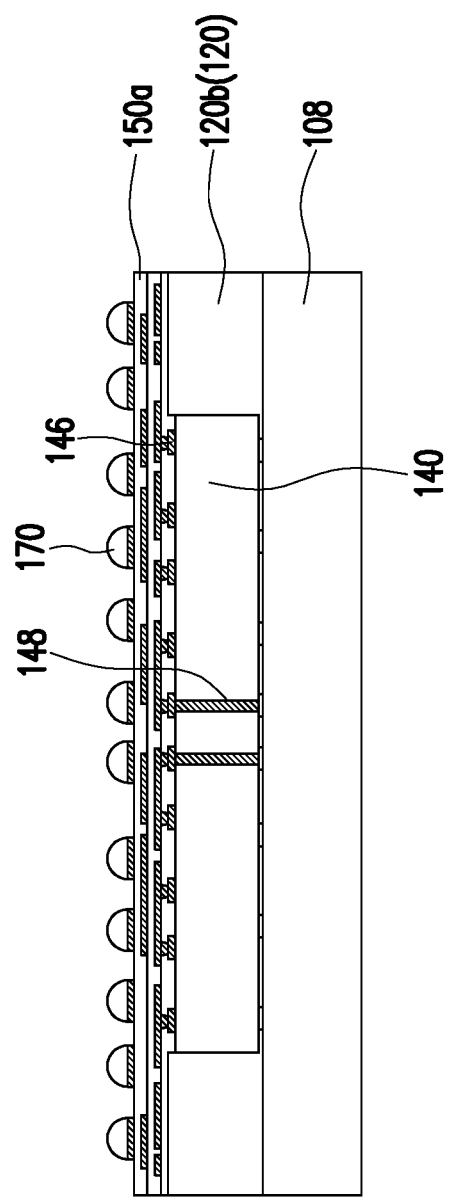

With now reference to FIG. 10C, in some embodiments, after the encapsulating material 120b encapsulates the integrated circuit 140 as it is described above, a redistribution structure 150a is provided on the integrated circuit 140 and extended over the active surface of the integrated circuit 140 and the encapsulating material 120b. The redistribution structure 150a is electrically connected to the integrated circuit 140. In some embodiments, the redistribution structure 150a are formed over the integrated circuit 140 and the encapsulating material 120b to interconnect the contact pads 146 of the integrated circuit 140. The redistribution structure 150a may be formed by the same or similar process as the redistribution structure described in the previous embodiments, for example. In addition, a UBM layer may be formed on the redistribution structure 150a by sputtering, evaporation, or electroless plating, etc.

Then, in accordance with some embodiments of the disclosure, the electrical terminals 170 may be disposed on the redistribution structure 150a in accordance with some exemplary embodiments. In some embodiments, at least one IPD (not shown) may also be disposed on the redistribution structure 150a. The types and the formation of the electrical terminals 170 may be the same as or at least similar to the electrical terminals 170 described in the previous embodiments. The IPD may be fabricated using standard wafer fabrication technologies such as thin film and photolithography processing, and may be mounted on the redistribution structure 150a through, for example, flip-chip bonding or wire bonding, etc.

Figure 10D:
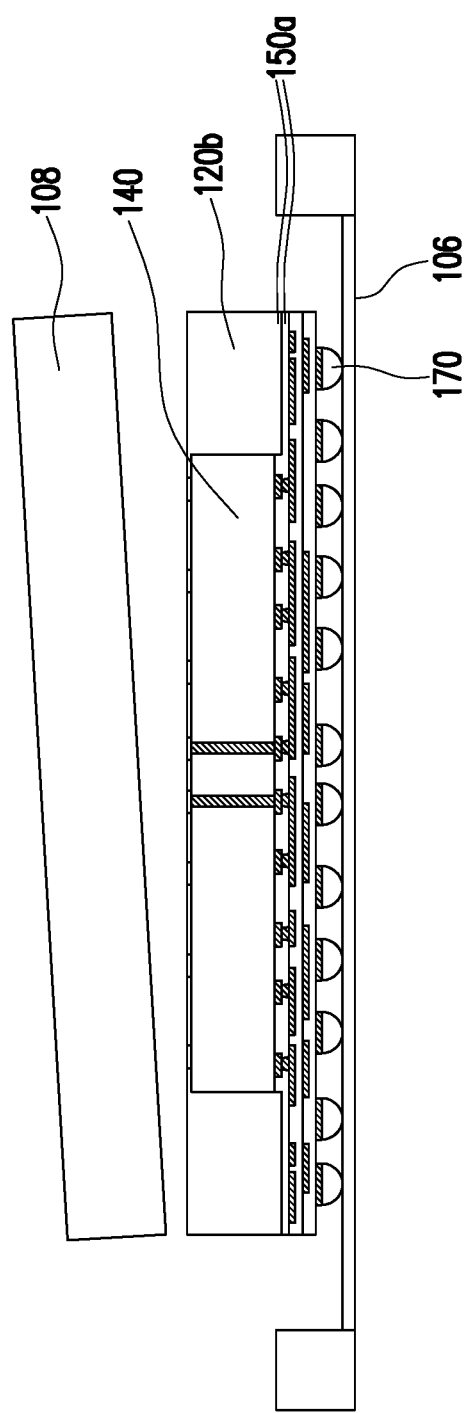

With now reference to FIG. 10D, in some embodiments, the resultant structure shown in FIG. 10C may be flipped over and mounted on a tape carrier 106, and the carrier 108 may be removed. In some embodiments, the tape carrier 106 may be a dicing tape, which is typically used to secure the package structure and keep it stationary during a subsequent singulation process. In some embodiments, the carrier 108 is detached from the back surface of the integrated circuit 140 and the encapsulating material 120b by causing the adhesive layer (e.g., a LTHC) thereon to lose or reduce adhesion. The adhesive layer is then removed along with the carrier 108 and the redistribution layer 149 on the back surface of the integrated circuit 140 may be revealed.

Figure 10E:
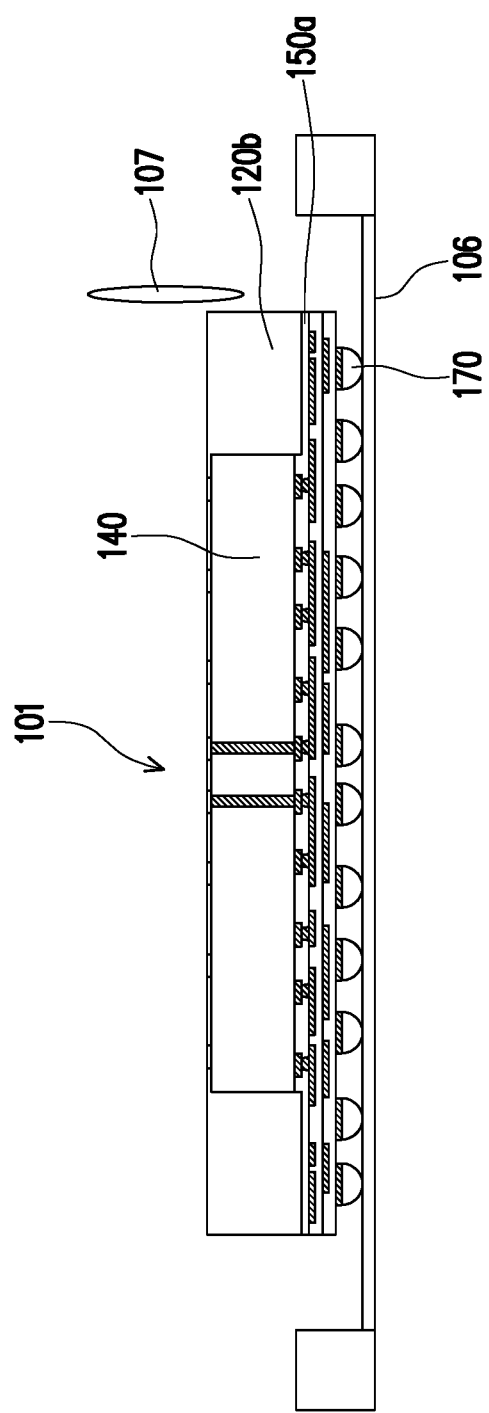

With now reference to FIG. 10E, in some embodiments, a singulation process is performed on the encapsulating material 120b to form a plurality of integrated circuit package 101. During the singulation (dicing) process, a wet sawing operation may be performed by a saw 107 to cut the integrated circuit packages 101 in a wafer form along the scribe lines. Then, the separated integrated circuit packages 101 may be removed or de-bonded from the tape carrier 106.

Figure 10F:
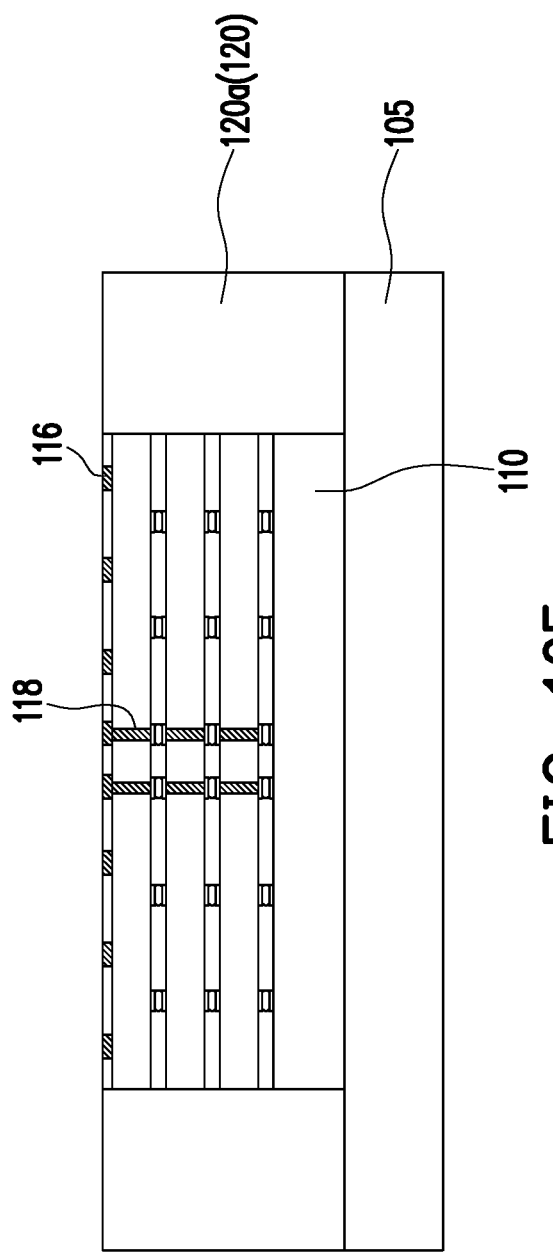

With now reference to FIG. 10F, in some embodiments, an integrated circuit set 110 is provided on a carrier 105. For example, the carrier 105 may include an adhesive layer, which may be a light to heat conversion release coating (LTHC), or the like. In some embodiments, a die attach film (DAF) may also be disposed on the carrier 105, or on the adhesive layer (if any) for attaching the integrated circuit set 110 on the carrier 105. In some embodiments, the carrier 105 may be a carrier that is the same or at least similar to the carrier 108, which includes a glass carrier, a ceramic carrier, or the like.

In some embodiments, the integrated circuit set 110 includes a plurality of integrated circuits (four integrated circuits are illustrated, but not limited thereto) stacked on top of one another, an active surface having a plurality of I/O ports (contact pads) 116 facing away from the carrier 105 and a back surface opposite to the active surface. In some embodiments, the integrated circuits are connected to one another using through silicon via (TSV) technology. That is to say, at least one of the integrated circuits includes a plurality of sub through vias (TSVs) 118 extending through the at least one of the integrated circuits for electrically connected to adjacent one of the integrated circuits. In some embodiments, the I/O ports 116 are electrically connected to the sub through vias 118.

In accordance with some embodiments of the disclosure, an encapsulating material 120a is provided on the carrier 105 to encapsulate the integrated circuit set 110. In some embodiments, the encapsulating material 120a may include a molding compound, an epoxy, a resin, or the like. In one of the implementations, the molding compound includes various materials, for example, one or more of epoxy resins, phenolic hardeners, silicas, catalysts, pigments, mold release agents, etc. In some embodiments, the encapsulating material 120a may cover the top surfaces of the I/O ports 116. Then, a thinning process, which may be a grinding process, is performed to thin the encapsulating material 120a until the top surfaces of the I/O ports 116 are revealed. The resulting structure is shown in FIG. 10F. Due to the thinning process, the top surfaces of the I/O ports 116 are substantially level with the top surface of the encapsulating material 120a. The resultant structure including the integrated circuit set 110 and the encapsulating material 120a as shown in FIG. 10F may have a wafer form in the process. It is noted that the processes of forming the resultant structure shown in FIG. 10F may be performed before the processes of forming the integrated circuit packages 101 (with regard to FIG. 10A to FIG. 10E) are performed. That is to say, the order of forming the resultant structure shown in FIG. 10F and forming the integrated circuit package 101 is not limited in the present disclosure.

Figure 10G:
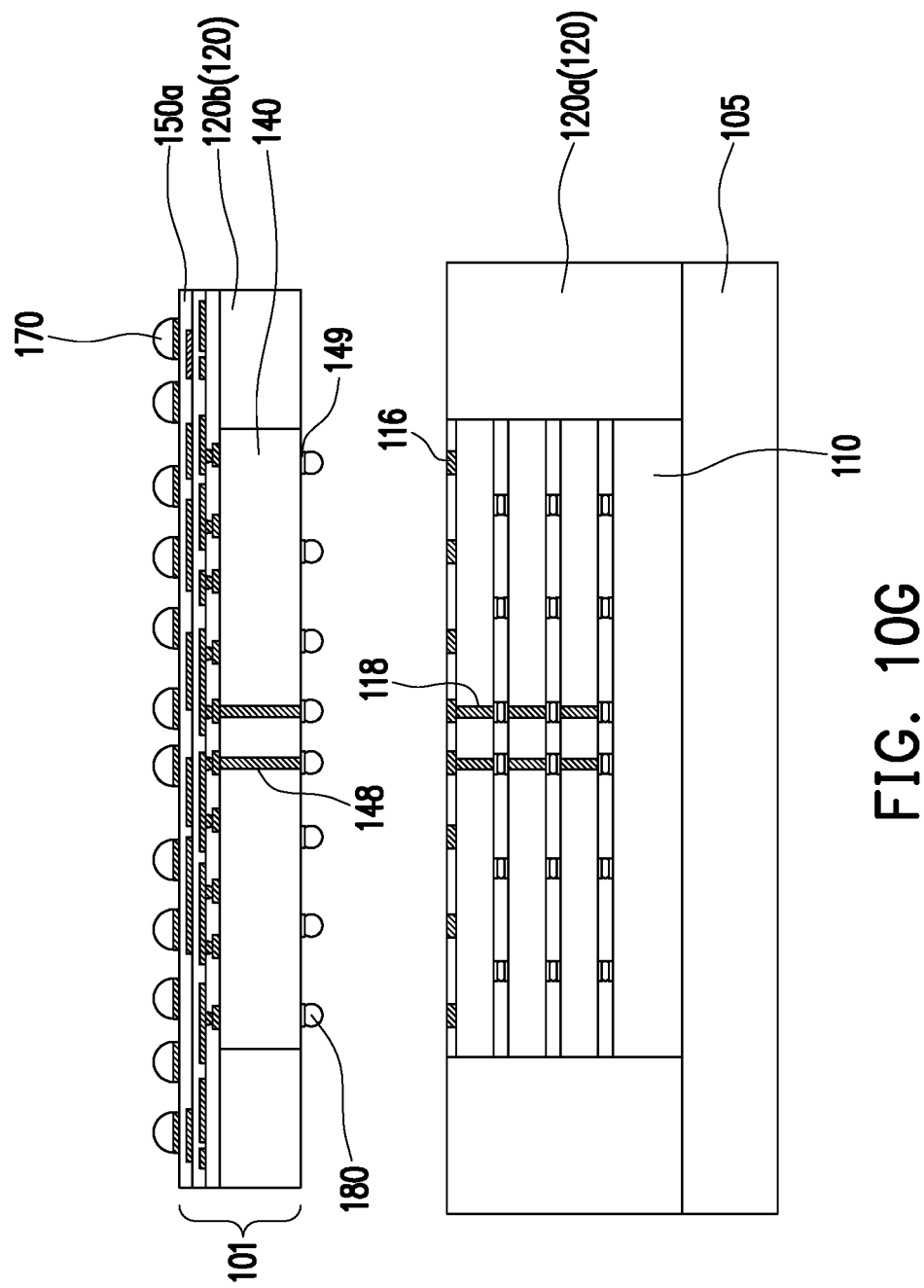

With now reference to FIG. 10G, in some embodiments, the integrated circuit package 101 is mounted on the integrated circuit set 110 and the encapsulating material 120a through a plurality of conductive bumps 180. In accordance with some embodiments of the disclosure, the conductive bumps 180 may be disposed on the redistribution layer 149 of the integrated circuit 140 for mounting the integrated circuit 140 onto the integrated circuit set 110. Namely, the integrated circuit 140 is mounted on the active surface of the integrated circuit set 110 with its back surface (i.e. back to face configuration). In detail, the conductive bumps 180 are disposed between the integrated circuit 140 and the integrated circuit set 110 and electrically connecting the through vias 148 (and/or the redistribution layer 149) and the I/O ports 116 of the integrated circuit set 110. In some embodiments, a redistribution structure (e.g., the redistribution structure 130 shown in FIG. 2D) may be disposed between the integrated circuit set 110 and the conductive bumps 180 and is extended over the active surface 112 of the integrated circuit set 110 and the encapsulating material 120a.

Figure 10H:
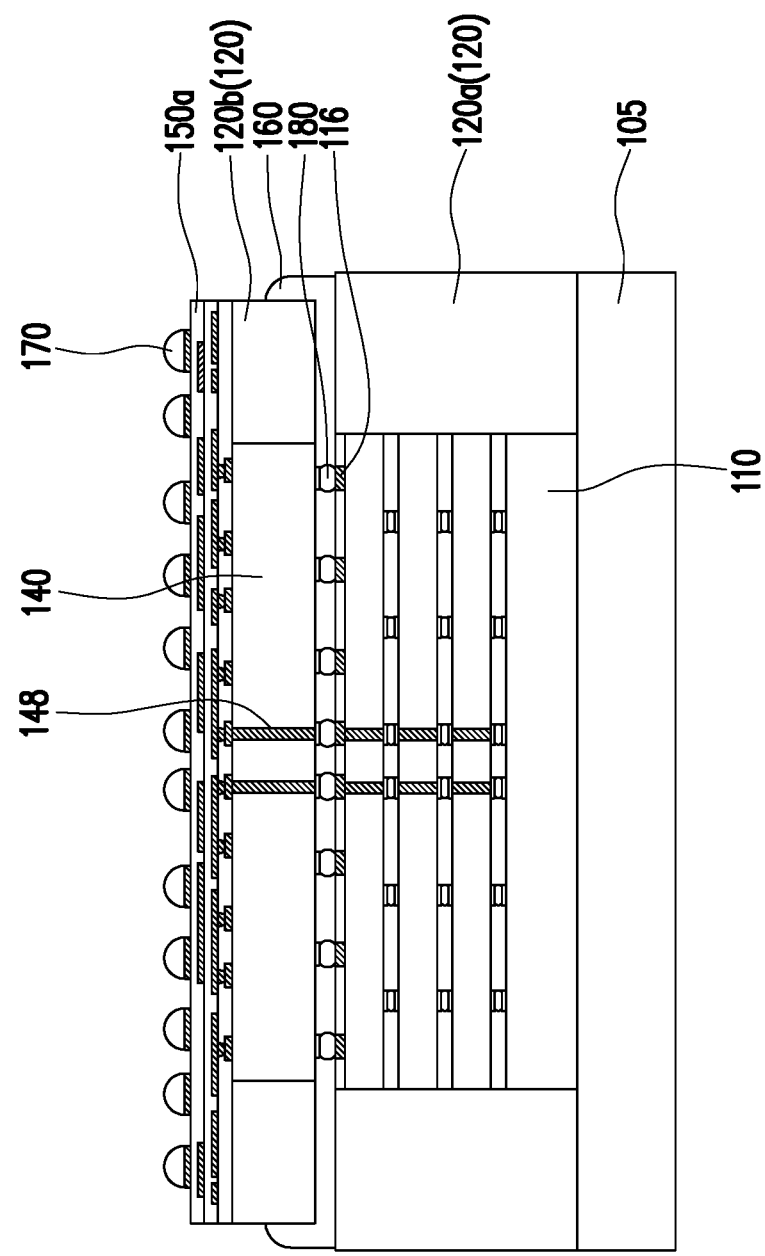

With now reference to FIG. 10H, in accordance with some embodiments of the disclosure, a filling material 160 may be applied to fill the gap between the integrated circuit 140 and the integrated circuit set 110. In some embodiments, the filling material 160 may be an underfill, a non-conductive film (NCF), or the like. The filling material 160 is configured to absorb some of the residual stresses, to reduce the stress within the conductive bumps 180, and in the interfaces between the conductive bumps 180 and integrated circuit 140.

Figure 10I:
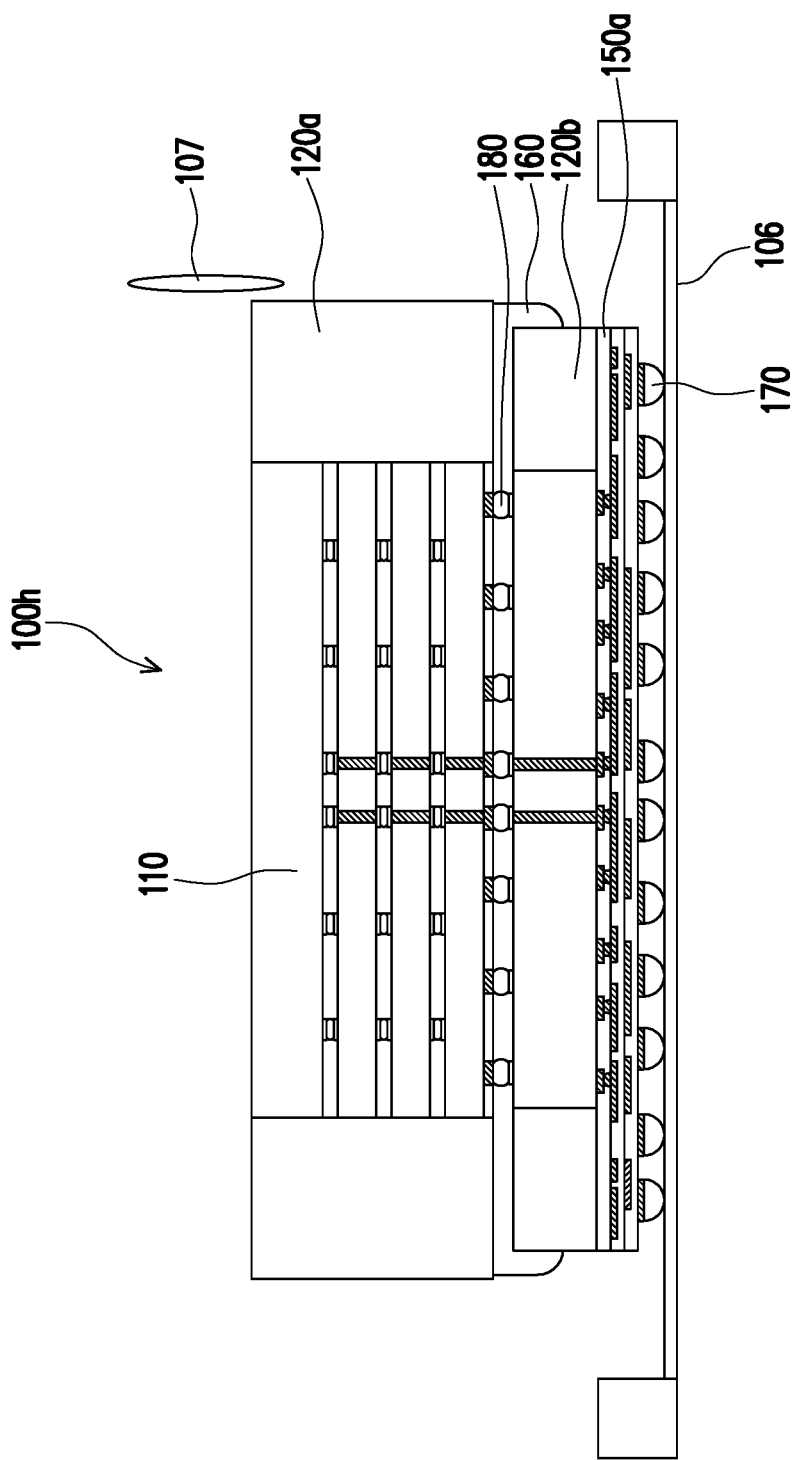

With now reference to FIG. 10H and FIG. 10I, in some embodiments, the resultant structure shown in FIG. 10H may be flipped over and mounted on a tape carrier 106, and the carrier 105 may be removed. In some embodiments, the tape carrier 106 may be the same or at least similar to the tape carrier 106 shown in FIG. 10E. Then, in some embodiments, the carrier 105 is detached from the back surface of the integrated circuit set 110 and the encapsulating material 120a by causing the adhesive layer (e.g., a LTHC) thereon to lose or reduce adhesion. The adhesive layer is then removed along with the carrier 105. Then, in some embodiments, a singulation process is performed on the encapsulating material 120a to form a plurality of semiconductor packages 100h. During the singulation (dicing) process, a wet sawing operation may be performed by a saw 107 to cut the semiconductor packages 100h in a wafer form along the scribe lines. Then, the separated semiconductor packages 100h may be removed or de-bonded from the tape carrier 106. At the time, the manufacturing process of the semiconductor package 100h may be substantially done.

FIG. 11 to FIG. 16 illustrate partial cross sectional views of a semiconductor packages according to different exemplary embodiments of the present disclosure. It is noted that the integrated circuit sets 110a~110e shown in FIG. 11 to FIG. 16 contain many features same as or similar to the integrated circuit set 110 of the semiconductor package 100h disclosed earlier with FIG. 10. For purpose of clarity and simplicity, detail description of same or similar features may be omitted, and the same or similar reference numbers denote the same or like components. The main differences between the integrated circuit sets 110a~110e shown in FIG. 11 to FIG. 16 and the integrated circuit set 110 of the semiconductor package 100h shown in FIG. 10I are described as follows.

Figure 11:
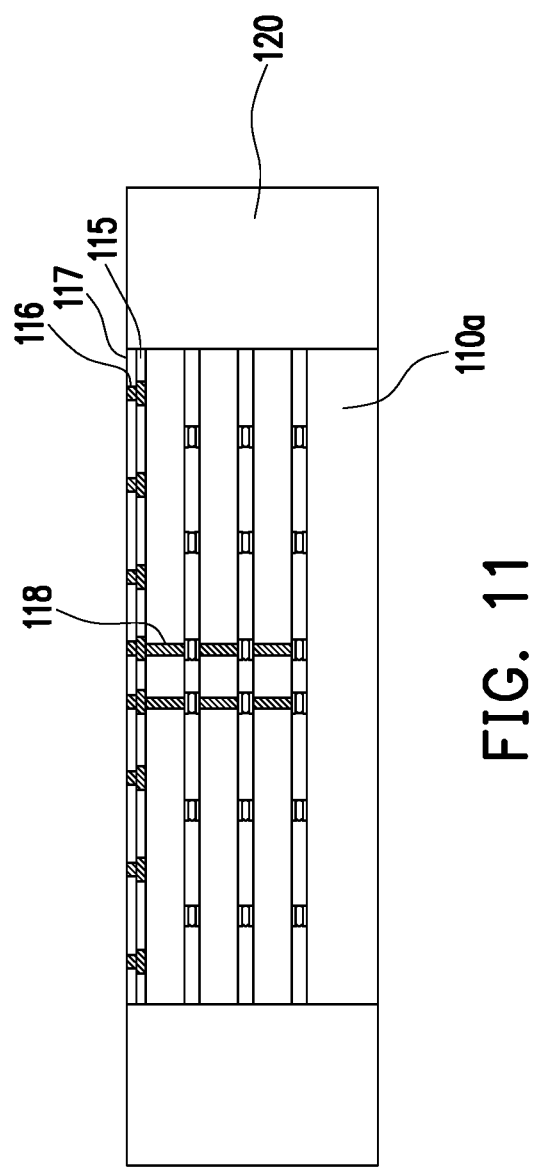
FIG. 11 illustrates a partial cross sectional view of a semiconductor package according to some exemplary embodiments of the present disclosure.

With now reference to FIG. 11, in some embodiments, the integrated circuit set 110a may further include a metalization layer (i.e. back end of line, BEOL) 115 for interconnected with the I/O ports 116 on the integrated circuit set 110a. In some embodiments, the I/O ports 116, which may be a plurality of conductive vias, are disposed on the metalization layer 115, and a dielectric layer (passivation layer) 117 may cover the metalization layer 115 and reveal the top surfaces of the I/O ports 116. In some embodiments, the dielectric layer 117 may be formed on the metalization layer 115 of the integrated circuit set 110a, and may cover the top surfaces of the I/O ports (conductive vias) 116. In other embodiments, the top surface of the dielectric layer 117 may be substantially level with the top surfaces of the I/O ports 116. Then, a thinning process, which may be a grinding process, is performed to thin the encapsulating material 120 and the dielectric layer 117 until the top surfaces of the I/O ports 116 are revealed. The resulting structure is shown in FIG. 11 and may have a wafer form in the process. Accordingly, the integrated circuit (e.g., the integrated circuit 140 shown in FIG. 10G) may be mounted on the I/O ports 116 of the integrated circuit set 110d through the conductive bumps (e.g., the conductive bumps 180 shown in FIG. 10G).

Figure 12:
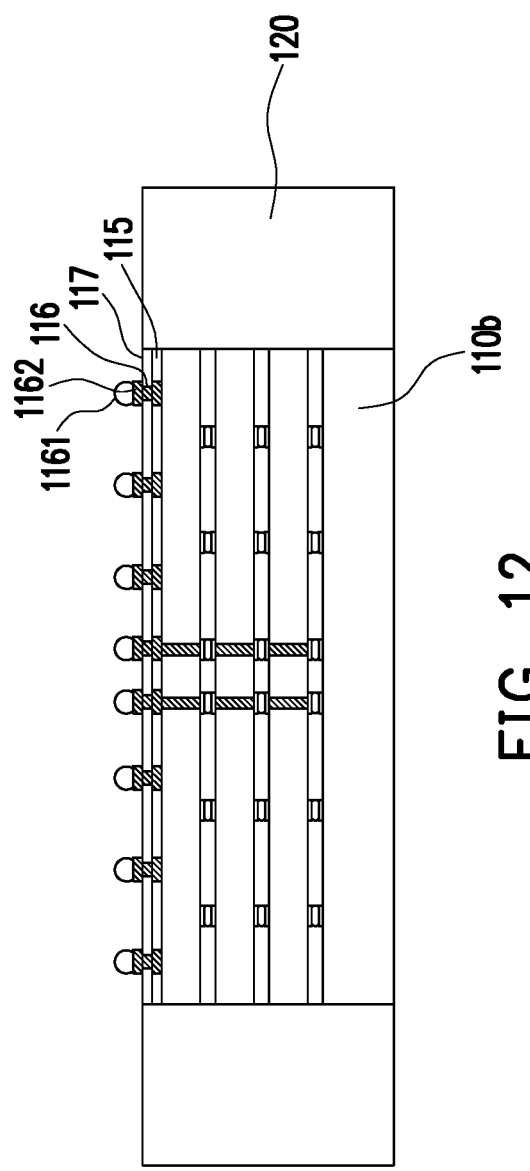
FIG. 12 illustrates a partial cross sectional view of a semiconductor package according to some exemplary embodiments of the present disclosure.

With now reference to FIG. 12, in some embodiments, similarly, the integrated circuit set 110b may include the metalization layer 115 for interconnected with the I/O ports (conductive vias) 116 on the integrated circuit set 110b and the dielectric layer 117 covers the metalization layer 115. In some embodiments, the I/O ports 116 are disposed on the metalization layer 115, and the dielectric layer 117 reveals the top surfaces of the I/O ports 116. In accordance with some embodiments of the disclosure, the integrated circuit set 110b may further include an under bump metallurgy (UBM) layer 1162 disposed on and electrically connected to the I/O ports 116. In some embodiments, a plurality of solder bumps 1161 may be mounted on the UBM layer 1162. In some embodiments, the solder bumps 1161 may be a plurality of micro bumps, which may be bonded with the conductive (micro) bumps 180 on the integrated circuit 140 during a reflow process. In some embodiments, the solder (micro) bumps 1161 may replace the conductive (micro) bumps 180 on the integrated circuit 140, which means the integrated circuit 140 may be mounted on the integrated circuits 110b through the solder (micro) bumps 1161.

Figure 13:
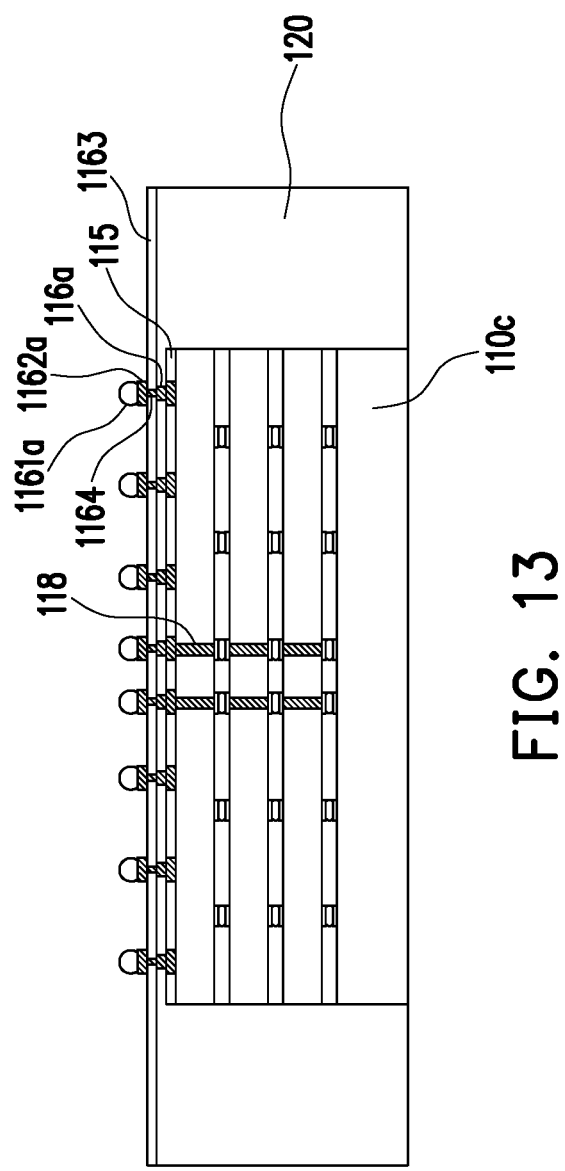
FIG. 13 illustrates a partial cross sectional view of a semiconductor package according to some exemplary embodiments of the present disclosure.

With now reference to FIG. 13, in some embodiments, similarly, the integrated circuit set 110c may include the metalization layer 115 for interconnected with the I/O ports (conductive vias) 116a on the integrated circuit set 110c. In the present embodiment, the dielectric layer 117 shown in FIG. 12 is omitted, and the I/O ports 116a protrude from the active surface (e.g., the metalization layer 115) of the integrated circuit 110c. In accordance with some embodiments of the disclosure, the encapsulating material 120 may cover the active surface (e.g., the metalization layer 115) of the integrated circuit 110c and reveal the top surfaces of the I/O ports 116a. In some embodiments, the encapsulating material 120 may firstly cover the top surfaces of the I/O ports 116a. Then, a thinning process, which may be a grinding process, is performed to thin the encapsulating material 120 until the top surfaces of the I/O ports 116a are revealed. Due to the thinning process, the top surfaces of the I/O ports 116a are substantially level with the top surface of the encapsulating material 120 as shown in FIG. 13.

Then, in accordance with some embodiments of the disclosure, a redistribution layer 1163 may be provided over the encapsulating material 120 for electrically connected to the I/O ports 116a. In some embodiments, the redistribution layer 1163 may be formed by, for example, depositing conductive layer, patterning the conductive layers to form redistribution circuit 1164, partially covering the redistribution circuit 1164 and filling the gaps between the redistribution circuit with a dielectric layer, etc. In some embodiments, the redistribution layer 1163 may further include a UBM layer 1162a disposed on and electrically connected to the I/O ports 116 through the redistribution circuit 1164. In some embodiments, the UBM layer 1162a may be bonded with the conductive (micro) bumps 180 on the integrated circuit 140 during a reflow process. In some embodiments, a plurality of solder (micro) bumps 1161a may be optionally mounted on the UBM layer 1162a, and then the solder bumps 1161a may be bonded with the conductive (micro) bumps 180 on the integrated circuit 140 during the reflow process.

Figure 14:
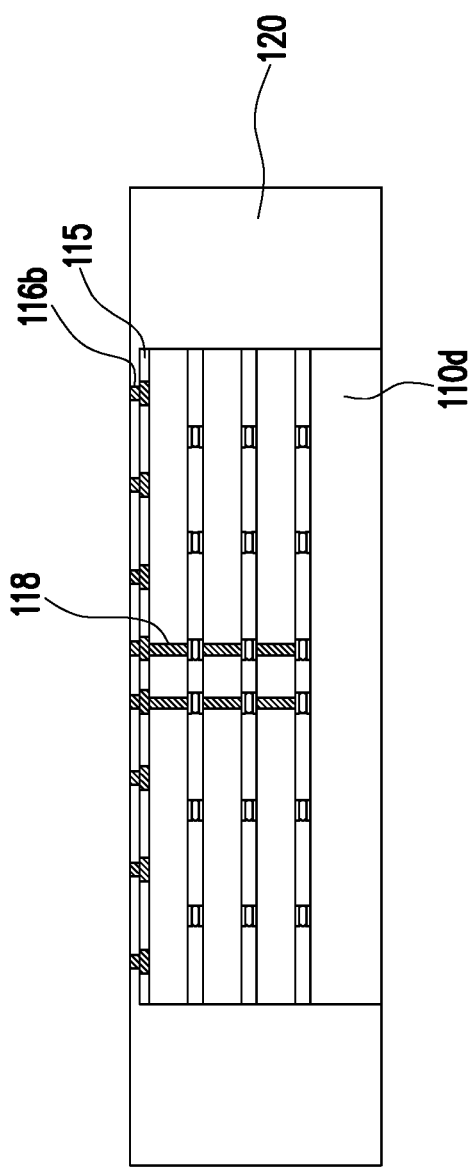
FIG. 14 illustrates a partial cross sectional view of a semiconductor package according to some exemplary embodiments of the present disclosure.

With now reference to FIG. 14, in some embodiments, the integrated circuit set 110d may include the metalization layer 115 for interconnected with the I/O ports 116b, which may be a plurality of conductive bumps in the embodiment, on the integrated circuit set 110d. In the present embodiment, the dielectric layer 117 shown in FIG. 12 is omitted, and the I/O ports (conductive bumps) 116b protrude from the active surface (e.g., the metalization layer 115) of the integrated circuit 110d. In accordance with some embodiments of the disclosure, the encapsulating material 120 may cover the active surface (e.g., the metalization layer 115) of the integrated circuit 110d and reveal the top surfaces of the I/O ports 116b. In some embodiments, the encapsulating material 120 may firstly cover the top surfaces of the I/O ports 116b. Then, a thinning process, which may be a grinding process, is performed to thin the encapsulating material 120 until the top surfaces of the I/O ports 116b are revealed. Due to the thinning process, the top surfaces of the I/O ports 116b are substantially level with the top surface of the encapsulating material 120 as shown in FIG. 14. Accordingly, the integrated circuit (e.g., the integrated circuit 140 shown in FIG. 10G) may be mounted on the I/O ports 116b of the integrated circuit set 110d through the conductive bumps (e.g., the conductive bumps 180 shown in FIG. 10G).

Figure 15:
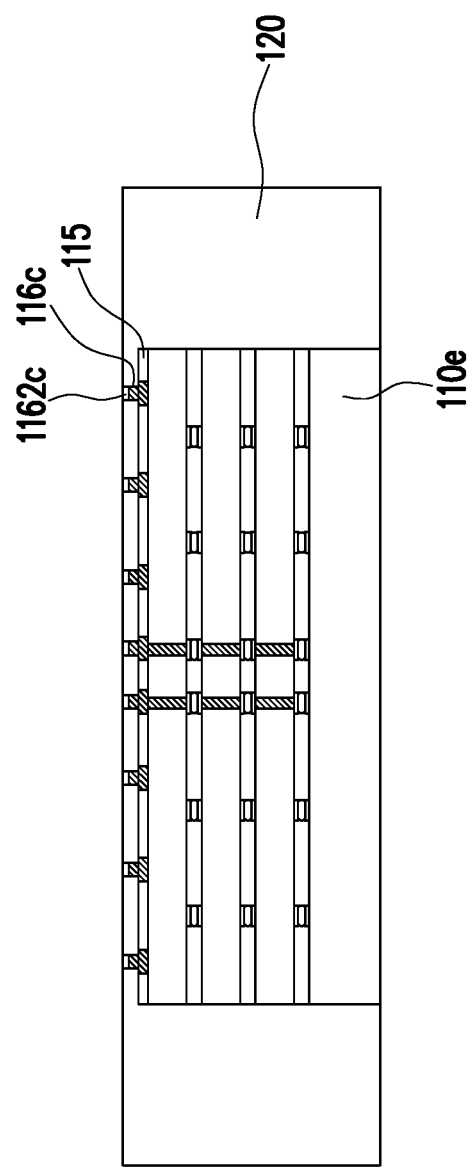
FIG. 15 illustrates a partial cross sectional view of a semiconductor package according to some exemplary embodiments of the present disclosure.

With now reference to FIG. 15, in some embodiments, the integrated circuit set 110e may include the metalization layer 115 for interconnected with the I/O ports 116c, which may be a plurality of conductive pillars in the embodiment, on the integrated circuit set 110e. In the present embodiment, the dielectric layer 117 shown in FIG. 12 is omitted, and the I/O ports (conductive pillars) 116c protrude from the active surface (e.g., the metalization layer 115) of the integrated circuit 110e. Then, a plurality of solder cap 1162c may be disposed on the I/O ports (conductive pillars) 116c respectively. In accordance with some embodiments of the disclosure, the encapsulating material 120 may cover the active surface (e.g., the metalization layer 115) of the integrated circuit 110e and reveal the top surfaces of the solder cap 1162c. In some embodiments, the encapsulating material 120 may firstly cover the top surfaces of the solder cap 1162c. Then, a thinning process, which may be a grinding process, is performed to thin the encapsulating material 120 until the top surfaces of the solder cap 1162c are revealed. Due to the thinning process, the top surfaces of the solder cap 1162c are substantially level with the top surface of the encapsulating material 120 as shown in FIG. 15. Accordingly, the solder cap 1162c may be bonded with the conductive (micro) bumps 180 on the integrated circuit (e.g., the integrated circuit 140 shown in FIG. 10G) during the reflow process. It should be well understood that the embodiments illustrated herein are merely for illustration and are not limited thereto. The disclosure does not limit the configuration and way of bonding the integrated circuit set 110 and the integrated circuit 140.

Figure 16:
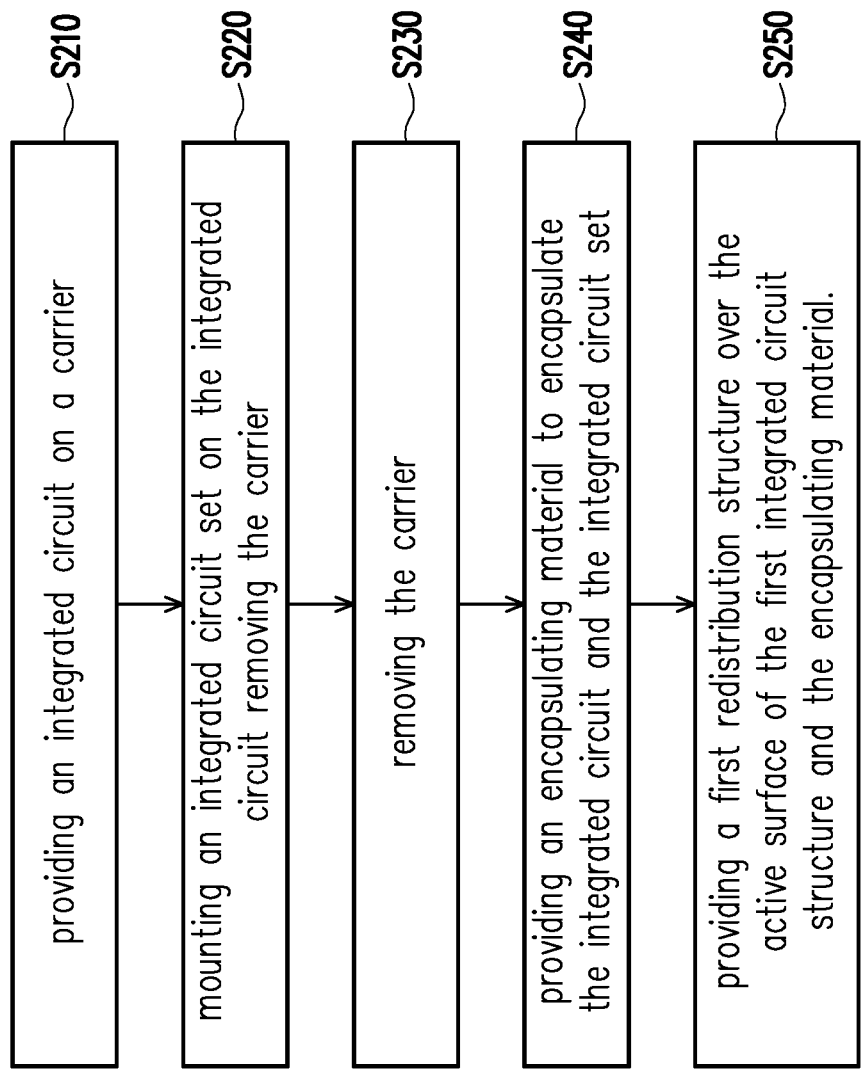
FIG. 16 illustrates a block diagram of a manufacturing method of a semiconductor package according to some exemplary embodiments of the present disclosure.

FIG. 16 illustrates a block diagram of a manufacturing method of a semiconductor package according to some exemplary embodiments of the present disclosure. FIG. 17A to FIG. 17H illustrate cross sectional views of intermediate stages in a manufacturing of a semiconductor package according to some exemplary embodiments of the present disclosure. It is noted that the manufacturing of the semiconductor package 100i shown in FIG. 16 and FIG. 17 contain many features same as or similar to the manufacturing of the semiconductor package 100 disclosed earlier with FIG. 1 and FIG. 2. For purpose of clarity and simplicity, detail description of same or similar features may be omitted, and the same or similar reference numbers denote the same or like components. The main differences between the manufacturing of the semiconductor package 100i shown in FIG. 16 and FIG. 17 and the manufacturing of the semiconductor package 100 shown in FIG. 1 and FIG. 2 are described as follows.

Figure 17A:
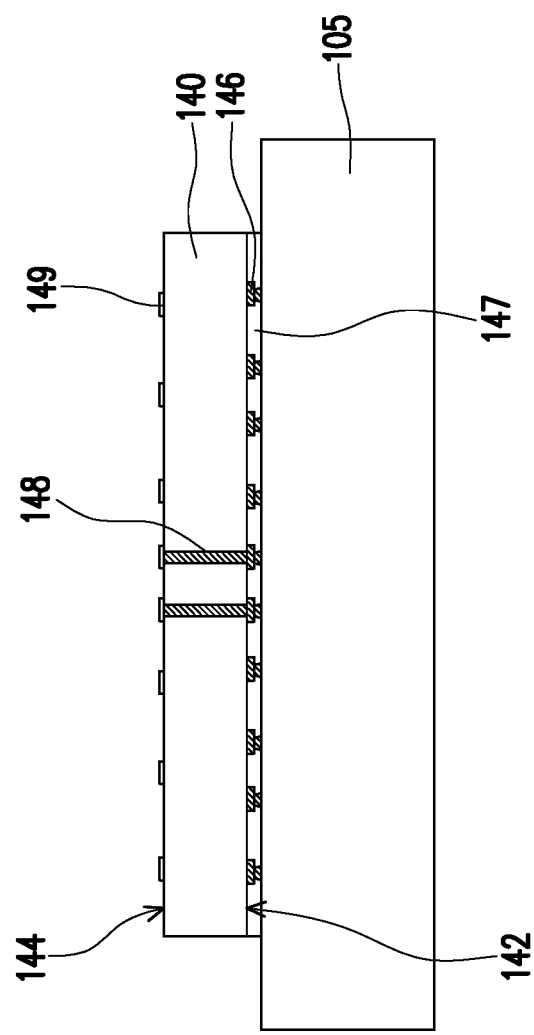
FIG. 17A to FIG. 17H illustrate cross sectional views of intermediate stages in a manufacturing of a semiconductor package according to some exemplary embodiments of the present disclosure.

In accordance with some embodiments of the disclosure, a manufacturing method of a semiconductor package includes the following steps. With reference to FIG. 16 and FIG. 17A, performing step S210, an integrated circuit 140 is provided on a carrier 105. In some embodiments, the carrier 105 may include an adhesive layer, which may be a light to heat conversion release coating (LTHC), or the like. In some embodiments, a die attach film (DAF) may also be disposed on the carrier 105, or on the adhesive layer (if any) for attaching the integrated circuit 140 on the carrier 105. In some embodiments, the carrier 105 may be a glass carrier, a ceramic carrier, or the like, and may provide temporary structural support during the formation of various components of a semiconductor package. In some embodiments, the integrated circuit 140 may be a logic die, which provides logic functions and may be a system on chip (SoC), an application processor (AP), or the like. In some embodiments, the integrated circuit 140 may be formed in a wafer (not shown) having multiple integrated circuits 140 and singulated along scribe lines. The integrated circuit 140 may include an active surface 142 having a plurality of contact pads 146 facing the carrier 105, a back surface 144 opposite to the active surface 142, and a plurality of through vias (TSVs) 148 extending through the integrated circuit 140 and connecting the active surface 142 and the back surface 144. In some embodiments, the integrated circuit 140 may further include a redistribution layer 149 having a plurality of solder pads disposed on the back surface 144 of the integrated circuit 140 and electrically connected to the through vias 148.

Figure 17B:
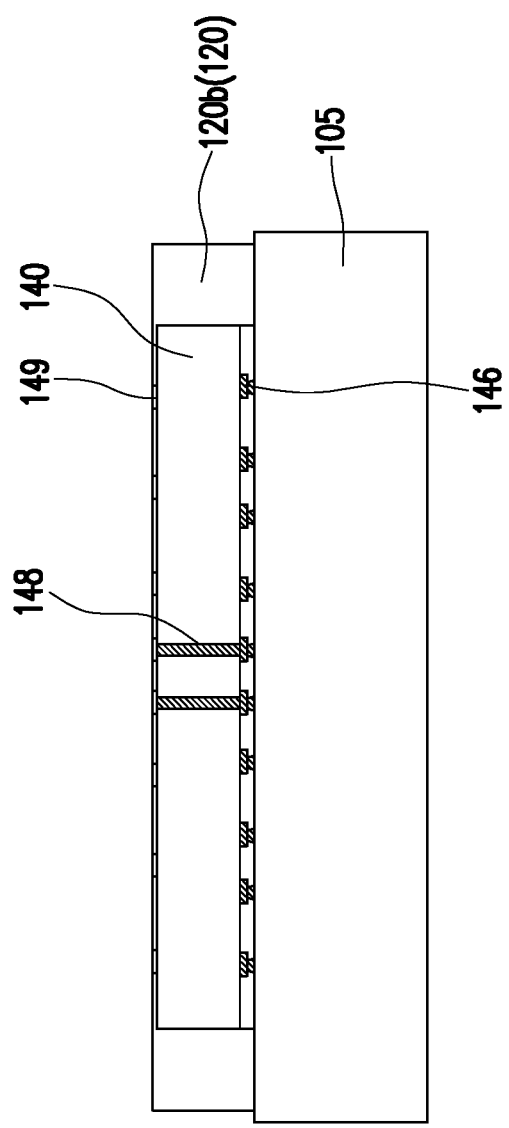

With now reference to FIG. 17B, in accordance with some embodiments of the disclosure, optionally, an (inner) encapsulating material (first inner encapsulating material) 120b is provided on the carrier 105 to encapsulate the integrated circuit 140. In some embodiments, the encapsulating material 120b may include a molding compound, an epoxy, a resin, or the like. In one of the implementations, the molding compound includes various materials, for example, one or more of epoxy resins, phenolic hardeners, silicas, catalysts, pigments, mold release agents, etc. In some embodiments, the encapsulating material 120b may cover the back surface (e.g., the redistribution layer 149) of integrated circuit 140. Then, a thinning process, which may be a grinding process, is performed to thin the encapsulating material 120b until the back surface (e.g., the redistribution layer 149) are revealed. The resulting structure is shown in FIG. 17B. Due to the thinning process, the back surface (e.g., the redistribution layer 149) of the integrated circuit 140 are substantially level with the top surface of the encapsulating material 120b. The resultant structure including the integrated circuit 140 and the encapsulating material 120b as shown in FIG. 17B may have a wafer form in the process.

Figure 17C:
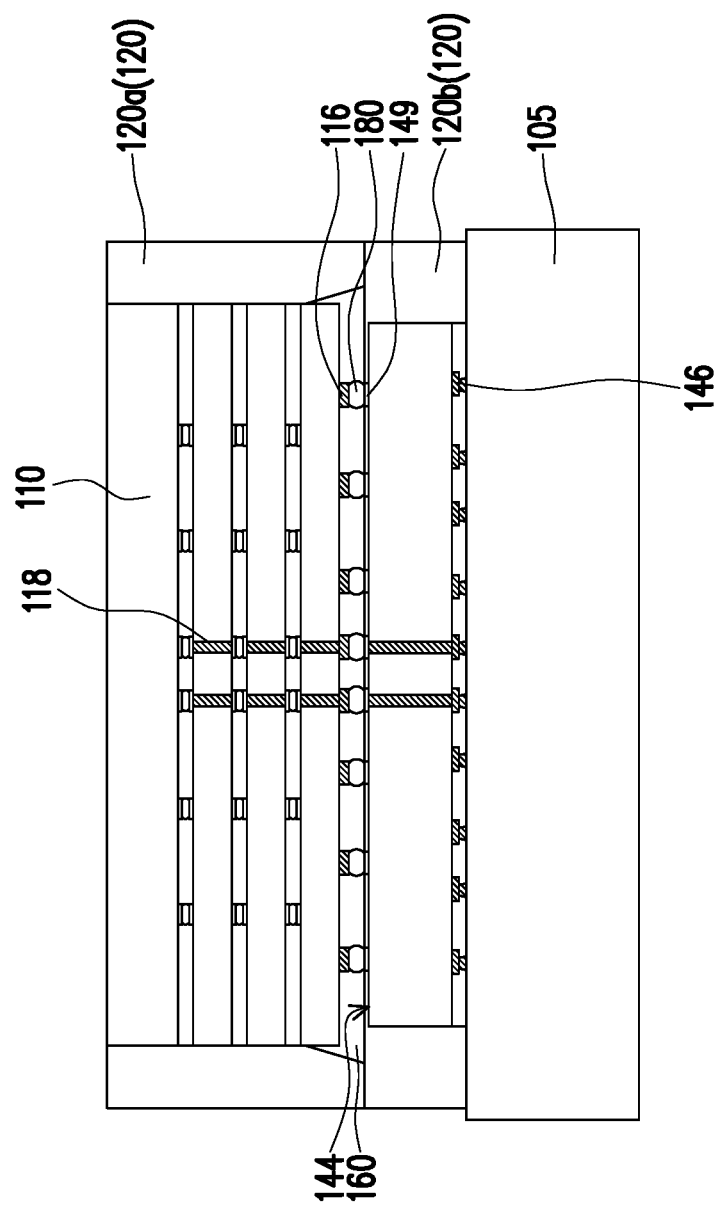

With now reference to FIG. 16 and FIG. 17C, performing step S220, an integrated circuit set 110 is mounted on the integrated circuit 140 through a plurality of conductive bumps 180. In some embodiments, the integrated circuit set 110 may be memory dies such as LPDDRx, WIO, WIO2, NAND flash, and the like. In other embodiments, the integrated circuit set 110 may be any type of integrated circuit sets, such as analog circuits, digital circuits, sensor dies, micro-electro-mechanical (MEMS) dies, networking dies, and the like. In some embodiments, the integrated circuit set 110 is shown as a vertical stack of a plurality of integrated circuits. Note that although four integrated circuits are illustrated herein, the integrated circuit set 110 may be configured with fewer or more chips depending on the amount of memory desired for a system.

In some embodiments, the integrated circuit set 110 includes a plurality of integrated circuits stacked on top of one another, an active surface having a plurality of I/O ports (contact pads) 116 facing the back surface 144 of the integrated circuit 140 and a back surface opposite to the active surface. In some embodiments, the integrated circuits are connected to one another using through silicon via (TSV) technology. That is to say, at least one of the integrated circuits includes a plurality of sub through vias (TSVs) 118 extending through the at least one of the integrated circuits for electrically connected to adjacent one of the integrated circuits. In some embodiments, the I/O ports 116 are electrically connected to the sub through vias 118.

In accordance with some embodiments of the disclosure, the conductive bumps 180 may be disposed on the I/O ports 116 of the integrated circuit set 110 for mounting the integrated circuit set 110 onto the integrated circuit 140. Namely, the integrated circuit set 110 is mounted on the back surface 144 of the integrated circuit 140 with its active surface having I/O ports 116. In some embodiments, the conductive bumps 180 are mounted on and electrically connected to the redistribution layer 149 of the integrated circuit 140. In some embodiments, the conductive bumps 180 may be micro bumps, which may include copper posts and may be called copper post (or pillar) bumps, but the disclosure is not limited thereto. In some embodiments a filling material 160 may be applied to fill the gap between the integrated circuit 140 and the integrated circuit set 110. In some embodiments, the filling material 160 may be an underfill, a non-conductive film (NCF), or the like. The filling material 160 is configured to absorb some of the residual stresses, to reduce the stress within the conductive bumps 180, and in the interfaces between the conductive bumps 180 and integrated circuit 140.

In accordance with some embodiments of the disclosure, optionally, an (inner) encapsulating material (second inner encapsulating material) 120a is provided on the carrier 105 to encapsulate the integrated circuit set 110. In some embodiments, the encapsulating material 120a may be the same or at least similar to the encapsulating material 120b, which includes a molding compound, an epoxy, a resin, or the like. In some embodiments, a top surface of the encapsulating material 120a may covers the back surface of the integrated circuit set 110. Then, a thinning process, which may be a grinding process, is performed to thin the encapsulating material 120a until the back surface of the integrated circuit set 110 are revealed. Due to the thinning process, the back surface of the integrated circuit set 110 are substantially level with the top surface of the encapsulating material 120a. The resultant structure shown in FIG. 17C may have a wafer form in the process.

Figure 17D:
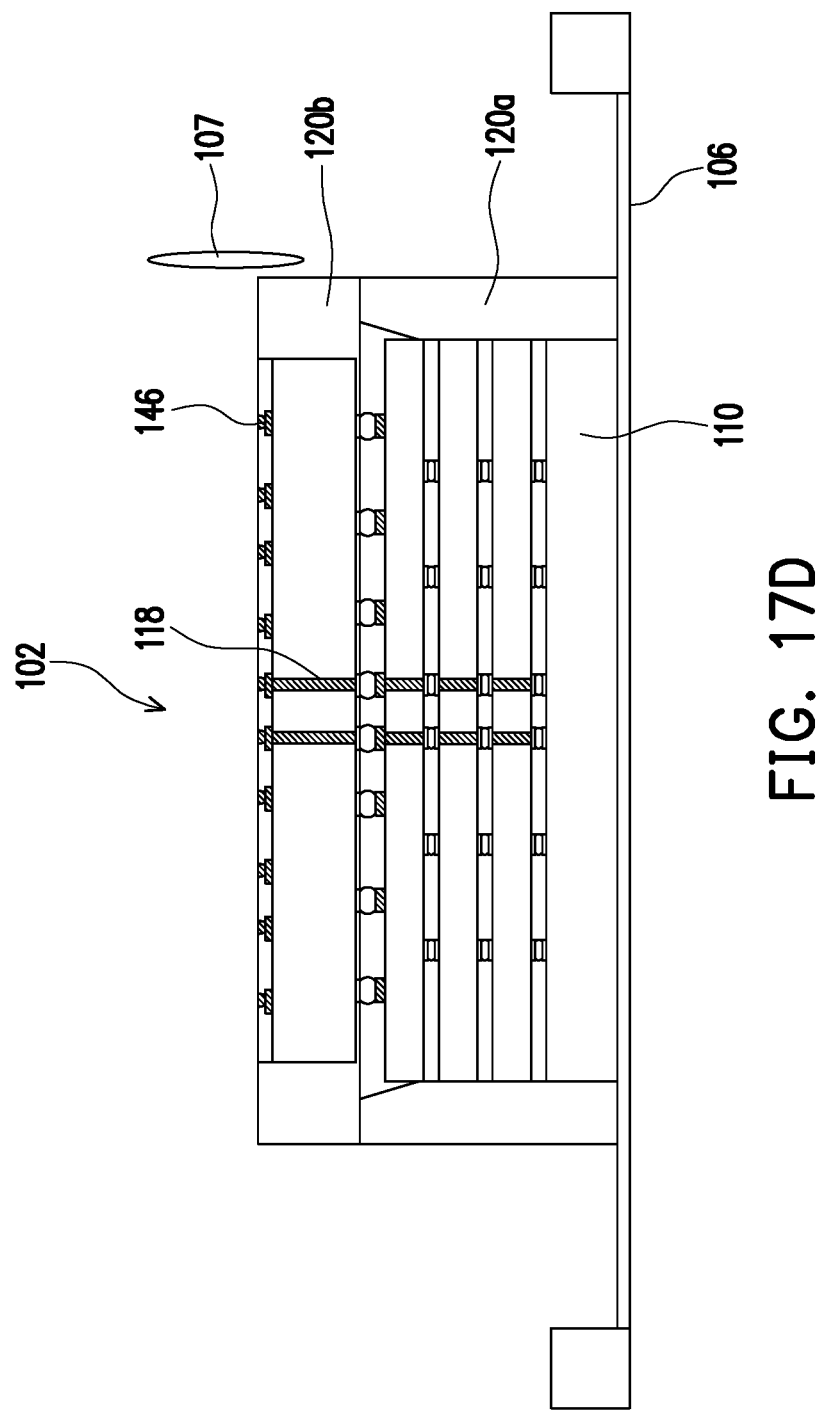

With now reference to FIG. 16 and FIG. 17D, in some embodiments, the resultant structure shown in FIG. 17C may be flipped over and mounted on a tape carrier 106, and, performing step S230, the carrier 105 may be removed. In some embodiments, the tape carrier 106 may be a dicing tape, which is typically used to secure the package structure and keep it stationary during a subsequent singulation of a semiconductor package from adjacent semiconductor packages. In some embodiments, the carrier 105 is detached from the active surface of the integrated circuit 140 and the encapsulating material 120b by causing the adhesive layer (e.g., a LTHC) thereon to lose or reduce adhesion. The adhesive layer is then removed along with the carrier 105.

In some embodiments, a (first) singulation process is then performed on the encapsulating material 120a and the encapsulating material 120b to form a plurality of encapsulated devices 102. During the singulation (dicing) process, a wet sawing operation may be performed by a saw 107 to cut the encapsulated devices 102 in a wafer form along the scribe lines. The singulation process may be performed through a cutting by a mechanical or laser saw 107 may be used to separate multiple encapsulated devices 102 from one another.

Figure 17E:
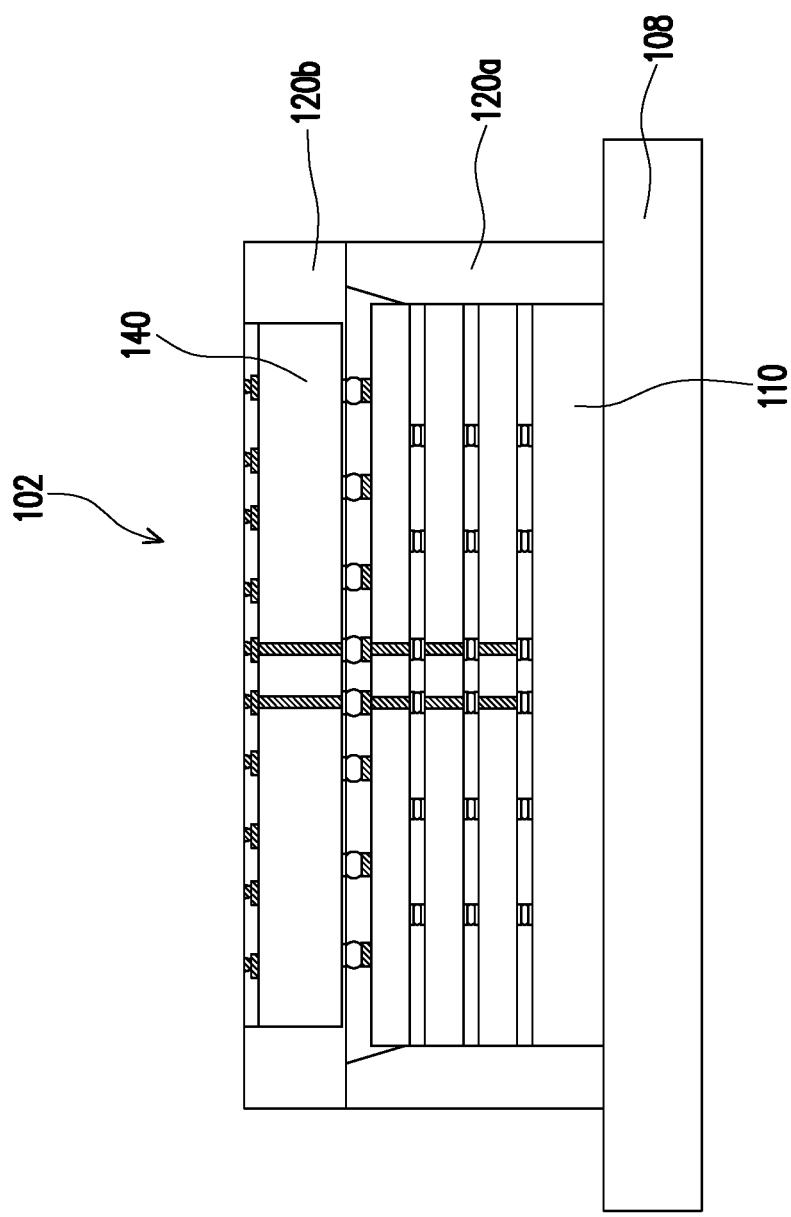

With now reference to FIG. 17E, the separated encapsulated devices 102 may then be removed or de-bonded from the tape carrier 106. Then, at least one of the encapsulated devices 102 are placed on a substrate carrier 108. In some embodiments, the substrate carrier 108 may be the same or at least similar to the carrier 105, which includes an adhesive layer, which may be a light to heat conversion release coating (LTHC), or the like. In some embodiments, a die attach film (DAF) may also be disposed on the substrate carrier 108, or on the adhesive layer (if any) for attaching the integrated circuit set 110 on the substrate carrier 108. In some embodiments, the substrate carrier 108 may be a glass carrier, a ceramic carrier, or the like.

Figure 17F:
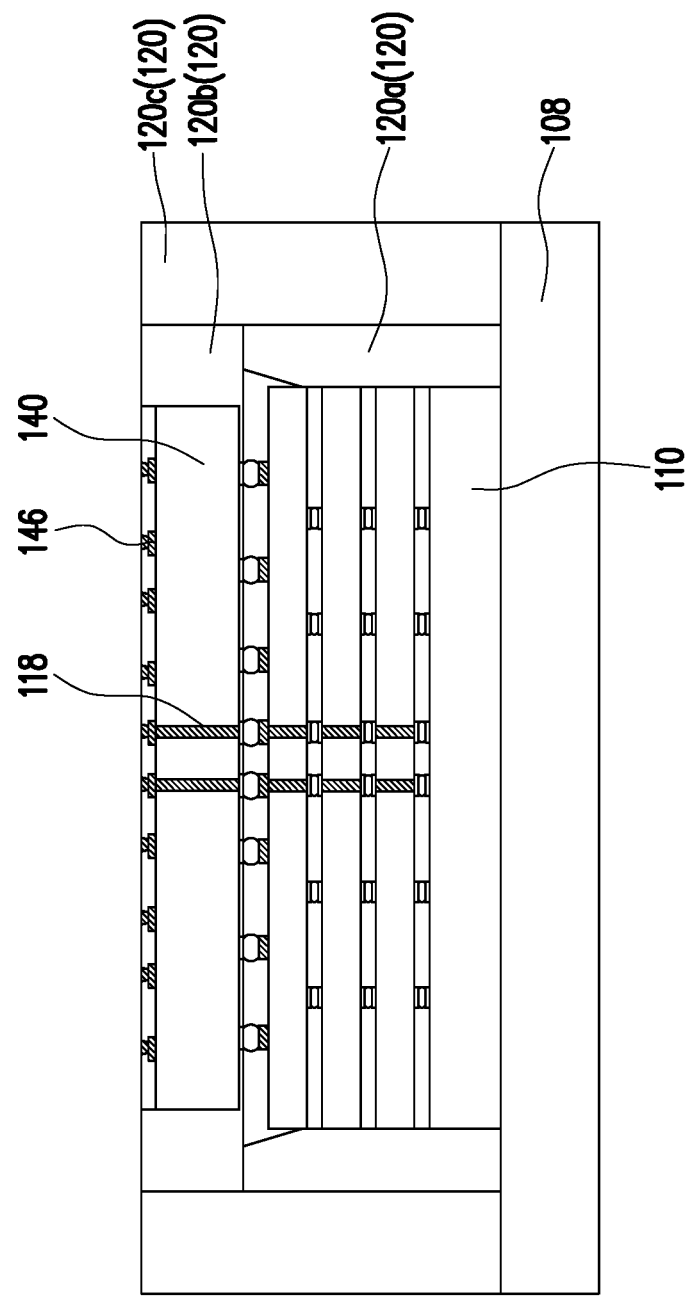

With now reference to FIG. 16 and FIG. 17F, performing step S240, an encapsulating material 120c is provided to encapsulate the integrated circuit 140 and the integrated circuit set 110. In the embodiments of the encapsulating material 120a and the encapsulating material 120b being provided to encapsulate the integrated circuit set 110 and the integrated circuit 140, the encapsulating material 120c is provided on the substrate carrier 108 to encapsulate the encapsulating material 120a, the encapsulating material 120b, the integrated circuit set 110 and the integrated circuit 140. In some embodiments, the encapsulating material 120c may be the same or at least similar to the encapsulating material 120a/120b, which includes a molding compound, an epoxy, a resin, or the like.

Figure 17G:
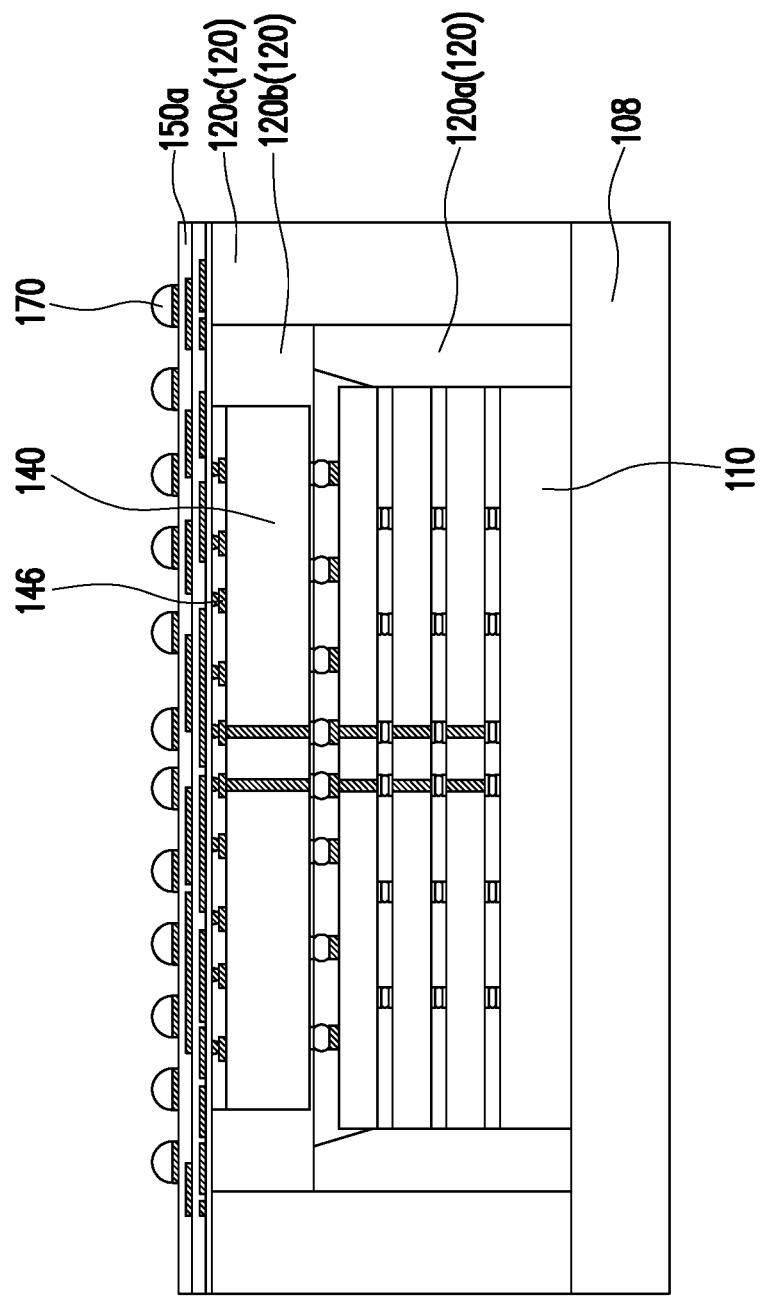

With now reference to FIG. 17G, performing step S250, a (first) redistribution structure 150a is provided over the active surface of the integrated circuit 140. In some embodiments, the redistribution structure 150a is provided over the integrated circuit 140, the encapsulating material 120c and the encapsulating material 120b (if any). In some embodiments, the redistribution structure 150a are formed over the integrated circuit 140, the encapsulating material 120c and the encapsulating material 120b to interconnect the contact pads 146 of the integrated circuit 140. The redistribution structure 150a may be formed by the same or similar process as the redistribution structure described in the previous embodiments, for example. In addition, a UBM layer may be formed on the redistribution structure 150a by sputtering, evaporation, or electroless plating, etc.

Then, in accordance with some embodiments of the disclosure, the electrical terminals 170 may be disposed on the redistribution structure 150a in accordance with some exemplary embodiments. In some embodiments, at least one IPD (not shown) may also be disposed on the redistribution structure 150a. The types and the formation of the electrical terminals 170 may be the same as or at least similar to the electrical terminals 170 described above. The IPD may be fabricated using standard wafer fabrication technologies such as thin film and photolithography processing, and may be mounted on the redistribution structure 150a through, for example, flip-chip bonding or wire bonding, etc.

Figure 17H:
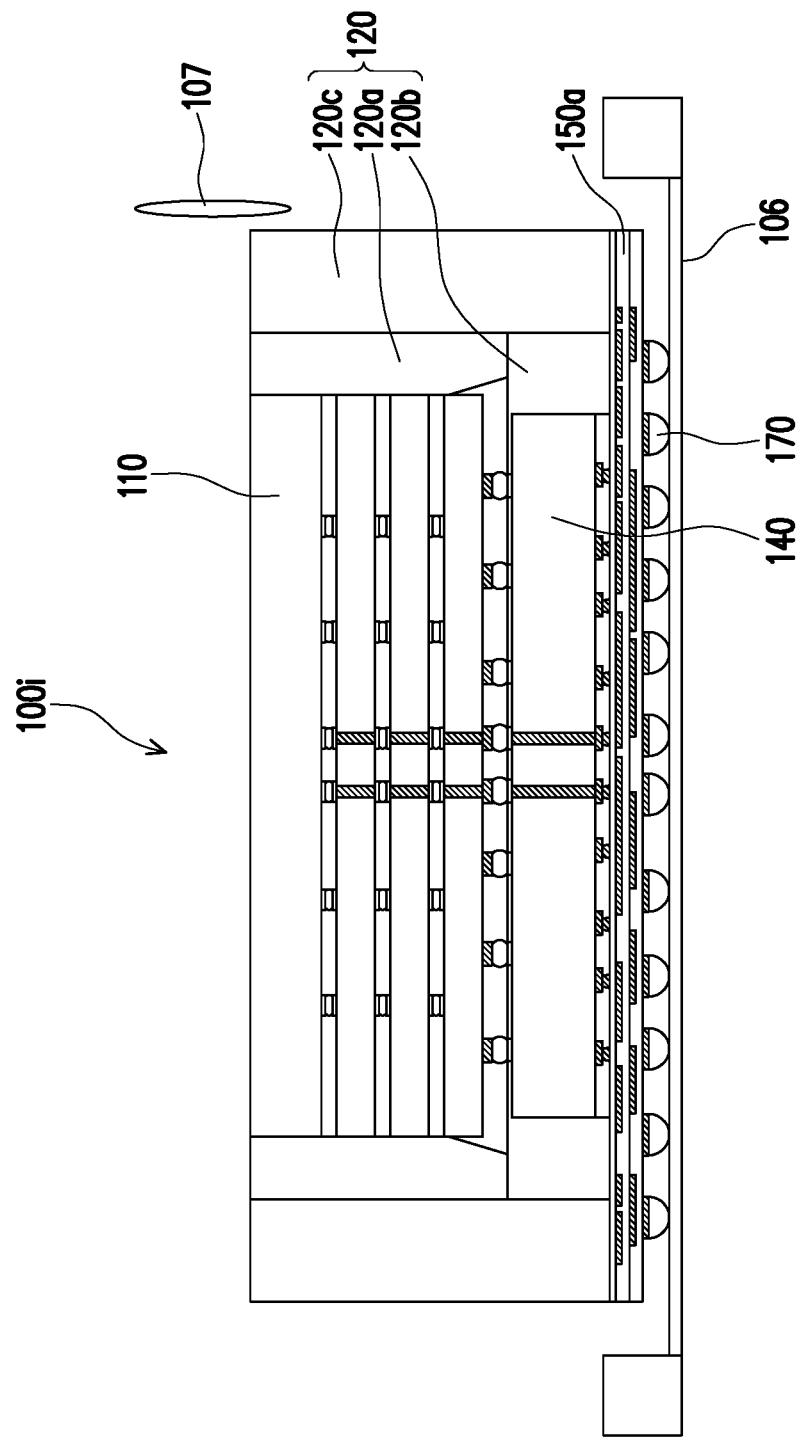

With now reference to FIG. 17H, in some embodiments, the resultant structure shown in FIG. 17G may be flipped over and mounted on a tape carrier 106, and the substrate carrier 108 may be removed. In some embodiments, the tape carrier 106 may be a dicing tape, which is typically used to secure the package structure and keep it stationary during a subsequent singulation process. In some embodiments, the substrate carrier 108 is detached from the back surface of the integrated circuit set 110, the encapsulating material 120c and the encapsulating material 120a (if any) by causing the adhesive layer (e.g., a LTHC) thereon to lose or reduce adhesion. The adhesive layer is then removed along with the substrate carrier 108.

Then, in some embodiments, a (second) singulation process is performed on the encapsulating material 120c and the redistribution structure 150a to form a plurality of semiconductor packages 100i. During the singulation (dicing) process, a wet sawing operation may be performed by a saw 107 to cut the semiconductor packages 100i in a wafer form along the scribe lines. Then, the separated semiconductor packages 100i may be removed or de-bonded from the tape carrier 106. At the time, the manufacturing process of the semiconductor package 100i may be substantially done.

With such configuration, by utilizing the integrated fan-out process, a substrate-less semiconductor package 100i can be achieved. Namely, the integrated circuit set 110 can be mounted on the integrated circuit 140 without a substrate, so as to reduce overall thickness and production cost of the semiconductor package 100i. In addition, by mounting the integrated circuit set 110 onto the integrated circuit 140 through the conductive (micro) bumps 180, the numbers of I/O can be significantly increased to meet the requirement of higher bandwidth memory device package with lower power consumption. Moreover, the micro-bump bonding process can be performed by mass reflow process, so as to improve the manufacturing efficiency of the semiconductor process.

Figure 18A:
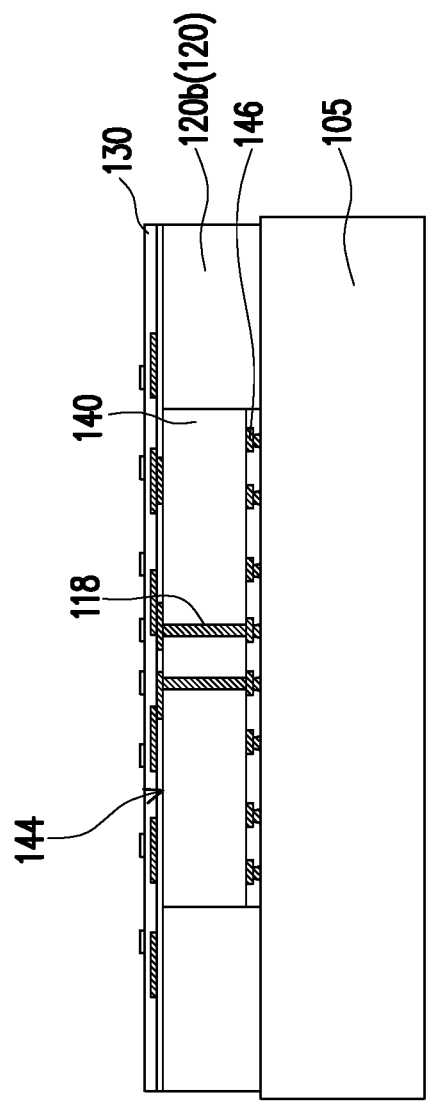
FIG. 18A to FIG. 18B illustrate cross sectional views of intermediate stages in a manufacturing of a semiconductor package according to some exemplary embodiments of the present disclosure.
Figure 18B:
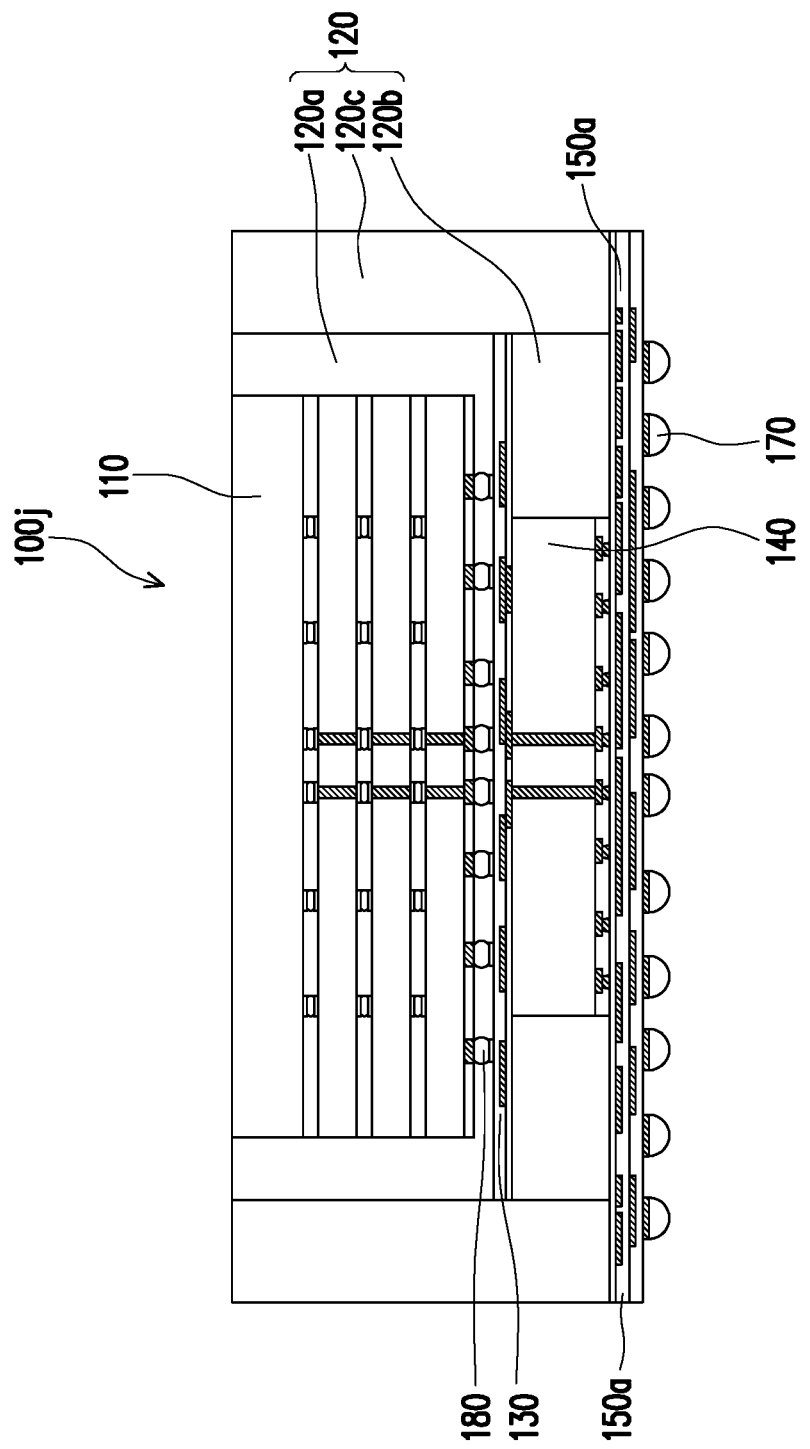

FIG. 18A to FIG. 18B illustrate cross sectional views of intermediate stages in a manufacturing of a semiconductor package according to some exemplary embodiments of the present disclosure. It is noted that the manufacturing of the semiconductor package 100j shown in FIG. 18 contain many features same as or similar to the manufacturing of the semiconductor package 100i disclosed earlier with FIG. 17. For purpose of clarity and simplicity, detail description of same or similar features may be omitted, and the same or similar reference numbers denote the same or like components. The main differences between the manufacturing of the semiconductor package 100j shown in FIG. 18 and the manufacturing of the semiconductor package 100i shown in FIG. 17 are described as follows.

With now reference to FIG. 18A, in some embodiments, before the integrated circuit set (e.g., the integrated circuit set 110 shown in FIG. 18B) is mounted on the integrated circuit 140, a (second) redistribution structure 130 is provided over the integrated circuit 140 and the encapsulating material 120b. In some embodiments, the redistribution structure 130 is provided over the back surface 144 of the integrated circuit 140 and the encapsulating material 120b. The redistribution structure 130 is electrically connected to the through vias 148 of the integrated circuit 140. In some embodiments, the redistribution structure 130 may be formed by, for example, depositing conductive layers, patterning the conductive layers to form redistribution circuits, partially covering the redistribution circuits and filling the gaps between the redistribution circuits with dielectric layers, etc. The redistribution circuits are formed in the dielectric layers and electrically connected to the integrated circuit 140. In addition, a UBM layer may be formed on the redistribution structure 130 by sputtering, evaporation, or electroless plating, etc. Then, same or similar processes illustrated and described with regard to FIG. 17C to FIG.

17H may be sequentially applied to the resultant structure shown in FIG. 18A to obtain the semiconductor package 100*j* illustrated in FIG. 18B.

Figure 19:
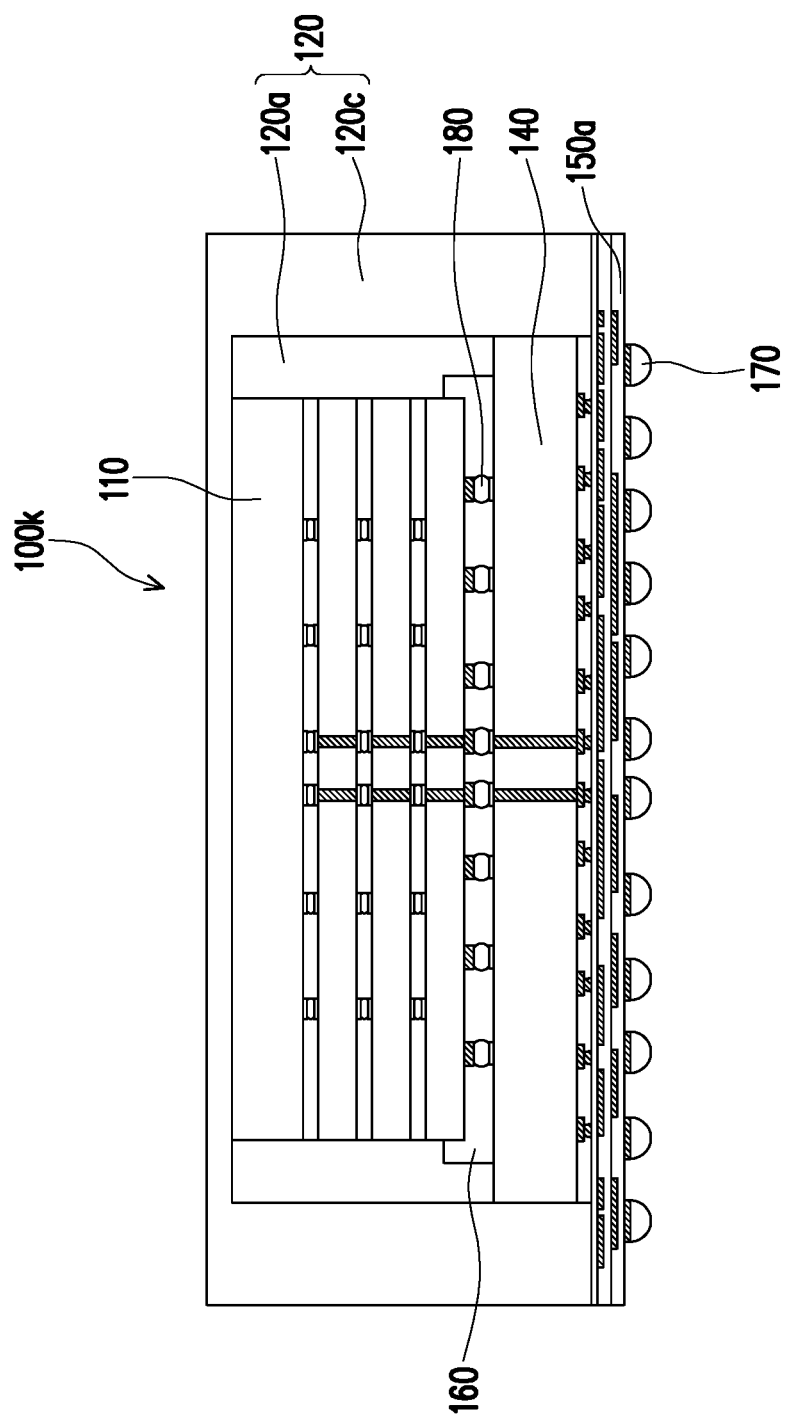
FIG. 19 illustrates a cross sectional view of a semiconductor package according to some exemplary embodiments of the present disclosure.

FIG. 19 illustrates a cross sectional view of a semiconductor package according to some exemplary embodiments of the present disclosure. It is noted that the semiconductor package 100*k* shown in FIG. 19 contain many features same as or similar to the semiconductor package 100*i* disclosed earlier with FIG. 17. For purpose of clarity and simplicity, detail description of same or similar features may be omitted, and the same or similar reference numbers denote the same or like components. The main differences between the semiconductor package 100*k* shown in FIG. 19 and the semiconductor package 100*i* shown in FIG. 17 are described as follows.

With reference to FIG. 19, in the embodiments of the size of the integrated circuit 140 being substantially greater than the size of the integrated circuit set 110, the encapsulating material (e.g., the encapsulating material 120*b* shown in FIG. 17H) for encapsulating the integrated circuit 140 may be omitted. Accordingly, during the (first) singulation process, a wet sawing operation may be performed on the encapsulating material 120*a* and along the side surface of integrated circuit 140 to form a plurality of encapsulated devices (including the integrated circuit set 110, the encapsulating material 120*a*, and the integrated circuit 140, etc.).

Then, same or similar processes illustrated and described with regard to FIG. 17E to FIG. 17H may be sequentially applied to the encapsulated device to obtain the semiconductor package 100*k* illustrated in FIG. 19. Accordingly, when it comes to the structure of the semiconductor package 100*k*, a side surface of the encapsulating material 120*a* may be aligned (coplanar) with the side surface of the integrated circuit 140, and the encapsulating material 120*c* encapsulates the integrated circuit set 110, the encapsulating material 120*a* and the integrated circuit 140. In addition, the redistribution structure 150*a* is extended over the integrated circuit 140 and the encapsulating material 120*c*.

In other embodiments, when the size of the integrated circuit 140 being substantially smaller than the size of the integrated circuit set 110, the encapsulating material (e.g., the encapsulating material 120*a* shown in FIG. 17H) for encapsulating the integrated circuit set 110 may be omitted. Accordingly, during the (first) singulation process, a wet sawing operation may be performed on the encapsulating material 120*b* and along the side surface of integrated circuit set 110 to form a plurality of encapsulated devices (including the integrated circuit set 110, the integrated circuit 140, and the encapsulating material 120*b*, etc.). With such arrangement, in the resultant semiconductor package, a side surface of the encapsulating material 120*b* may be aligned (coplanar) with the side surface of the integrated circuit set 110, and the encapsulating material 120*c* encapsulates the integrated circuit set 110, the integrated circuit 140, and the encapsulating material 120*b*. In addition, the redistribution structure 150*a* is extended over the integrated circuit 140, the encapsulating material 120*b*, and the encapsulating material 120*c*.

Figure 20:
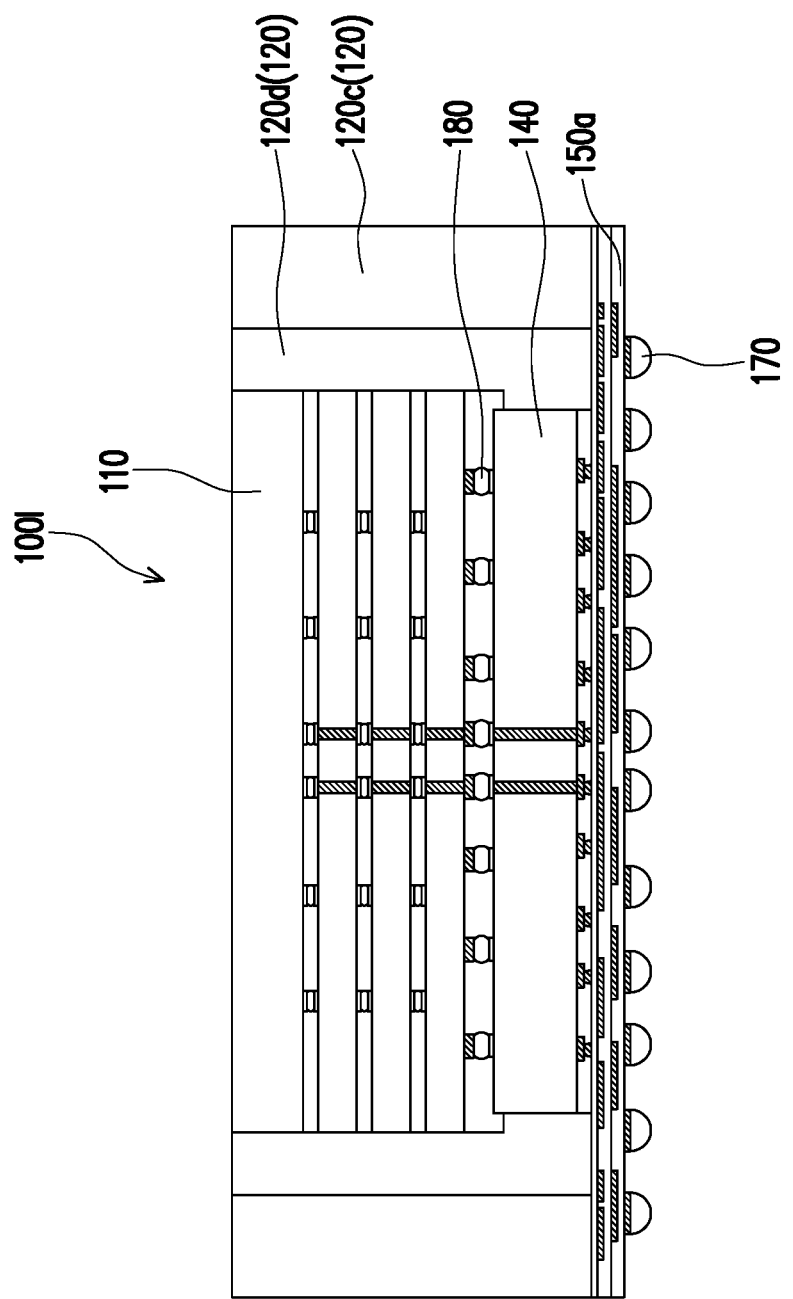
FIG. 20 illustrates a cross sectional view of a semiconductor package according to some exemplary embodiments of the present disclosure.

FIG. 20 illustrates a cross sectional view of a semiconductor package according to some exemplary embodiments of the present disclosure. It is noted that the semiconductor package 100*l* shown in FIG. 20 contain many features same as or similar to the semiconductor package 100*i* disclosed earlier with FIG. 17. For purpose of clarity and simplicity, detail description of same or similar features may be omitted, and the same or similar reference numbers denote the same or like components. The main differences between the semiconductor package 100*l* shown in FIG. 20 and the semiconductor package 100*i* shown in FIG. 17 are described as follows.

With reference to FIG. 20, in accordance with some embodiments of the disclosure, an (inner) encapsulating material 120*d* is provided to encapsulate both the integrated circuit set 110 and the integrated circuit 140. That is, the encapsulating material 120*a* and the encapsulating material 120*b* shown in FIG. 17H for encapsulating the integrated circuit set 110 and the integrated circuit 140 respectively are omitted herein. Accordingly, during the (first) singulation process, a wet sawing operation may be performed on the encapsulating material 120*d* to form a plurality of encapsulated devices (including the integrated circuit set 110, the integrated circuit 140, and the encapsulating material 120*d*, etc.).

Then, same or similar processes illustrated and described with regard to FIG. 17E to FIG. 17H may be sequentially applied to the encapsulated device to obtain the semiconductor package 100*l* illustrated in FIG. 20. Accordingly, when it comes to the structure of the semiconductor package 100*l*, the encapsulating material 120*d* encapsulates both the integrated circuit set 110 and the integrated circuit 140, and the encapsulating material 120*c* encapsulates the integrated circuit set 110, the integrated circuit 140, and the encapsulating material 120*d*. In addition, the redistribution structure 150*a* is extended over the integrated circuit 140, the encapsulating material 120*d*, and the encapsulating material 120*c*.

Figure 21:
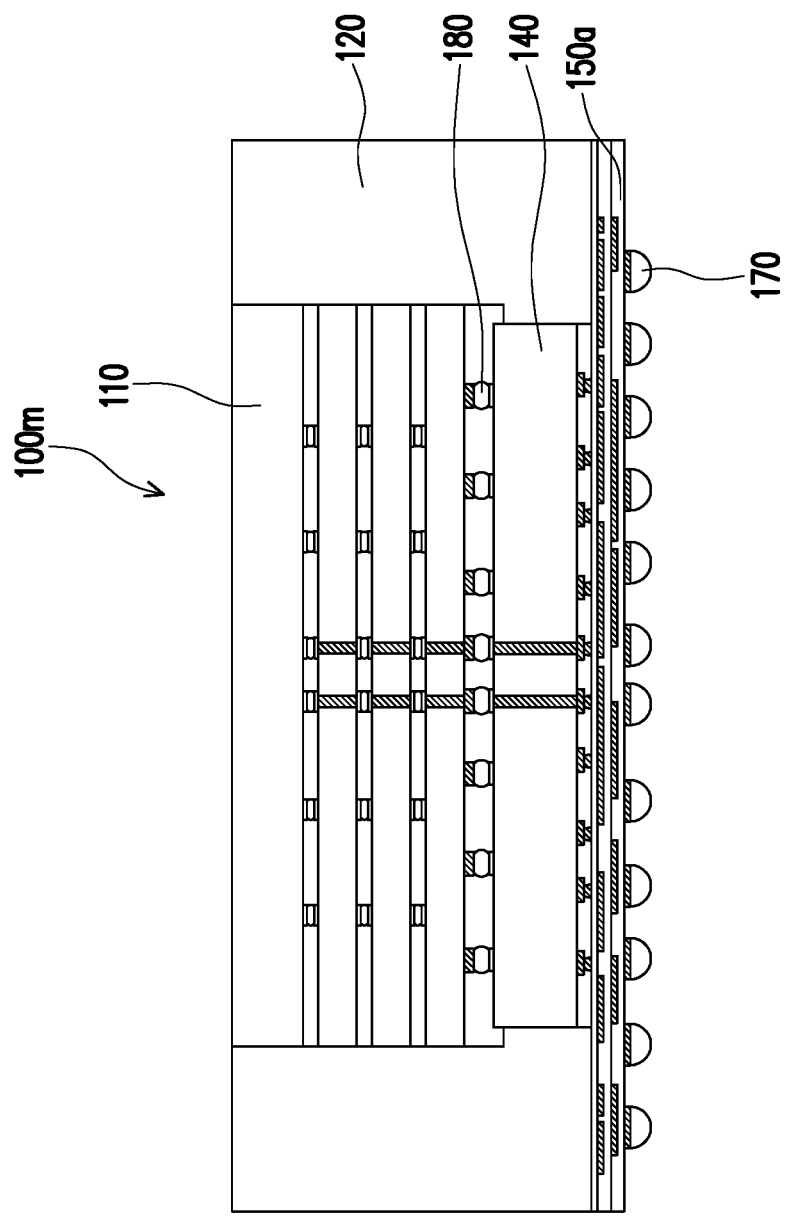
FIG. 21 illustrates a cross sectional view of a semiconductor package according to some exemplary embodiments of the present disclosure.

FIG. 21 illustrates a cross sectional view of a semiconductor package according to some exemplary embodiments of the present disclosure. It is noted that the semiconductor package 100*m* shown in FIG. 21 contain many features same as or similar to the semiconductor package 100*i* disclosed earlier with FIG. 17. For purpose of clarity and simplicity, detail description of same or similar features may be omitted, and the same or similar reference numbers denote the same or like components. The main differences between the semiconductor package 100*m* shown in FIG. 21 and the semiconductor package 100*i* shown in FIG. 17 are described as follows.

With reference to FIG. 21, in accordance with some embodiments of the disclosure, the encapsulating material 120*a* and the encapsulating material 120*b* shown in FIG. 17H for encapsulating the integrated circuit set 110 and the integrated circuit 140 respectively may be omitted herein. In some embodiments, after the integrated circuit set 110 is mounted on the integrated circuit 140 through the conductive bumps 180, the encapsulating material 120 is provided to encapsulate both the integrated circuit set 110 and the integrated circuit 140. Accordingly, the (first) singulation process for cutting through the encapsulating material 120*a* and the encapsulating material 120*b* may also be omitted.

Then, same or similar processes illustrated and described with regard to FIG. 17E to FIG. 17H may be sequentially applied to the encapsulated device to obtain the semiconductor package 100*m* illustrated in FIG. 21. Accordingly, when it comes to the structure of the semiconductor package 100*m*, the encapsulating material 120 encapsulates both the integrated circuit set 110 and the integrated circuit 140, and the redistribution structure 150*a* is extended over the integrated circuit 140 and the encapsulating material 120.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a first integrated circuit structure, a second integrated circuit structure, a plurality of conductive bumps, an encapsulating material, and a first redistribution structure. The first integrated circuit structure includes an active surface having a plurality of contact pads, a back surface opposite to the active surface, and a plurality of through vias extending through the first integrated circuit structure and connecting the active surface and the back surface. The second integrated circuit structure is disposed on the back surface of the first integrated circuit structure. The conductive bumps are disposed between the first integrated circuit structure and the second integrated circuit structure and electrically connecting the plurality of through vias and the second integrated circuit structure. The encapsulating material at least encapsulates the second integrated circuit structure. The first redistribution structure is disposed over and electrically connected to the active surface of the first integrated circuit structure.

In accordance with some embodiments of the disclosure, a manufacturing method of a semiconductor package includes the following steps. An integrated circuit set is provided on a carrier, wherein the integrated circuit set includes a plurality of integrated circuits stacked on top of one another and a plurality of I/O ports facing away from the carrier. An encapsulating material is provided on the carrier to encapsulate the integrated circuit set. An integrated circuit is mounted on the integrated circuit set through a plurality of conductive bumps, wherein the integrated circuit includes an active surface, a back surface opposite to the active surface and facing the integrated circuit set, and a plurality of through vias extending through the integrated circuit. A first redistribution structure is provided on the active surface of the first integrated circuit structure. The carrier is removed. A singulation process is performed on the encapsulating material to form a plurality of semiconductor packages.

In accordance with some embodiments of the disclosure, a manufacturing method of a semiconductor package includes the following steps. An integrated circuit is provided on a carrier, wherein the integrated circuit includes an active surface facing the carrier, a back surface opposite to the active surface, and a plurality of through vias extending through the integrated circuit. An integrated circuit set is mounted on the integrated circuit, wherein the integrated circuit set includes a plurality of integrated circuits stacked on top of one another and a plurality of I/O ports facing the back surface of the integrated circuit. The carrier is removed. An encapsulating material is provided to encapsulate the integrated circuit and the integrated circuit set. A first redistribution structure is provided over the active surface of the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a first integrated circuit structure comprising an active surface having a plurality of contact pads, a back surface opposite to the active surface, and a plurality of through vias extending through the first integrated circuit structure and connecting the active surface and the back surface;
    a second integrated circuit structure disposed on the back surface of the first integrated circuit structure, the second integrated circuit structure comprising a plurality of integrated circuits stacked on top of one another;
    a plurality of conductive bumps disposed between the first integrated circuit structure and the second integrated circuit structure and electrically connecting the plurality of through vias and the second integrated circuit structure;
    an encapsulating material at least encapsulating the second integrated circuit structure and the plurality of conductive bumps;
    a first redistribution structure disposed over and electrically connected to the active surface of the first integrated circuit structure; and
    an outer encapsulating material at least laterally encapsulating the encapsulating material and covering a part of an upper surface of the first redistribution structure.

2. The semiconductor package as claimed in claim 1, wherein the plurality of conductive bumps are a plurality of micro bumps.

3. The semiconductor package as claimed in claim 1, wherein the first integrated circuit structure comprises a logic die, and the plurality of integrated circuits of the second integrated circuit structure comprises a plurality of memory dies.

4. The semiconductor package as claimed in claim 3, wherein at least one of the plurality of integrated circuits comprises a plurality of sub through vias extending through the at least one of the plurality of integrated circuits for electrically connected to adjacent one of the plurality of integrated circuits.

5. The semiconductor package as claimed in claim 1, further comprising a second redistribution structure disposed between the second integrated circuit structure and the first integrated circuit structure and extended over an active surface of the second integrated circuit structure and the encapsulating material.

6. The semiconductor package as claimed in claim 5, wherein the outer encapsulating material encapsulates a side surface of the second redistribution structure.

7. The semiconductor package as claimed in claim 1, wherein the encapsulating material encapsulates the first integrated circuit structure and the second integrated circuit structure.

8. The semiconductor package as claimed in claim 1, wherein the encapsulating material comprises a first encapsulating material encapsulating the first integrated circuit structure and a second encapsulating material encapsulating the second integrated circuit structure.

9. The semiconductor package as claimed in claim 8, wherein the first redistribution structure is disposed over the active surface of the first integrated circuit structure and the first encapsulating material.

10. The semiconductor package as claimed in claim 1, wherein the plurality of conductive bumps and the first redistribution structure are disposed on two opposite sides of the first integrated circuit structure respectively.

11. The semiconductor package as claimed in claim 8, wherein the second encapsulating material separated from the first encapsulating material and integrally encapsulating the plurality of integrated circuits and the plurality of conductive bumps.

12. The semiconductor package as claimed in claim 11, wherein the outer encapsulating material at least encapsulates a side surface of the first encapsulating material and a side surface of the second encapsulating material.

13. A manufacturing method of a semiconductor package, comprising:
 providing an integrated circuit on a carrier, wherein the integrated circuit comprises an active surface facing the carrier, a back surface opposite to the active surface, and a plurality of through vias extending through the integrated circuit;
 mounting an integrated circuit set on the back surface of the integrated circuit through a plurality of conductive bumps, wherein the integrated circuit set comprises a plurality of integrated circuits stacked on top of one another and a plurality of I/O ports facing the back surface of the integrated circuit, the plurality of conductive bumps electrically connect the plurality of through vias and the integrated circuit set;
 providing an inner encapsulating material to encapsulate the integrated circuit and the integrated circuit set and the plurality of conductive bumps;
 providing a first redistribution structure over the active surface of the integrated circuit, wherein the first redistribution is electrically connected to the active surface of the first integrated circuit structure; and
 providing an outer encapsulating material to at least laterally encapsulate the encapsulating material and cover a part of an upper surface of the first redistribution structure extended beyond the encapsulating material.

14. The manufacturing method of the semiconductor package as claimed in claim 13, further comprising:
 providing the inner encapsulating material to encapsulate the integrated circuit and/or the integrated circuit set before the carrier is removed;
 performing a first singulation process on the inner encapsulating material to form a plurality of encapsulated device;
 placing one of the plurality of encapsulated device on a substrate carrier, wherein the encapsulating material is provided on the substrate carrier to encapsulate the inner encapsulating material, the integrated circuit and the integrated circuit set.

15. The manufacturing method of the semiconductor package as claimed in claim 14, further comprising:
 performing a second singulation process on the encapsulating material and the first redistribution structure to form a plurality of semiconductor packages.

16. The manufacturing method of the semiconductor package as claimed in claim 14, wherein providing the inner encapsulating material further comprising:
 providing a first inner encapsulating material to encapsulate the integrated circuit; and
 providing a second inner encapsulating material to encapsulate the integrated circuit set.

17. The manufacturing method of the semiconductor package as claimed in claim 16, further comprising:
 providing a second redistribution structure over the integrated circuit and the first inner encapsulating material before the integrated circuit set is mounted on the integrated circuit.

18. A semiconductor package, comprising:
 an integrated circuit comprising an active surface, a back surface opposite to the active surface, and a plurality of through vias extending through the integrated circuit and connecting the active surface and the back surface;
 an integrated circuit set disposed over the first integrated circuit structure, the integrated circuit set comprising a plurality of integrated circuits stacked on top of one another;
 a plurality of conductive bumps disposed between the integrated circuit and the integrated circuit set;
 an encapsulating material at least laterally encapsulating the integrated circuit set and the plurality of conductive bumps;
 a first redistribution structure disposed over the active surface of the first integrated circuit structure;
 a second redistribution structure disposed between the integrated circuit and the plurality of conductive bumps, wherein the encapsulating material encapsulating an upper surface of the second redistribution structure facing the integrated circuit set; and
 an outer encapsulating material at least laterally encapsulating the encapsulating material and covering a side surface of the second redistribution structure.

19. The semiconductor package as claimed in claim 18, wherein the second redistribution structure is extended over the back surface of the integrated circuit.

20. The semiconductor package as claimed in claim 18, wherein the encapsulating material comprises a first encapsulating material encapsulating the integrated circuit and a second encapsulating material encapsulating the integrated circuit set, the plurality of conductive bumps, and the upper surface of the second redistribution structure.

* * * * *